United States Patent
Seo et al.

(10) Patent No.: US 8,698,317 B2
(45) Date of Patent: Apr. 15, 2014

(54) METHODS OF FABRICATING PACKAGE STACK STRUCTURE AND METHOD OF MOUNTING PACKAGE STACK STRUCTURE ON SYSTEM BOARD

(75) Inventors: Sun-Kyoung Seo, Suwon-si (KR); Eun-Jin Choi, Suwon-si (KR)

(73) Assignee: Samsung Electronics Co., Ltd, Suwon-si (KR)

( * ) Notice: Subject to any disclaimer, the term of this patent is extended or adjusted under 35 U.S.C. 154(b) by 78 days.

(21) Appl. No.: 13/213,366

(22) Filed: Aug. 19, 2011

(65) Prior Publication Data

US 2012/0074586 A1 Mar. 29, 2012

(30) Foreign Application Priority Data

Sep. 27, 2010 (KR) .................. 10-2010-0093237

(51) Int. Cl.
*H01L 23/498* (2006.01)

(52) U.S. Cl.
USPC .................. 257/774; 257/E21.067; 438/441

(58) Field of Classification Search
USPC ........................................ 257/744
See application file for complete search history.

(56) References Cited

U.S. PATENT DOCUMENTS

| | | | | |
|---|---|---|---|---|
| 7,358,603 B2* | 4/2008 | Li et al. | ............ | 257/698 |
| 8,026,587 B1* | 9/2011 | Hiner et al. | ............ | 257/687 |
| 8,080,445 B1* | 12/2011 | Pagaila | ............ | 438/106 |
| 8,110,910 B2* | 2/2012 | Kim | ............ | 257/686 |
| 8,143,095 B2* | 3/2012 | Honer | ............ | 438/106 |
| 8,304,880 B2* | 11/2012 | Chow et al. | ............ | 257/686 |
| 2009/0127688 A1* | 5/2009 | Lee et al. | ............ | 257/686 |
| 2009/0146315 A1* | 6/2009 | Shim et al. | ............ | 257/777 |
| 2009/0212409 A1* | 8/2009 | Kang | ............ | 257/686 |
| 2010/0013073 A1* | 1/2010 | Andry et al. | ............ | 257/686 |
| 2010/0213592 A1* | 8/2010 | Ishii et al. | ............ | 257/686 |
| 2010/0232744 A1* | 9/2010 | Asai et al. | ............ | 385/14 |
| 2010/0327439 A1* | 12/2010 | Hwang et al. | ............ | 257/737 |
| 2011/0147933 A1* | 6/2011 | Wu et al. | ............ | 257/741 |
| 2012/0126400 A1* | 5/2012 | Lee | ............ | 257/737 |
| 2012/0126419 A1* | 5/2012 | Kripesh et al. | ............ | 257/774 |
| 2012/0223429 A1* | 9/2012 | Khan et al. | ............ | 257/738 |
| 2012/0225522 A1* | 9/2012 | Zhao et al. | ............ | 438/107 |

FOREIGN PATENT DOCUMENTS

| | | |
|---|---|---|
| JP | 2007-281129 | 10/2007 |
| JP | 2009-124151 | 6/2009 |
| KR | 10-0839075 | 6/2008 |
| KR | 10-2009-0050810 | 5/2009 |

* cited by examiner

*Primary Examiner* — Stephen W Smoot
*Assistant Examiner* — Edward Chin
(74) *Attorney, Agent, or Firm* — Stanzione & Kim, LLP

(57) ABSTRACT

A package stack structure includes a lower semiconductor chip on a lower package substrate having a plurality of lower via plug lands, a lower package having a lower molding compound surrounding a portion of a top surface of the lower package substrate and side surfaces of the lower semiconductor chip, an upper semiconductor chip on an upper package substrate having a plurality of upper via plug lands, an upper package having an upper molding compound covering the upper semiconductor chip, via plugs vertically penetrating the lower molding compound, the via plugs connecting the lower and upper via plug lands, respectively, and a fastening element and an air space between a top surface of the lower molding compound and a bottom surface of the upper package substrate.

20 Claims, 46 Drawing Sheets

METHODS OF FABRICATING PACKAGE STACK STRUCTURE AND METHOD OF MOUNTING PACKAGE STACK STRUCTURE ON SYSTEM BOARD

CROSS-REFERENCE TO RELATED APPLICATIONS

This application claims the benefit of priority under 35 U.S.C. §119 from Korean Patent Application No. 10-2010-0093237 filed on Sep. 27, 2010, the contents of which are hereby incorporated herein by reference in its entirety.

BACKGROUND OF THE INVENTION

1. Field of the Invention

Exemplary embodiments of the inventive concepts relate to a package stack structure, a system board, a semiconductor module, an electronic circuit board, and an electronic system having the package stack structure, and methods of fabricating the package stack structure and mounting the package stack structure on the system board.

2. Description of the Related Art

Package stack structures have been suggested so as to improve the integration density of semiconductor devices or minimize an electronic system.

SUMMARY OF THE INVENTION

Exemplary embodiments of the inventive concept provide various package stack structures.

Exemplary embodiments of the inventive concept also provide a system board, a semiconductor module, an electronic circuit board, and an electronic system each having a package stack structure.

Exemplary embodiments of the inventive concept also provide methods of fabricating a package stack structure.

Exemplary embodiments of the inventive concept also provide a method of mounting a package stack structure on a system board.

Additional aspects and/or advantages of the inventive concept will be set forth in part in the following detailed description and, in part, will be obvious from the description, or may be learned by practice of the inventive concept.

A package stack structure according to an exemplary embodiment of the inventive concept includes a lower package, an upper package, via plugs, and a fastening element. The lower package includes a lower package substrate having a plurality of lower via plug lands, a lower semiconductor chip mounted on the lower package substrate, and a lower molding compound. The lower molding compound covers a portion of a top surface of the lower package substrate and surrounds side surfaces of the lower semiconductor chip. The upper package includes an upper package substrate having a plurality of upper via plug lands, an upper semiconductor chip mounted on the upper package substrate, and an upper molding compound. The upper molding compound covers the upper semiconductor chip. The via plugs vertically penetrate the lower molding compound to electrically connect the lower and upper via plug lands, respectively. The fastening element includes an air space between a top surface of the lower molding compound and a bottom surface of the upper package substrate.

A package stack structure according to an exemplary embodiment of the inventive concept includes a lower package, an upper package, via plugs, and a fastening element. The lower package includes a lower package substrate having a plurality of lower via plug lands, a lower semiconductor chip mounted on the lower package substrate, and a lower under-fill material between a portion of a top surface of the lower package substrate and a bottom surface of the lower semiconductor chip. The upper package includes an upper package substrate having a plurality of upper via plug lands, an upper semiconductor chip mounted on the upper package substrate, and an upper molding compound. The upper molding compound covers the upper semiconductor chip. The via plugs electrically connect the lower and upper via plug lands, respectively. The fastening element includes an air space between a top surface of the lower molding compound and a bottom surface of the upper package substrate.

A method of fabricating a package stack structure according to an exemplary embodiment of the inventive concept includes: mounting a lower semiconductor chip on a lower package substrate having a plurality of lower via plug lands; forming a lower package by forming a lower molding compound surrounding a portion of a top surface of the lower package substrate and side surfaces of the lower semiconductor chip; mounting an upper semiconductor chip on an upper package substrate having a plurality of upper via plug lands; forming an upper package by forming an upper molding compound covering the upper semiconductor chip; forming via plugs vertically penetrating the lower molding compound, the via plugs connecting the lower and upper via plug lands, respectively; and forming a fastening element between a top surface of the lower molding compound and a bottom surface of the upper package substrate, the fastening element including an air space.

A method of fabricating a package stack structure according to an exemplary embodiment of the inventive concept includes: mounting a lower semiconductor chip on a lower package substrate having a plurality lower via plug lands; forming a lower package by filling an under-fill material between a portion of a surface of the lower package substrate and a bottom surface of the lower semiconductor chip; mounting an upper semiconductor chip on an upper semiconductor substrate having a plurality of upper via plug lands; forming an upper package by forming an upper molding compound covering the upper semiconductor chip; forming via plugs electrically connecting the lower and upper via plug lands, respectively; and forming a fastening element between the a top surface of the lower package substrate and a bottom surface of the upper package substrate, the fastening element including an air space.

An electronic system according to an exemplary embodiment of the inventive concept includes a package stack structure mounted on a system board. The package stack structure includes a lower package, an upper package, via plugs, and a fastening element. The lower package includes a lower package substrate having a plurality of lower via plug lands, a lower semiconductor chip mounted on the lower package substrate, and a lower molding compound. The lower molding compound covers a portion of a top surface of the lower package substrate and surrounds side surfaces of the lower semiconductor chip. The upper package includes an upper package substrate having a plurality of upper via plug lands, an upper semiconductor chip mounted on the upper package substrate, and an upper molding compound. The upper molding compound covers the upper semiconductor chip. The via plugs vertically penetrate the lower molding compound to electrically connect the lower and upper via plug lands, respectively. The fastening element includes an air space between a top surface of the lower molding compound and a bottom surface of the upper package substrate.

A method of fabricating an electronic system according to an exemplary embodiment of the inventive concept includes: mounting a lower semiconductor chip on a lower package substrate having a plurality of lower via plug lands thereon; forming a lower molding compound covering surfaces of the lower via plug lands and surrounding side surfaces of the lower semiconductor chip; forming via holes vertically penetrating the lower molding compound to expose the lower via plug lands; forming an upper semiconductor chip on an upper package substrate having a plurality of upper via plug lands therebeneath; forming an upper molding compound covering the upper semiconductor chip; forming via plugs in the via holes, the via plugs electrically connecting the lower and upper via plug lands; forming a package stack structure by forming a fastening element between the lower molding compound and the upper package substrate, the fastening element including an air space; and mounting the package stack structure on a system board.

A semiconductor module and an electronic circuit board according to exemplary embodiments of the inventive concept include the package stack structure.

The foregoing and other aspects and utilities of the present general inventive concept may also be achieved by providing a package stack structure, including a lower package having a lower package substrate, a lower semiconductor chip disposed on the lower package substrate and electrically connected to the lower package substrate, and a lower molding compound to surround the lower package substrate and at least a portion of the lower semiconductor chip; an upper package having an upper package substrate, an upper semiconductor chip disposed on the upper package substrate and electrically connected to the lower package substrate, and an upper molding compound to surround the upper package substrate and at least a portion of the upper semiconductor chip, the upper package being disposed over the lower package and spaced apart from the lower package by a distance; one or more conductive materials disposed in a first portion between the lower package and the upper package; a fastening element disposed in a second portion between the lower package and the upper package and formed with a material different from the conductive materials to fasten the lower package and the upper package; and an air space disposed in a third portion between the lower package and the upper package and formed as an air path.

The third portion may be formed between the upper package substrate of the upper package and at least one of the lower package substrate and the lower molding compound of the lower package.

The first portion may be disposed between the second portion and the third portion.

The lower package may further include an under-fill material between a portion of a surface of the lower package substrate and a bottom surface of the lower semiconductor chip.

The fastening element may be formed with a material different from the conductive materials to fasten the lower package and the upper package.

The fastening element may include a plurality of sub-fastening elements spaced-apart from each other and disposed along an edge portion of the lower package and the upper package.

The adjacent sub-fastening elements may be arranged to provide an air flow path to communicate with the air space and an outer portion of the lower package and the upper package.

The fastening element may include a central fastening element disposed in a fourth portion between the lower package and the upper package, and the central fastening element may be formed with a material different from the conductive materials to fasten the lower package and the upper package.

The lower package may further include one or more via-plugs formed through the lower semiconductor to be electrically connected to the lower package substrate, and the one or more conductive materials may have a second conductive material disposed in the third portion between lower package and the upper package to electrically connect the via-plugs of the lower package and the upper package substrate of the upper package.

The upper semiconductor chip may include a plurality of sub-upper semiconductor chips disposed in the upper molding compound and electrically connected to the upper package substrate.

The foregoing and other aspects and utilities of the present general inventive concept may also be achieved by providing a method of forming a package stack structure, the method including forming a lower package having a lower package substrate, a lower semiconductor chip disposed on the lower package substrate and electrically connected to the lower package substrate, and a lower molding compound to surround the lower package substrate and at least a portion of the lower semiconductor chip; forming an upper package having an upper package substrate, an upper semiconductor chip disposed on the upper package substrate and electrically connected to the lower package substrate, and an upper molding compound to surround the upper package substrate and at least a portion of the upper semiconductor chip, the upper package being disposed over the lower package and spaced apart from the lower package by a distance; forming one or more conductive materials in a first portion between the lower package and the upper package; forming a fastening element in a second portion between the lower package and the upper package and formed with a material different from the conductive materials to fasten the lower package and the upper package; and forming an air space in a third portion between the lower package and the upper package and formed as an air path.

The foregoing and other aspects and utilities of the present general inventive concept may also be achieved by providing an electronic system including a package stack structure having a lower package having a lower package substrate, a lower semiconductor chip disposed on the lower package substrate and electrically connected to the lower package substrate, and a lower molding compound to surround the lower package substrate and at least a portion of the lower semiconductor chip; an upper package having an upper package substrate, an upper semiconductor chip disposed on the upper package substrate and electrically connected to the lower package substrate, and an upper molding compound to surround the upper package substrate and at least a portion of the upper semiconductor chip, the upper package being disposed over the lower package and spaced apart from the lower package by a distance; one or more conductive materials disposed in a first portion between the lower package and the upper package; a fastening element disposed in a second portion between the lower package and the upper package and formed with a material different from the conductive materials to fasten the lower package and the upper package; and an air space disposed in a third portion between the lower package and the upper package and formed as an air path; and a processor to control the package stack structure to process data of one of the lower package semiconductor and the upper package semiconductor.

The package structure may be formed as a module to be connected to the processor.

The electronic apparatus may further include a semiconductor module formed with a module band, the package stack structure formed in the module band, and module terminals formed on the module band to be electrically connected to the package stack structure, the semiconductor module formed as a single monolithic body, wherein the module terminals of the semiconductor module are connected to the processor when the semiconductor module is installed in the electronic apparatus.

The semiconductor module may be formed as a single monolithic body, and the single monolithic body of the semiconductor module is detachably attached to the processor through the module terminals and corresponding terminals of the processor.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which

DETAILED DESCRIPTION OF THE PREFERRED EMBODIMENTS

Figure 1A:
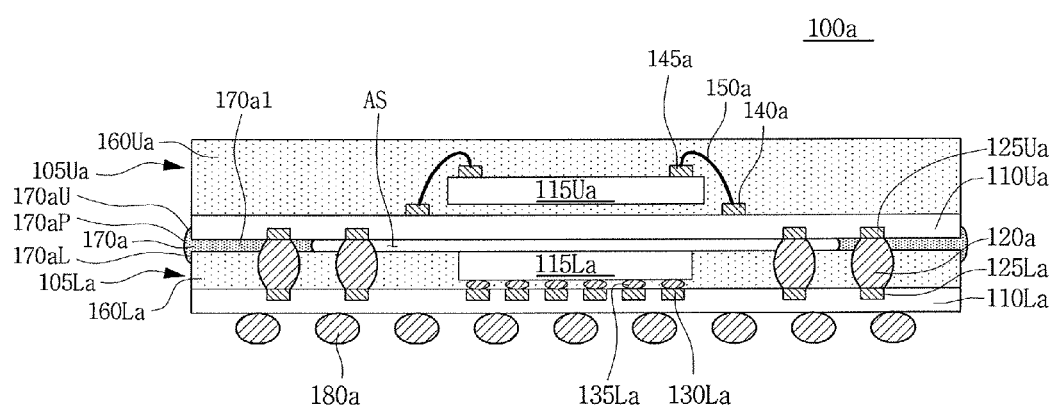
FIGS. 1A to 16B are longitudinal cross-sectional views or side views schematically illustrating package stack structures according to exemplary embodiments of the inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures In the drawings, the thicknesses of layers and regions may be exaggerated for clarity.

Detailed illustrative embodiments are disclosed herein. However, specific structural and functional details disclosed herein are merely representative for purposes of describing example embodiments. This inventive concept, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the inventive concept. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" with another element, it can be directly connected or coupled to the other element or intervening elements may be present. In contrast, when an element is referred to as being "directly connected" or "directly coupled" with another element, there are no intervening elements present. Other words used to describe the relationship between elements should be interpreted in a like fashion, e.g., "between" versus "directly between," "adjacent" versus "directly adjacent," etc.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof. Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to schematic cross-sectional illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe example embodiments, various aspects will be described in detail with reference to the attached drawings. However, the inventive concept is not limited to example embodiments described.

Referring to FIG. 1A, a package stack structure 100a according to an exemplary embodiment of the inventive concept may include a lower package 105La, an upper package 105Ua, via plugs 120a, and a fastening element 170a.

The lower package 105La may include a lower package substrate 110La and a lower semiconductor chip 115La formed on the lower package substrate 110La. The upper package 105Ua may include an upper package substrate 110Ua and an upper semiconductor chip 115Ua formed on the upper package substrate 110Ua.

Each of the lower and upper package substrates 110La and 110Ua may be a PCB (printed circuit board) and may include at least one insulating material such as ceramic, glass, plastic or other insulating materials, and a conductive material, such as a metal interconnection, a metal pillar or other conductive materials, to electrically connect the lower and upper package substrates 110La and 110Ua and the lower and upper semiconductor chips 115La and 115Ua so that the lower and upper package substrates 110La and 110Ua and/or the lower and upper semiconductor chips 115La and 115Ua can be connected to each other and/or an external element or device.

The lower package substrate 110La and the upper semiconductor chip 115Ua may be connected to each other using a flip chip bonding method. The lower semiconductor chip 110La may include a logic semiconductor device.

The upper package substrate 110Ua and the upper semiconductor chip 115Ua may be connected to each other using a wire bonding method. The upper semiconductor chip 115Ua may include a memory semiconductor device.

The logic semiconductor device may store data in the memory semiconductor device, process the data read from memory semiconductor device, and then store the processed data in the memory semiconductor device or transmit the processed data to an external element or device. The logic semiconductor device may receive data from an external element or device, process the received data, and then store the processed data in the memory semiconductor device.

Lower via plug lands 125La and lower bonder lands 130La may be formed on a top surface of the lower package substrate 110La. The lower via plug lands 125La and the lower bonder lands 130La may be formed in inner areas of the lower package substrate 110La. Surfaces of the lower via plug lands 125La and the lower bonder lands 130La may be partially or entirely exposed. However, it is possible that the lower via plug land 125La and the lower bonder land 130La may protrude from the surface of the lower package substrate 110La for example, a box, hexahedral, pillar, or mesa shape.

The lower via plug lands 125La and the lower bonder lands 130La may include a conductive material such as copper (Cu), nickel (Ni), gold (Au), indium (In), bismuth (Bi), other metals or solder materials including tin (Sn).

The lower semiconductor chip 115La and the lower bonder lands 130La may be connected to each other through lower bonders 135La. The lower bonders 135La may include metal or solder materials. It is assumed that the lower bonders 135La include solder materials in the example embodiment.

Upper via plug lands 125Ua may be formed beneath the upper package substrate 110Ua. Bond fingers 140a may be formed on the upper package substrate 110Ua. The upper via plug lands 125Ua and the upper bond fingers 140a may include a conductive material such as copper (Cu), nickel (Ni), gold (Au), indium (In), bismuth (Bi), other metals or solder material including tin (Sn).

A chip pad 145a may be formed on a top surface of the upper semiconductor chip 115Ua. The chip pad 145a may include a conductive material such as copper (Cu), nickel (Ni), gold (Au), indium (In), bismuth (Bi), other metals or solder material including tin (Sn).

The upper bond fingers 140a and the chip pads 145a may be electrically connected to each other through bonding wires 150a. The bonding wires 150a may include gold (Au) or aluminum (Al).

The lower and upper via plug lands 125La and 125Ua may be electrically connected to each other through the via plugs 120a. The via plugs 120a may include a conductive material such as copper (Cu), nickel (Ni), gold (Au), indium (In), bismuth (Bi), other refractory metals or solder material including tin (Sn).

The lower package 105La may include a lower molding compound 160La formed on the lower package substrate 110La. The lower molding compound 160La may cover side surfaces of the lower semiconductor chip 115La. The lower molding compound 160La may expose a top surface of the lower semiconductor chip 115La. The lower molding compound 160La may surround side surfaces of the via plugs 120a.

The upper package 105Ua may include an upper molding compound 160Ua formed on the upper package substrate 110Ua. The upper molding compound 160Ua may partially or completely cover the upper semiconductor chip 115Ua. The upper molding compound 160Ua may surround the bonding wires 150a.

The lower and upper molding compounds 160La and 160Ua may include a thermosetting resin such as an epoxy. For example, the lower and upper molding compounds 160La and 160Ua may include an EMC (epoxy molding compound).

A lower under-fill material may be formed between the lower package substrate 110La and the lower semiconductor chip 115La. Furthermore, an upper under-fill material may be formed between the upper package substrate 110Ua and the upper semiconductor chip 115Ua. Since a conventional material can be used as the lower and upper under-fill materials, detail descriptions thereof will be omitted. It is possible that the lower and upper under-fill materials may not be formed. Detail descriptions of the lower and upper under-fill materials will be provided later in other drawings.

The fastening element 170a may physically fasten the lower and upper packages 105La and 105Ua together. The fastening element 170a may have a portion 170a1 formed between the lower and upper packages 105La and 105Ua. Specifically, the fastening element 170a may be formed between a top surface of the lower molding compound 160La and a bottom surface of the upper package substrate 110Ua.

The fastening element 170a may not be formed around a central portion of the lower package 105La, but may be formed at outer or edge areas between the lower and upper packages 105La and 105Ua. For example, the fastening element 170a may not be formed on the top surface of the lower semiconductor chip 115La. The fastening element 170a may surround sidewalls of at least one via plug 120a. The fastening element 170a may surround only one side surface of upper portions of the at least one via plug 120a. It is possible that the fastening element 170a may not surround the side surfaces of the via plugs 120a. The foregoing example embodiments will be described in other example embodiments.

The fastening element 170a may have a portion 170aP to extend to outer areas of the lower package 105La and/or the upper package 105Ua. For example, the fastening element 170a may have portions 170aL and 170aU to extend to be formed on side surfaces of the lower molding compound 160La and/or the upper package substrate 110Ua. That is, the fastening element 170a may cover or surround edges of the lower molding compound 160La, the upper package substrate 110Ua, and/or the lower package substrate 110Ua. On the other hand, the fastening element 170a may not be formed on side surfaces of the lower or upper package 105La or 105Ua. Further, the fastening element 170a may be formed at the same level as the side surfaces of the lower package 105La and/or upper package 105Ua. The example embodiments will be described later.

The fastening element 170a may be formed to have an air space AS between the lower and upper packages 105La and 105Ua. The air space AS may communicate with outer areas of the package stack structure 100a. That is, an air path may be formed to provide communication (or passage) between the air space AS and outer areas of the package stack structure 100a. One or more air paths may be formed between the lower package 105La and the upper package 105U to pass though the fastening element 170a. When the fastening element 170a includes a plurality of fastening elements, one or more paths can be formed between plural fastening elements 170a. Various effects and example embodiments of the air space AS and the air path will be described later.

The fastening element 170a may include a thermosetting material having an adhesive characteristic, such as an epoxy resin. Further, the fastening element 170a may include solid particles to improve thermal conductivity or elasticity. For example, the fastening element 170a may include inorganic particles such as silica or ceramics, organic polymer particles, and/or metallic particles. In addition, the fastening element 170a may include metal-plated insulating particles and/or insulator-wrapped metallic particles. In other example embodiments, the fastening element 170a may further include various fillers, organic materials, and/or additives to improve viscosity, flowability, depressiveness, adhesion and/or solidity.

Solder balls 180a may be formed below the lower package substrate 110La. The solder balls 180a may include a solder material such as tin (Sn). The solder balls 180a may electrically connect the package stack structure 100a to a semiconductor module board or a system board. The solder balls 180a may be formed of a metal in the spherical, mesa, or pin shape. The metal may include copper (Cu), nickel (Ni), gold (Au), indium (In), bismuth (Bi), or other metals. The solder balls 180a may be electrically connected to the lower and upper semiconductor chips 115La and/or 115Ua through conductive materials (lines) formed on or in the lower and upper package substrates 110La and 110Ua.

The package stack structure 100a may include the lower and upper semiconductor chips 115La and 115Ua having different functions from each other. For example, the package stack structure 100a may be a system, for example, an SOC (system on a chip).

The height or thickness of the lower molding compound 160La may be decreased because the top surface of the lower semiconductor chip 115La may be exposed to the upper package substrate 110Ua. That is, the lower molding compound 160La is formed to not cover the top surface of the lower semiconductor chip 115La. Accordingly, the total height or thickness of the package stack structure 100a may be decreased. When the total height or thickness is decreased, height of the via plugs 120a may be lowered. When the height of the via plugs 120a is lowered, volume of the via plugs 120a may be reduced. When the volume of the via plugs 120a is reduced, intervals between the via plugs 120a may decrease. That is, pitches of the via plugs 120a or the via plug lands 125La may become narrow. In conclusion, an electronic system having the package stack structure 100a may be minimized and/or lighter. For example, a mobile phone including the package stack structure 100a may be easily and advantageously fabricated.

When the package stack structure 100a includes the fastening element 170a, thermal or physical bending of the lower package substrate 110La and the upper package substrate 110Ua by thermal expansion may be prevented and/or relieved. By preventing or relieving the bending, electrical and/or physical stresses influencing the connecting elements included in the package stack structure 100a may be reduced. Further, the fastening element 170a can prevent and/or relieve electrical and/or physical deterioration of the package stack structure 100a. Accordingly, electrical and/or physical connections and/or contacts of elements of the lower and upper package substrates 110La and 110Ua, for example, the via plugs 120a, the lower and upper via plug lands 125La and 125Ua, the lower bonder lands 130La, the lower bonders 135La, the bond fingers 140a, the bonding wires 150a, and/or the solder balls 180a, may be stably maintained.

In addition, the lower and upper package substrates 110La and 110Ua may be thinner than conventional package substrates because thermal and/or physical endurance of the lower and upper package substrates 110La and 110Ua increases due to the fastening element 170a. When the lower and upper package substrates 110La and 110Ua are thinner, the package stack structure 100a can be smaller and lighter. That is, the manufacturing cost of the package stack structures will decrease. Further, heat radiation performance of the package stack structure 100a and/or an electronic system having the package stack structure 100a may be improved and designs and/of performance of mobile communication systems and mini electronic systems may also be improved.

In the example embodiment, the fastening element 170a may be formed at outer areas between the lower and upper packages 105La and 105Ua to include the air space AS. Thus, processes of fabricating the fastening element 170a may be simplified and physical support and endurance may be improved compared to when completely filling the fastening element 170a between the lower and upper packages 105La and 105Ua without the air space AS. Cooling efficiency of the package stack structure 100a may be improved because the air space AS communicates with outer areas. For example, heat generated from the lower semiconductor chip 115La and/or the lower package 110La may be effectively radiated by air flow passing through the air space AS. The air flow passing through the air space AS may be generated by driving fans around the package stack structure 100a.

A thickness of the fastening element 170a may be thinner than a thickness of one of the lower package substrates 110La and the upper package substrates 110Ua or a thickness of the lower and upper semiconductor chips 115La and 115Ua.

Figure 1B:
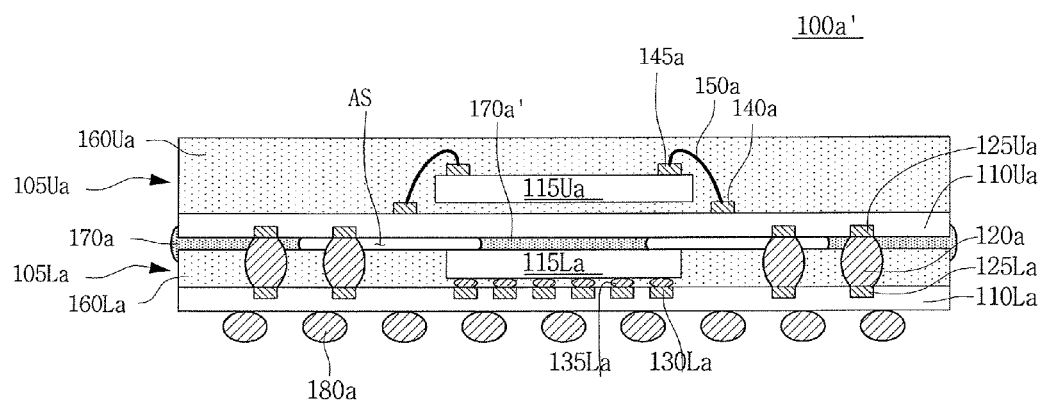

Referring to FIG. 1B, a package stack structure 100a' according to an exemplary embodiment of the inventive concept may be similar to the package stack structure 100a of FIG. 1A, but further include a central fastening element 170a' between the lower semiconductor chip 115La and the upper package substrate 110Ua. The central fastening element 170a' may partially or completely cover a top surface of the lower semiconductor chip 115La. Detailed descriptions of the central fastening element 170a' will be described later.

Figure 2A:
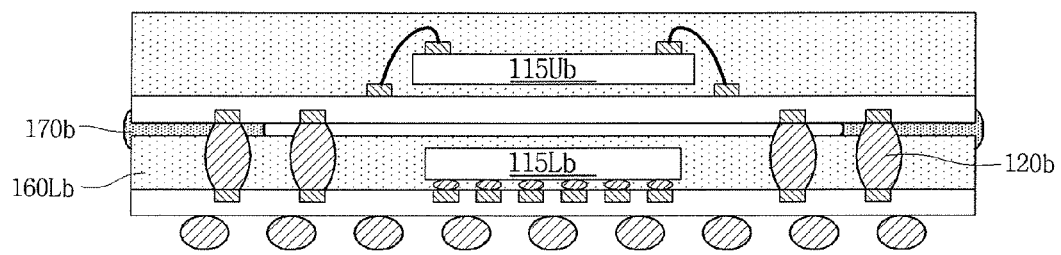

Referring to FIG. 2A, a package stack structure 100b according to an exemplary embodiment of the inventive concept may include a lower molding compound 160Lb covering side surfaces and a top surface of a lower semiconductor chip 115Lb. Accordingly, the top surface of the lower semiconductor chip 115Lb may not be exposed. The package stack structure 100b may not need an additional process for exposing the top surface of the lower semiconductor chip 115Lb. Accordingly, the package stack structure 100b may be fabricated using a process different from a process of the package stack structure 100a of FIG. 1A.

Via plugs 120b of the package stack structure 100b may be formed higher than the via plugs 120a of the package stack structure 100a by a thickness of a lower molding compound 160Lb formed on a top surface of the lower semiconductor chip 115Lb.

A fastening element 170b may not be formed on a portion to correspond to the lower semiconductor chip 115Lb and/or upper semiconductor chip 115Ub. The fastening element 170b may be variously formed by referring to other exemplary embodiments. Further, other elements not disclosed in FIG. 2A may be understood by referring to other example embodiments.

Figure 2B:
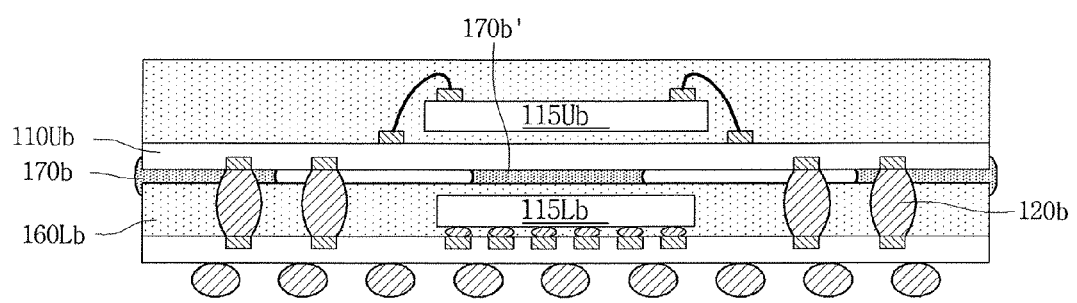

Referring to FIG. 2B, a package stack structure 100b' according to an exemplary embodiment of the inventive concept may be similar to the package stack structure 100b of FIG. 2A, but may further include a central fastening element 170b' formed between the lower molding compound 160Lb and the upper package substrate 110Ub. The central fastening element 170b' may partially or completely cover a top surface of the lower semiconductor chip 115Lb. Detailed descriptions of the central fastening element 170a' will be described later.

Figure 3A:
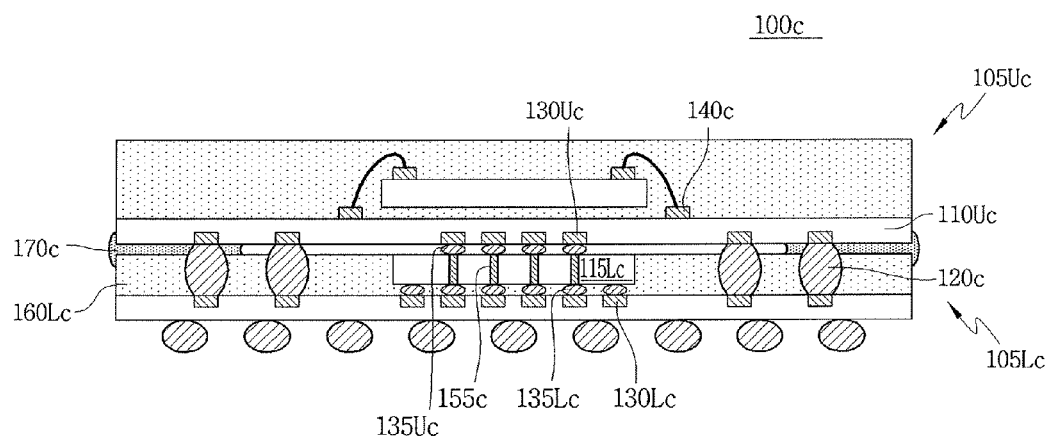

Referring to FIG. 3A, a package stack structure 100c according to an exemplary embodiment of the inventive concept may be similar to the package stack structures of other exemplary embodiments but may include a lower package 105Lc and an upper package 105Uc, via plugs 120c, a fastening element 170c and a chip-package interconnectors 135Uc.

The lower package 105Lc may include a lower semiconductor chip 115Lc having chip via plugs 155c. The chip via plugs 155c may vertically penetrate the lower semiconductor chip 115Lc. Conventional through silicon vias (TSVs) can be used as the chip via plugs 155c. The chip via plugs 155c may include a metal. The chip via plugs 155c may be electrically and/or physically connected to lower bonders 135Lc, respectively.

The upper package substrate 110Uc may include chip-package interconnector lands 130Uc on a bottom surface thereof. The chip-package interconnector lands 130Uc may be referred to as the upper via plug lands described in other exemplary embodiments.

The chip via plugs 155c may be connected to the chip-package interconnector lands 130Uc through chip-package interconnectors 135Uc. The chip-package interconnectors 135Uc may include a metal or solder materials.

As illustrated in the drawing, each of the chip via plugs 155c may not be connected to a corresponding one of the lower bonders 135Lc. For example, one of the chip via plugs 155c may be electrically connected to the plural lower bonder 135Lc. It is possible that the plural chip via plugs 155c may be electrically connected to one of the chip bonders 135Lc. For example, when the chip via plugs 155c and the chip bonders 135Lc transmit the same electric signal like one of a supply voltage or a ground voltage, or electric signals transmitted from one of the chip bonders 135Lc are separated and transmitted to at least two chip via plugs 155c, the at least two chip via plugs 155c may be connected to one of the lower bonders 1351c, or one of the chip via plugs 155c may be connected to the at least two lower bonders 135Lc.

The number of chip via plugs 155c may be different from the number of the lower bonders 135Lc.

The chip-package interconnector lands 130Uc may be electrically connected to the upper bond fingers 140c.

The chip via plugs 155c may transmit a supply voltage or a ground voltage and the via plugs 120c may transmit a command signal or data signals.

The top surface of the lower semiconductor chip 115Lc may not be covered by the lower molding compound 160Lc, but may be exposed. Accordingly, the chip-package interconnectors 135Uc may not be covered by the lower molding compound 160Lc, but may be exposed.

The fastening element 170c may be formed in various ways (methods or processes) similar to other exemplary embodiments. Further, other elements not disclosed in FIG. 3A may be understood by referring to other example embodiments.

Figure 3B:
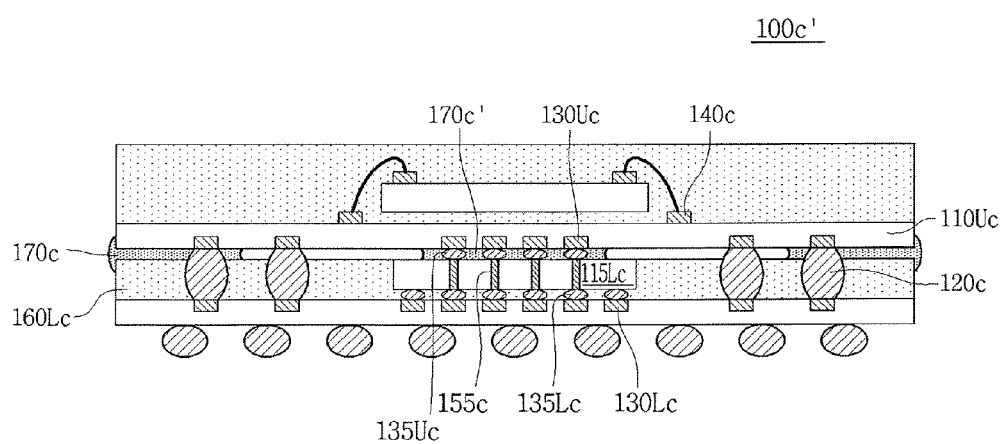

Referring to FIG. 3B, a package stack structure 100c' according to an exemplary embodiment of the inventive concept may be similar to the package stack structure 100c of FIG. 3A, but further include a central fastening element 170c' formed between the lower molding compound 160Lb and the upper package substrate 110Ub. The central fastening element 170c' may partially or completely cover a top surface of the lower semiconductor chip 115Lc. The central fastening element 170c' may cover or surround side surfaces of the chip-package interconnectors 135Uc. Detailed descriptions of the central fastening element 170c' will be described later.

Figure 4A:
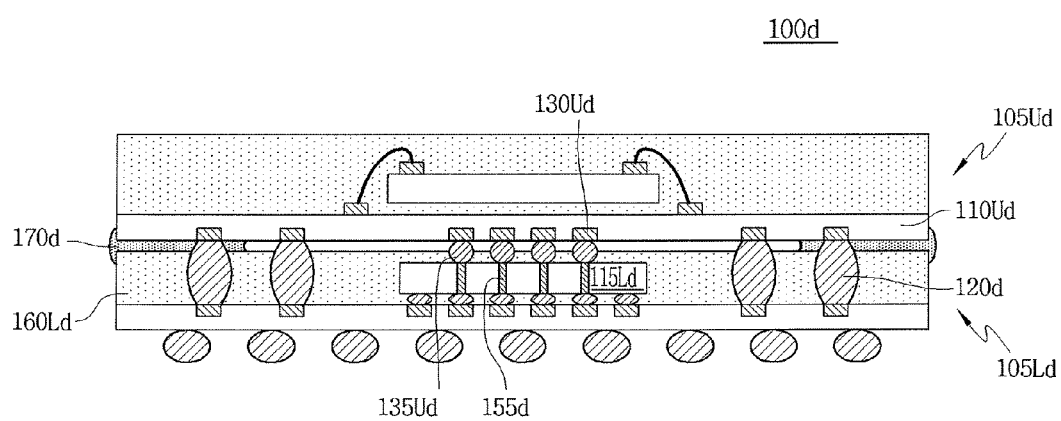

Referring to FIG. 4A, a package stack structure 100d according to an exemplary embodiment of the inventive concept may be similar to the package stack structures of other exemplary embodiments, but include a lower package 105Ld and an upper package 105Ud, via plugs 120d, a fastening element 170d and chip-package interconnectors 135Ud.

The lower package 105Ld may include a lower semiconductor chip 115Ld having chip via plugs 155d. The upper package substrate 110Ud may include chip-package interconnector lands 130Ud formed therebeneath.

A portion of side surfaces of the chip-package interconnectors 135Ud may be covered or surrounded by a lower molding compound 160Ld. That is, it is possible that the top surface of the lower semiconductor chip 115Ld may not be exposed but covered by the lower molding compound 160Ld. It is also possible that a portion of side surfaces of the chip-package interconnector 135Ud may not be covered by the lower molding compound 160Ld, but may be exposed.

In the exemplary embodiment, the chip-package interconnectors 135Ud may have a volume greater than that of the chip-package interconnectors 135Uc of the package stack structure 100c of FIG. 3A. That is because a first distance between a bottom surface of an upper package substrate 100Ud or chip-package interconnector lands 130Ud and a top surface of the lower semiconductor chip 115Ld may be greater than a second distance between the bottom surface of the upper package substrate 110Uc or the chip-package interconnector lands 130Uc and a top surface of the lower semiconductor chip 115Lc of the package stack structure 100c of FIG. 3A.

The fastening element 170d may be variously formed by referring to other exemplary embodiments. Further, other elements not disclosed in the drawing may be understood by referring to other example embodiments.

Figure 4B:
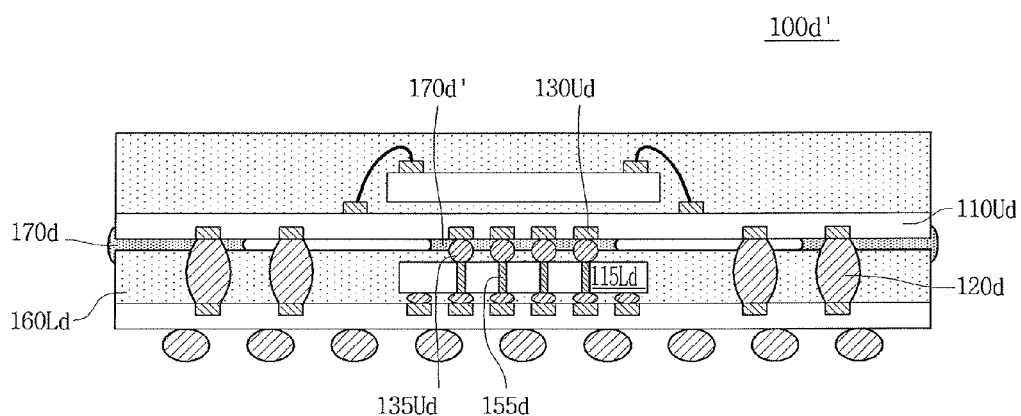

Referring to FIG. 4B, comparing to the package stack structure 100d of FIG. 4A, a package stack structure 100d' according to an exemplary embodiment of the inventive concept may be similar to the package stack structure 100d of FIG. 4A, but further include a central fastening element 170d' formed between the lower molding compound 160Ld and the upper package substrate 110Ub. The central fastening element 170d' may partially or completely overlap a portion to correspond to a top surface of the lower semiconductor chip 115Ld. The central fastening element 170d' may cover or surround side surfaces of the chip-package interconnectors 135Ud. Detailed descriptions of the central fastening element 170d' will be described later.

Figure 5A:
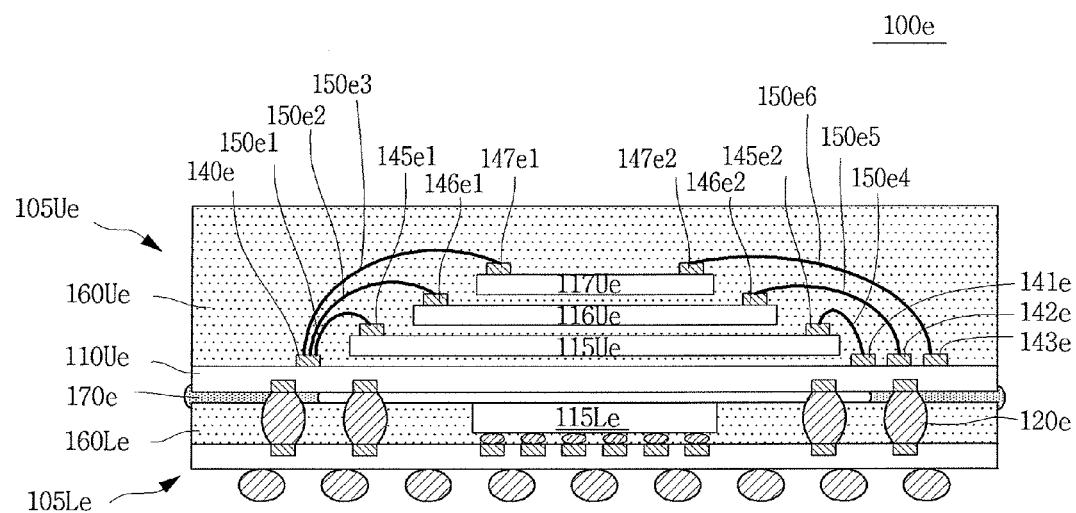

Referring to FIG. 5A, a package stack structure 100e according to an exemplary embodiment of the inventive concept may be similar to the package stack structures in other exemplary embodiments, but include a lower package 105Le and an upper package 105Ue, via plugs 120e and a fastening element 170e.

The lower package 105Le may include a lower semiconductor chip 115Le having an exposed top surface. That is, the top surface of the lower semiconductor chip 115Le may not be covered by a lower molding compound 160Le, but may be exposed.

The upper package 105Ue may include a plurality of upper semiconductor chips 115Ue, 116Ue and 117Ue. Each of the plurality of upper semiconductor chips 115Ue, 116Ue and 117Ue may include a memory chip, respectively. Although only three semiconductor chips are illustrated in FIG. 5A, two or four or more semiconductor chips may be stacked or included in the upper package 105Ue. All of the upper semiconductor chips 115Ue, 116Ue and 117Ue may include the same specification or standardization, or at least one of the upper semiconductor chips 115Ue, 116Ue and 117Ue may include a different specification or standardization. For example, one may include a DRAM chip, another may include a FLASH chip, and the others may include a resistance changeable memory such as RRAM, PRAM, or MRAM, or other memories such as an electro-mechanical memory, SRAM, or a carbon nano tube memory.

An upper package substrate 110Ue may include a plurality of bond fingers 140e, 141e, 142e and 143e, and the plurality of upper semiconductor chips 115Ue, 116Ue and 117Ue may include a plurality of chip pads 145e1, 145e2, 146e1, 146e2, 147e1, and 147e2.

As illustrated in FIG. 5A, one of the bond fingers 140e may be electrically connected to the plurality of chip pads 145e1, 146e1, and 147e1. Also, as illustrated in FIG. 5A, the bond fingers 141e, 142e, and 143e are connected to a corresponding one of the chip pads 145e2, 146e3, and 147e2. Of course, two example embodiments may be applied together.

The bond fingers 140e, 141e, 142e and 143e and the chip pads 145e1, 145e2, 146e1, 146e2, 147e1, and 147e2 may be connected to each other through bonding wires 150e1, 150e2, 150e3, 150e4, 150e5, and 150e6.

The fastening element 170e may be formed using various ways (methods or processes) similar to other exemplary embodiments. Further, other elements not disclosed in the drawing may be understood by referring to other exemplary embodiments.

Figure 5B:
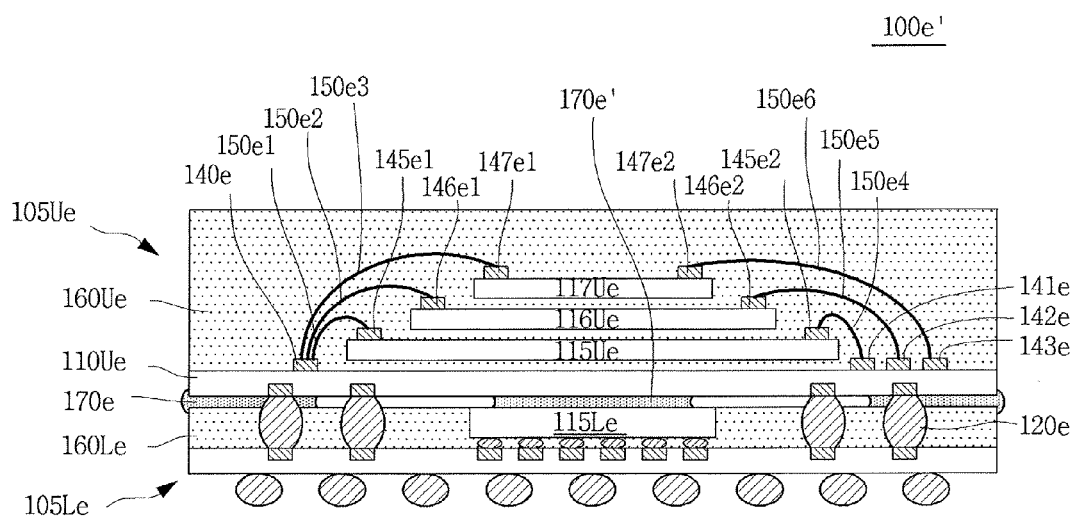

Referring to FIG. 5B, a package stack structure 100e' according to an exemplary embodiment of the inventive concept may be similar to the package stack structure 100e of FIG. 5A, but further include a central fastening element 170e' between the lower semiconductor chip 115Le and the upper package substrate 110Ue. The central fastening element 170e' may partially or completely cover a top surface of the lower semiconductor chip 115Le. Detailed descriptions of the central fastening element 170e' will be described later.

Figure 6A:
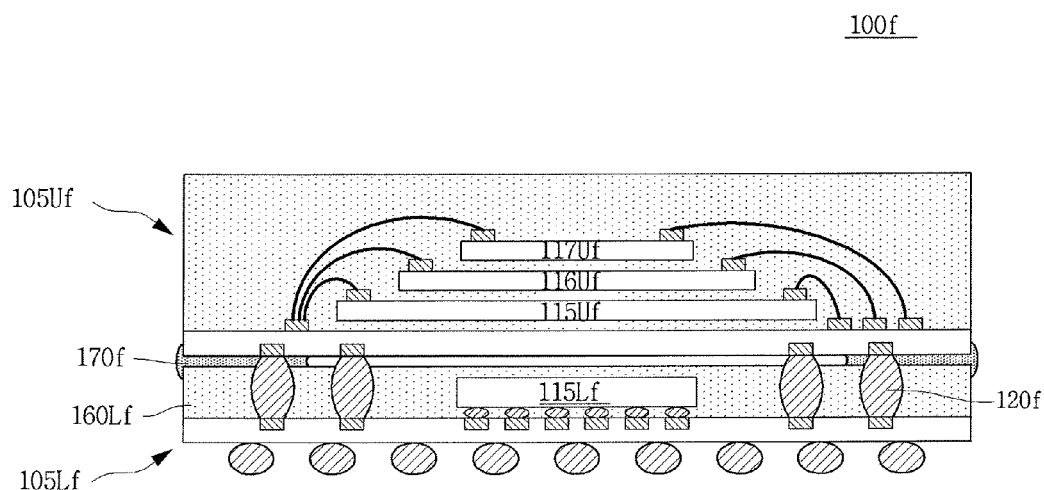

Referring to FIG. 6A, a package stack structure 100f according to an exemplary embodiment of the inventive concept may be similar to the package stack structures in other exemplary embodiments, but include a lower package 105Lf and an upper package 105Uf, via plugs 120f, and a fastening element 170f.

The lower package 105Lf may include a lower semiconductor chip 115Lf having a top surface covered by a lower molding compound 160Lf.

The upper package 105Uf may include a plurality of upper semiconductor chips 115Uf to 117Uf. The plurality of upper semiconductor chips 115Uf, 116Uf, and 117Uf, and their electrical connections may be similar to FIG. 5A and its descriptions.

The fastening element 170f may be formed in various ways (methods or processes) similar to other exemplary embodiments. Further, other elements not disclosed in the drawing may be understood by referring to other exemplary embodiments.

Figure 6B:
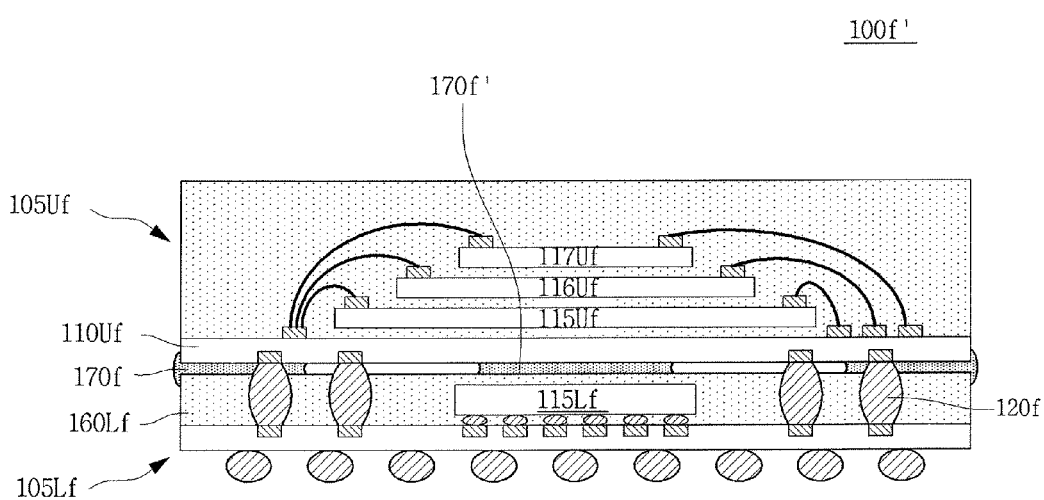

Referring to FIG. 6B, comparing to the package stack structure 100f of FIG. 6A, a package stack structure 100f' according to an exemplary embodiment of the inventive concept may be similar to the package stack structure 100f of FIG. 6A, but further include a central fastening element 170' between the lower molding compound 160Lf and the upper package substrate 110Uf. The central fastening element 170' may partially or completely cover a top surface of the lower semiconductor chip 115Lf. Detailed descriptions of the central fastening element 170f' will be described later.

Figure 7A:
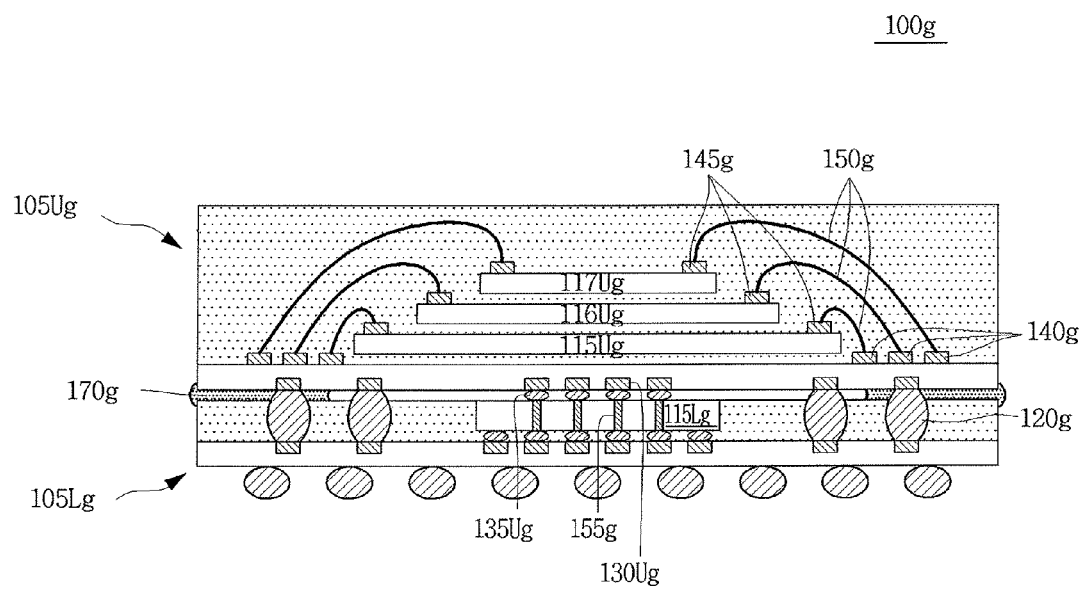

Referring to FIG. 7A, a package stack structure 100g according to an exemplary embodiment of the inventive concept may be similar to the package stack structures in other exemplary embodiments, but include a lower package 105Lg and an upper package 105Ug, via plugs 120g, a fastening element 170g, and chip-package interconnectors 135Ug.

The lower package 105Lg may include a lower semiconductor chip 115Lg having an exposed top surface. The lower semiconductor chip 115Lg may include chip via plugs 155g.

The upper package substrate 110Ug may include chip-package interconnector lands 130Ug.

The chip-package interconnector lands 130Ug may electrically connect the chip via plugs 155g to the chip-package interconnectors 135Ug.

The upper package 105Ug may include a plurality of upper semiconductor chips 115Ug, 116Ug, and 117Ug. Compared to the semiconductor package stack structure of FIG. 5A, the plurality of upper semiconductor chips 115Ug, 116Ug, and 117Ug and their electrical connections show that each of bond fingers 140g and chip pads 145g may be electrically connected in a one-to-one fashion by each of bonding wires 150 in a specific cross-sectional view. Of course, in the other cross-sectional views, the plurality of upper semiconductor chips 115Ug, 116Ug, and 117Ug and their electrical connections may be shown as those in FIG. 5A or 6B. Further, these two exemplary embodiments may be applied together.

The fastening element 170g may be formed by various ways (methods or processes) similar to other exemplary embodiments. Further, other elements not disclosed in the drawing may be understood by referring to other exemplary embodiments.

Figure 7B:
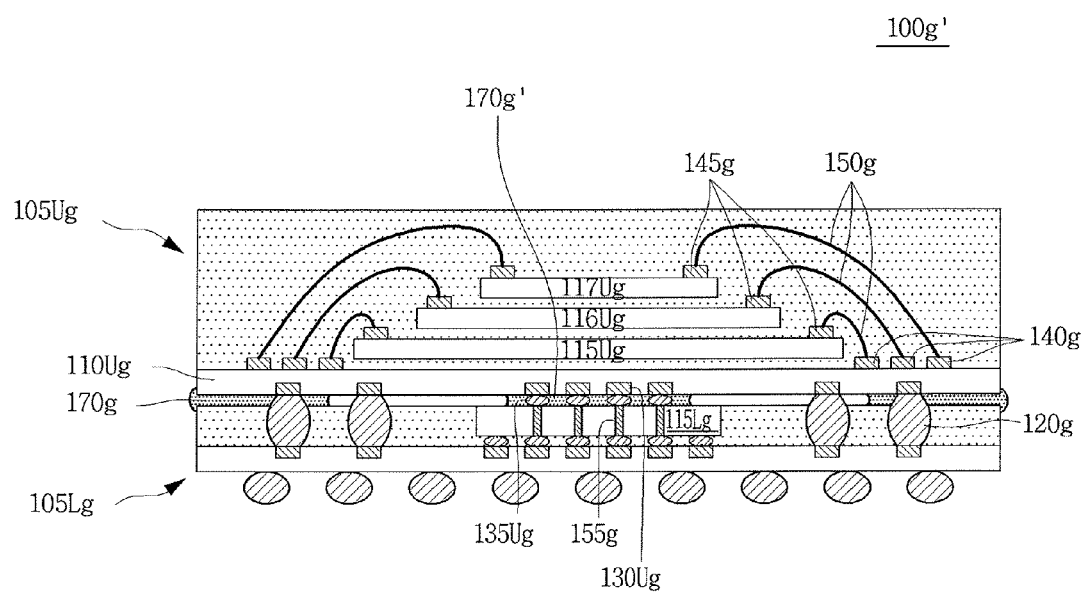

Referring to FIG. 7B, a package stack structure 100g' according to an exemplary embodiment of the inventive concept may be similar to the package stack structure 100g of FIG. 7A, but further include a central fastening element 170g' between the lower semiconductor chip 115Lg and an upper package substrate 110Ug. The central fastening element 170g' may partially or completely cover a top surface of the lower semiconductor chip 115Lg. The central fastening element 170g' may cover side surfaces of the chip-package interconnector 135Ug. Detailed descriptions of the central fastening element 170g' will be described later.

Figure 8A:
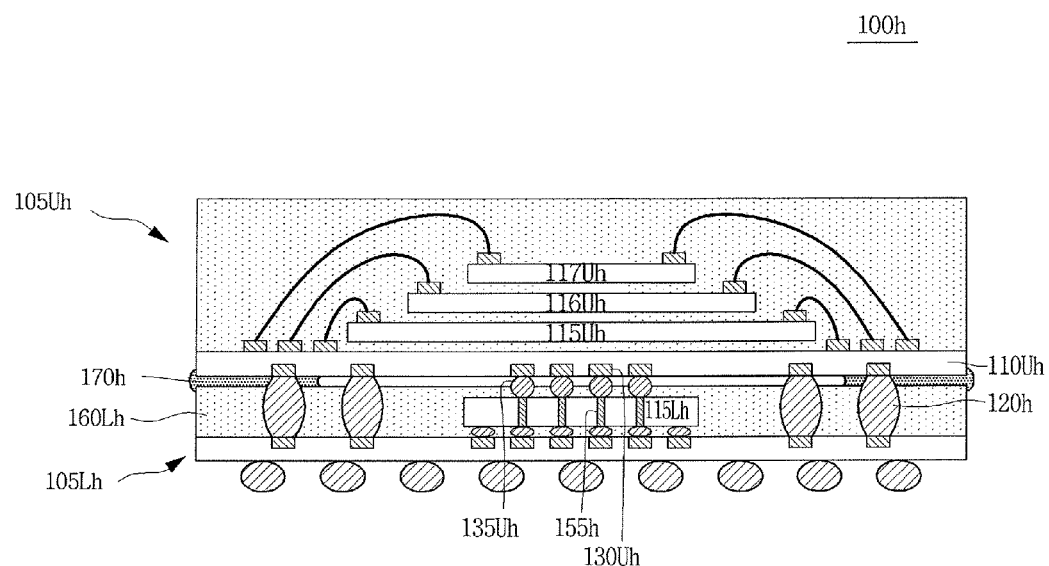

Referring to FIG. 8A, a package stack structure 100h according to an exemplary embodiment of the inventive concept may be similar to the package stack structures in other exemplary embodiments, but include a lower package 105Lh and an upper package 105Uh, via plugs 120h, a fastening element 170h, and chip-package interconnectors 135Uh.

The lower package 105Lh may include a lower semiconductor chip 115Lh having a top surface which is not exposed. In other words, the top surface of the lower semiconductor chip 115Lh may be covered by a lower molding compound 160Lh. The lower semiconductor chip 115Lh may include chip via plugs 155h.

The upper package 105Uh may include an upper package substrate 110Uh. The upper package substrate 110Uh may include chip-package interconnector lands 130Uh formed therebeneath. The upper package 105Uh may include a plurality of upper semiconductor chips 115Uh, 116Uh and 117Uh. The plurality of semiconductor chips 115Uh, 116Uh and 117Uh and their electrical connections may be understood by referring to FIG. 7A and its descriptions.

The chip-package interconnectors 135Uh may electrically connect the chip via plugs 155h to the chip-package interconnector lands 130Uh.

The chip-package interconnectors 135Uh may be greater in size than the chip-package interconnectors 135Ug shown in FIG. 7A. A portion of the chip-package interconnectors 135Uh may be surrounded by the lower molding compound 160Lh.

The fastening element 170h may be formed by various ways (methods or processes) similar to other exemplary embodiments. Further, other elements not disclosed in the drawing may be understood by referring to other exemplary embodiments.

Figure 8B:
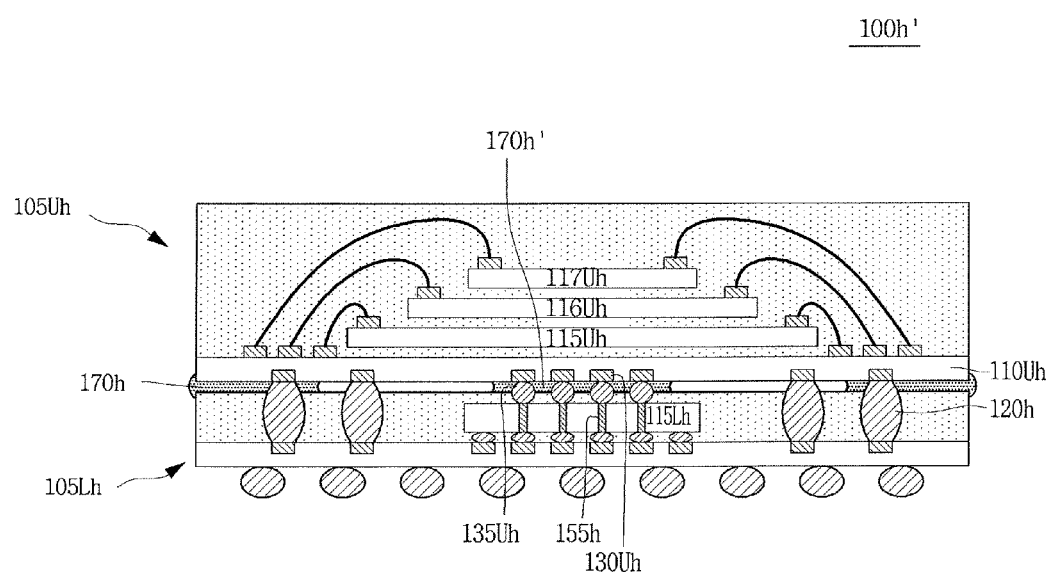

Referring to FIG. 8B, a package stack structure 100h' according to an exemplary embodiment of the inventive concept may be similar to the package stack structure 100h of FIG. 8A, but further include a central fastening element 170h' between the lower molding compound 160Lh and the upper package substrate 110Uh. The central fastening element 170h' may partially or completely overlap a top surface of the lower semiconductor chip 115Lh. The central fastening element 170h' may cover or surround side surfaces of the chip-package interconnector 135Uh. Detailed descriptions of the central fastening element 170h' will be described later.

Figure 9A:
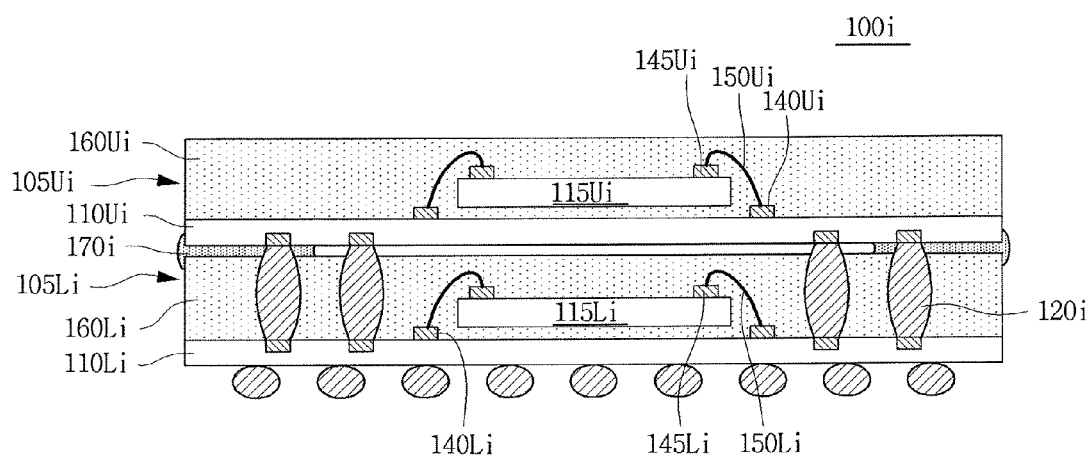

Referring to FIG. 9A, a package stack structure 100i according to an exemplary embodiment of the inventive concept may be similar to the package stack structure in other exemplary embodiments, but include a lower package 105Li and an upper package 105Ui, via plugs 120i, and a fastening element 170i.

The lower package may include a lower package substrate 110Li, a lower semiconductor chip 115Li formed on the lower package substrate 110Li, and a lower molding compound 160Li covering or surrounding the lower semiconductor chip 115Li.

The lower package substrate 110Li and the lower semiconductor chip 115Li may be electrically connected to each other through lower bond fingers 140Li, lower chip pads 145Li, and lower bonding wires 150Li.

The upper package 105Ui may include an upper package substrate 110Ui, an upper semiconductor chip 115Ui formed on the upper package substrate 110Ui, and an upper molding compound 160Ui covering or surrounding the upper semiconductor chip 115Ui.

The upper package substrate 110Ui and the upper semiconductor chip 115Ui may be electrically connected to each other through upper bond fingers 140Ui, upper chip pads 145Ui, and upper bonding wires 150Ui.

The lower and upper semiconductor chips 115Li and 115Ui may include a memory device, respectively.

The fastening element 170i may be formed by various ways (methods or processes) similar to other exemplary embodiments. Further, other elements not disclosed in the drawing may be understood by referring to other example embodiments.

Similar to other exemplary embodiments, the lower and upper package substrates 110Li and 110Ui include conductive materials (lines) to electrically connect the lower semiconductor chip 115Li and the via plugs 120i, to electrically connect the upper semiconductor chip 115Ui and the via plugs 120i, and to electrically connect the lower and upper package substrates 110Li and 110Ui.

Figure 9B:
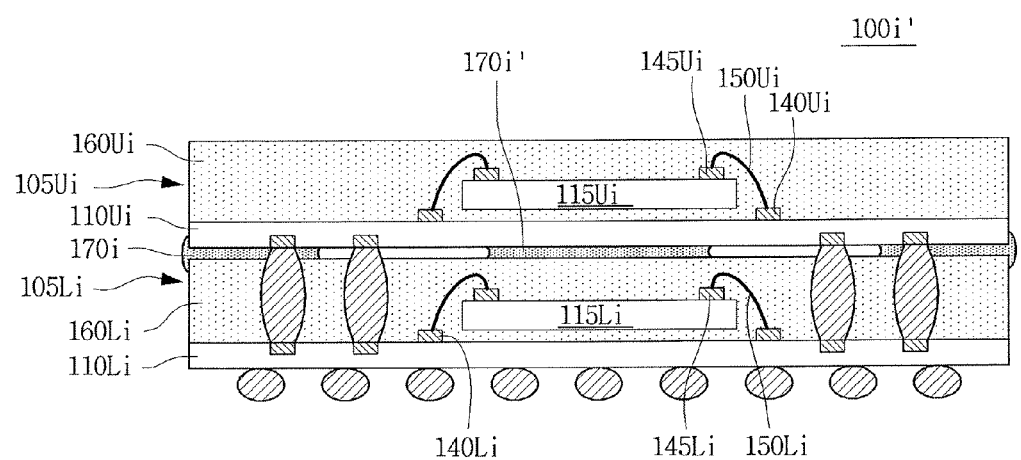

Referring to FIG. 9B, a package stack structure 100i' according to an exemplary embodiment of the inventive concept may be similar to the package stack structure 100i of FIG. 9A, but further include a central fastening element 170i' between the lower molding compound 160Li and the upper package substrate 110Ui. The central fastening element 170i' may partially or completely overlap a top surface of the lower semiconductor chip 115Li. Detailed descriptions of the central fastening element 170i' will be described later.

Figure 10A:
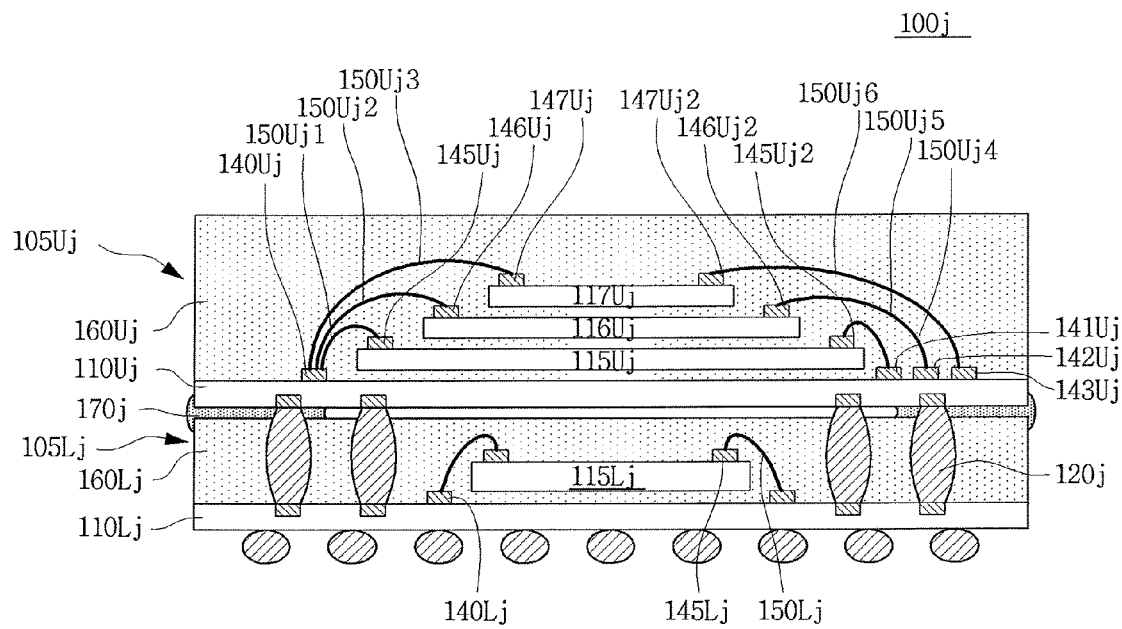

Referring to FIG. 10A, a package stack structure 100j according to an exemplary embodiment of the inventive concept may be similar to the package stack structures in other example embodiments, but include a lower package 105Lj and an upper package 105Uj, via plugs 120j, and a fastening element 170j.

The lower package 105Lj may include a lower package substrate 110Lj, a lower semiconductor chip 115Lj formed on the lower package 110Lj, a lower molding compound 160Lj covering or surrounding the lower semiconductor chip 115Lj.

The lower package substrate 110Lj and the lower semiconductor chip 115Lj may be electrically connected to each other through lower bond fingers 140Lj, lower chip pads 145Lj, and lower bonding wires 150Lj.

The upper package 105Uj may include an upper package substrate 110Uj, a plurality of upper semiconductor chips 115Uj, 116Uj and 117Uj formed on the upper package substrate 110Uj, and an upper molding compound 160Uj covering or surrounding side surfaces of the upper semiconductor chips 115Uj, 116Uj and 117Uj.

The upper package substrate 110Uj and the upper semiconductor chips 115Uj, 116Uj and 117Uj may be electrically connected to each other through upper bond fingers 140Uj, 141Uj, 142Uj and 143Uj, upper chip pads 145Uj1, 146Uj1, 147Uj1, 145Uj2, 146Uj2, and 147Uj2, and upper bonding wires 150Uj1-150Uj6.

The lower and upper semiconductor chips 115Lj and 115Uj, 116Uj and 117Uj may include a memory device, respectively.

As described in the foregoing description of the package stack structure 100a according to the exemplary embodiment of FIG. 1A, the semiconductor stack structures 100a' to 100j' according to exemplary embodiments may include under-fill materials between the semiconductor package substrates and the semiconductor chips.

The fastening element 170j may be formed by various ways (methods or processes) similar to other exemplary embodiments. Further, other elements not disclosed in the drawing may be understood by referring to other exemplary embodiments.

Figure 10B:
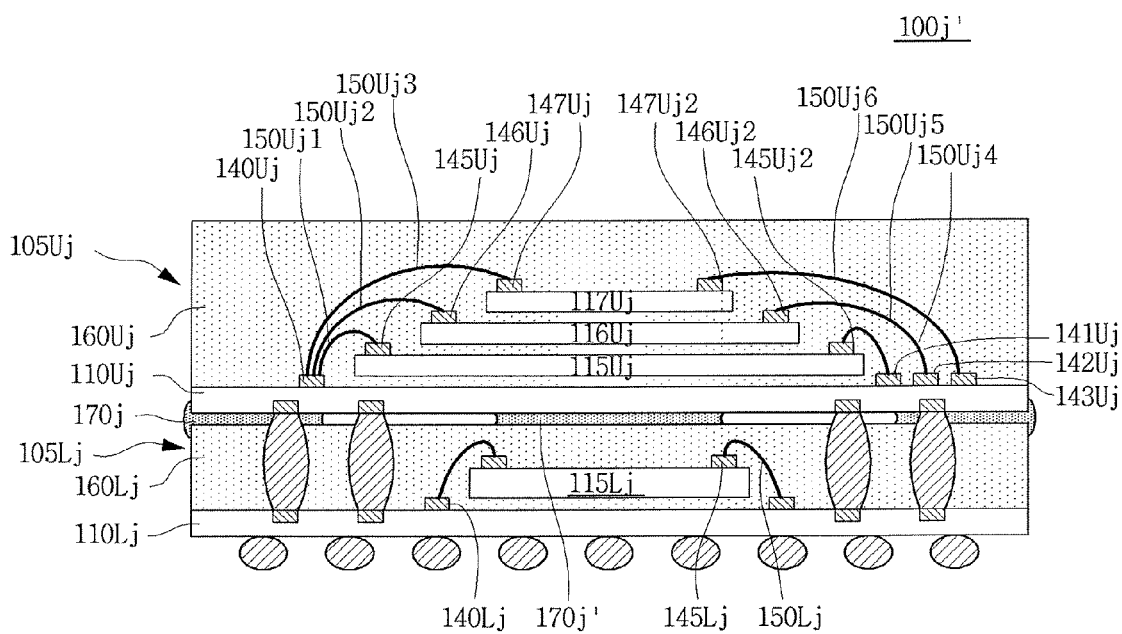

Referring to FIG. 10B, a package stack structure 100j' according to an exemplary embodiment of the inventive concept may be similar to the package stack structure 100j of FIG. 10A, but further include a central fastening element 170j' between the lower molding compound 160Lj and the upper package substrate 110Uj. The central fastening element 170j' may partially or completely overlap a top surface of the lower semiconductor chip 115Lj. Detailed descriptions of the central fastening element 170j' will be described later.

Figure 11A:
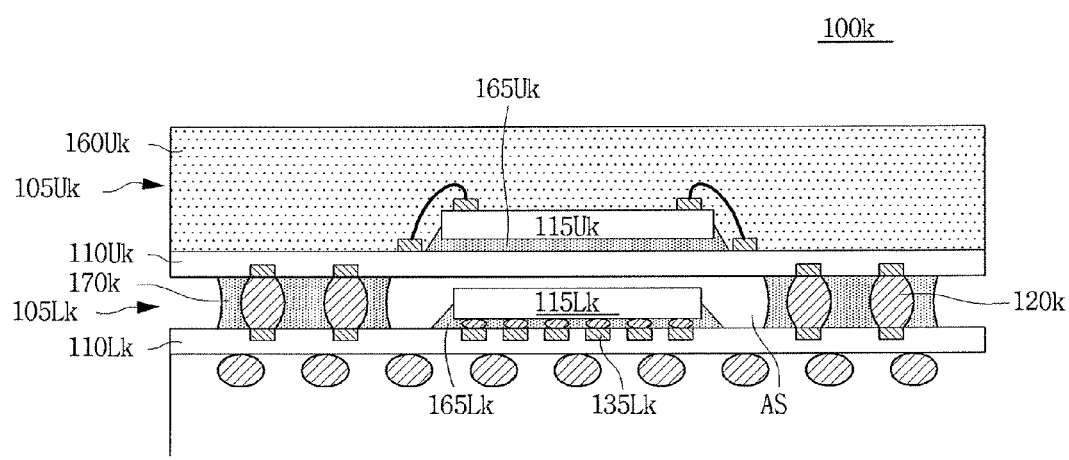

Referring to FIG. 11A, a package stack structure 100k according to an exemplary embodiment of the inventive concept may be similar to the package stack structures in other exemplary embodiments, but include a lower package 105Lk and an upper package 105Uk, via plugs 120k, and a fastening element 170k.

The lower package 105Lk may include a lower package substrate 110Lk, a lower semiconductor chip 115Lk formed on the lower package substrate 110Lk, and lower bonders 135Lk formed on the lower package substrate 110Lk. The lower bonders 135k may be connected to the lower semiconductor chip 115Lk through contacts 136Lk.

An air space AS may exist around the lower semiconductor chip 115Lk. In other words, the air space AS may exist adjacent to side surfaces of the lower semiconductor chip 116Lk. Further, the air space AS may exist above the lower semiconductor chip 116Lk.

The lower package 105Lk may include a lower under-fill material 165Lk interposed between the lower package substrate 110Lk and the lower semiconductor chip 115Lk, and covering and surrounding side surfaces of the lower bonders 135Lk. The lower under-fill material 165Lk may connect (or attach) the lower semiconductor chip 115Lk and the lower package substrate 110Lk to each other, and surround the lower bonders 135Lk. The lower under-fill material 165Lk may include an adhesive thermosetting material such as a die attach film or resin including epoxy.

The upper package 105Uk may include an upper package substrate 110Uk and an upper semiconductor chip 115Uk formed on the upper package substrate 110Uk. The upper package 105Uk may include an upper under-fill material 165Uk between the upper package substrate 110Uk and the upper semiconductor chip 115Uk. The upper under-fill material 165Uk may include the same material as the lower under-fill material 165Lk.

The upper semiconductor chip 115Uk may be covered or surrounded by an upper molding compound 160Uk.

The via plugs 120k may include a metal or solder material. Although it is not shown, the via plugs 120k may include a metal structure of a pillar or mesa shape. The metal structure may include copper (Cu) and/or nickel (Ni)

The fastening element 170k may be formed between the lower and upper packages 105Lk and 105Uk, and fasten the lower and upper packages 105Lk and 105Uk. Specifically, the fastening element 170k may be formed between the lower and upper package substrates 110Lk and 110Uk, and fasten the lower and upper package substrates 110Lk and 110Uk. The fastening element 170k may cover or surround side surfaces of the at least one via plug 120k. The fastening element 170k may extend onto side surfaces of the upper package substrate 110Uk. On the other hand, the fastening element 170k may protrude from side surfaces of the lower package substrate 110Lk and/or outer areas of the side surfaces of the upper package substrate 110Uk.

The fastening element 170k may be formed by various ways (methods or processes) similar to other exemplary embodiments. Further, other elements not disclosed in the drawing may be understood by referring to other exemplary embodiments.

Figure 11B:
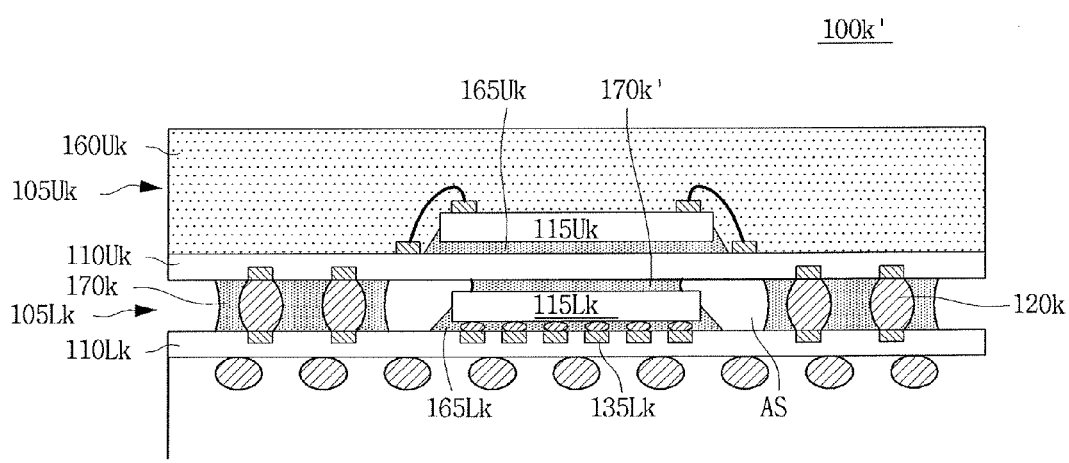

Referring to FIG. 11B, a package stack structure 100k' according to an exemplary embodiment of the inventive concept may be similar to the package stack structure 100k of FIG. 11A, but further include a central fastening element 170k' between the lower semiconductor chip 115Lk and the upper package substrate 110Uk. The central fastening element 170k' may partially or completely cover a top surface of the lower semiconductor chip 115Lk. Detailed descriptions of the central fastening element 170k' will be described later.

Figure 12A:
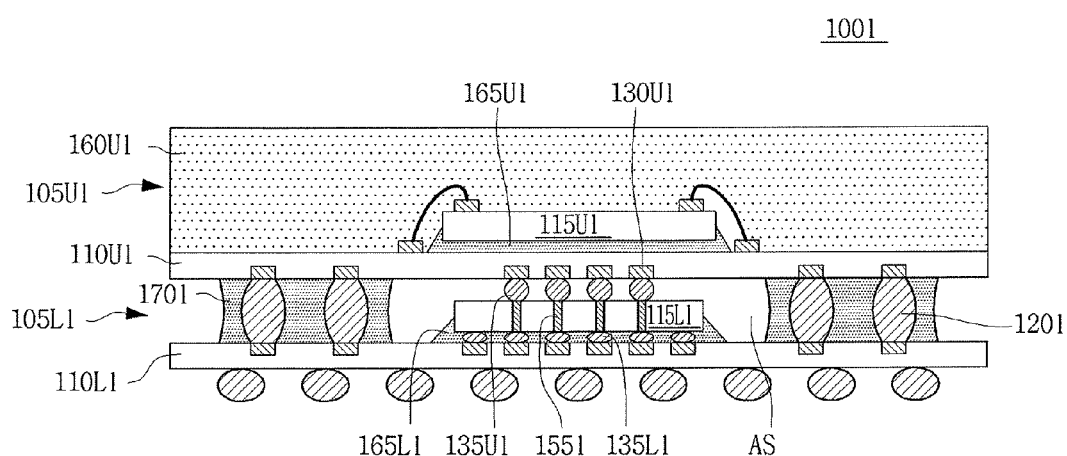

Referring to FIG. 12A, a package stack structure 100l according to an exemplary embodiment of the inventive concept may be similar to the package stack structures in other exemplary embodiments, but include a lower package 105Ll and an upper package 105Ul, via plugs 120l, a fastening element 170l, and chip-package connectors 135Ul.

The lower package 105Ll may include a lower package substrate 110Ll, a lower semiconductor chip 115Ll on the lower package substrate 110Ll, and lower bonders 135Ll.

An air space AS may be exist around the lower semiconductor chip 115Ll

The lower package 105Ll may include a lower under-fill material 165Ll interposed between the lower package substrate 110Ll and the lower semiconductor chip 115Ll and covering or surrounding side surfaces of the lower bonders 135Ll.

The lower semiconductor chip 115Ll may include chip-via plugs 155l. The chip via plugs 155l may electrically connect the lower bonders 135Ll to the chip-package interconnectors 135Ul. The upper package substrate 110Ul may include chip-package interconnector lands 135Ul. The chip-package interconnectors 135Ul may electrically connect the chip via plugs 155l to the chip-package connector lands 130Ul.

The upper package 105Ul may include an upper package substrate 110Ul and an upper semiconductor chip 115Ul on the upper package substrate 110Ul. The upper package 105Ul may include an upper under-fill material 165Ul between the upper package substrate 110Ul and the upper semiconductor chip 115Ul. The upper semiconductor chip 115Ul may be covered or surrounded by an upper molding compound 160Ul.

The via plugs 120l and the fastening element 170l may be formed by various ways (methods or processes) similar to other exemplary embodiments. Further, other elements not disclosed in the drawing may be understood by referring to other exemplary embodiments.

Figure 12B:
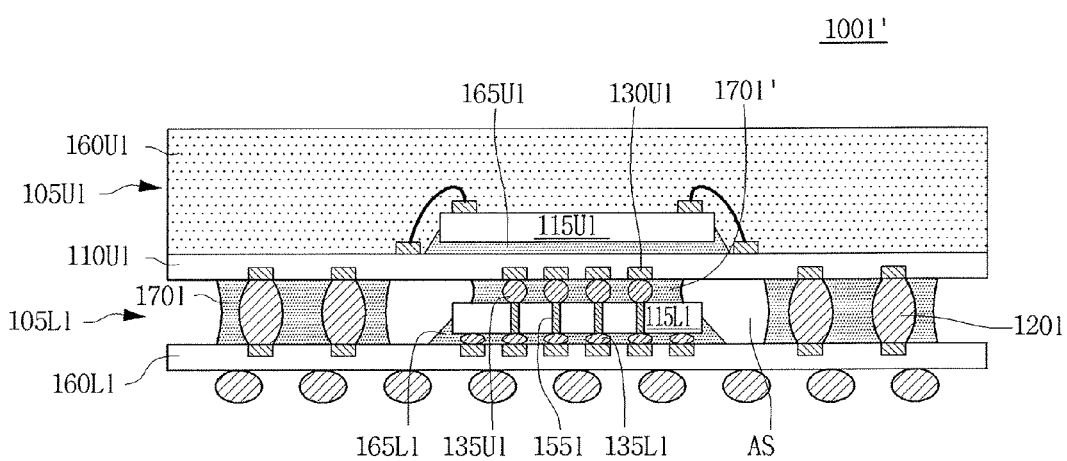

Referring to FIG. 12B, a package stack structure 100l' according to an exemplary embodiment of the inventive concept may be similar to the package stack structure 100l of FIG. 12A, but further include a lower semiconductor chip 115Ll and a central fastening element 170l' between the lower semiconductor 115Ll and the upper package substrate 110Ul. The central fastening element 170l' may partially or completely cover a top surface of the lower semiconductor chip 115Ll. The central fastening element 170l' may cover or surround side surfaces of the chip-package interconnectors 135Ul. Detailed descriptions of the central fastening element 170l' will be described later.

Figure 13A:
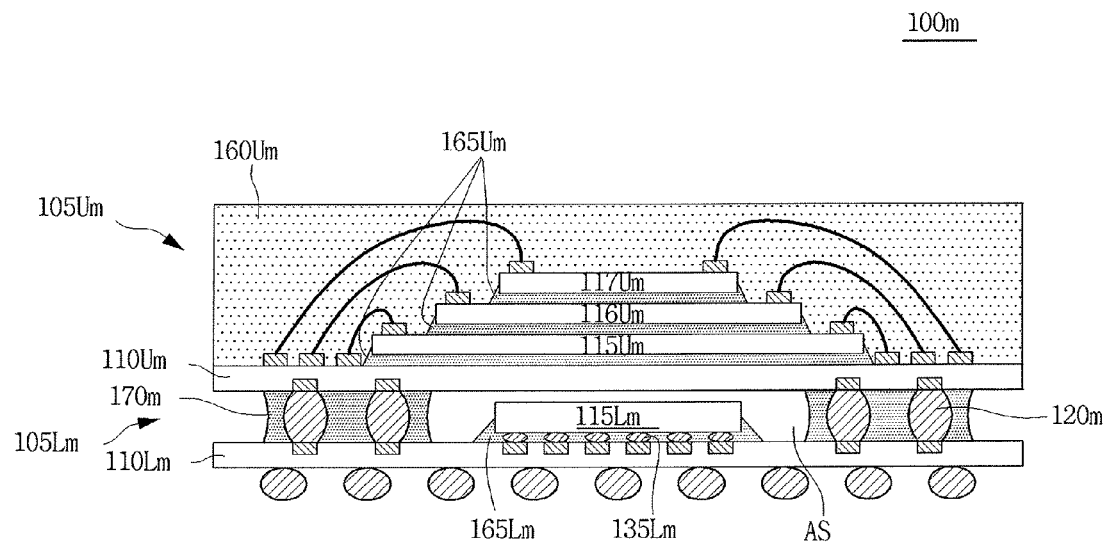

Referring to FIG. 13A, ca package stack structure 100m according to an exemplary embodiment of the inventive concept may be similar to the package stack structures in other exemplary embodiments, but include a lower package 105Lm, an upper package 105Um, via plugs 120m, and a fastening element 170m.

The lower package 105Lm may include a lower package substrate 110Lm and a lower semiconductor chip 115Lm on the lower package substrate 110Lm, and lower bonders 135Lm.

An air space AS may exist around the lower semiconductor chip 115Lm.

The lower package 105Lm may include a lower under-fill material 165Lm interposed between the lower package substrate 110Lm and the lower semiconductor chip 115Lm, and covering or surrounding side surfaces of the lower bonders 135Lm.

The upper package 105Um may include an upper package substrate 110Um and a plurality of upper semiconductor chips 115Um, 116Um, and 117Um.

The upper package 105Um may include upper under-fill materials 165Um between the upper package substrate 110Um and the lower most semiconductor chip 115Um, and between the adjacent upper semiconductor chips 115Um, 116Um, and 117Um.

The plurality of upper semiconductor chips 115Um, 116Um, and 117Um may be covered or surrounded by an upper molding compound 160Um.

Electrical connections between the lower package substrate 110Lm and the lower semiconductor chip 115Lm and between the upper package substrate 110Um and the corresponding upper semiconductor chips 115Um, 116Um, and 117Um may be formed by ways (methods or processes) similar to other exemplary embodiments.

The via plugs 120m and the fastening element 170m may be formed by ways (methods or processes) similar to other exemplary embodiments. Further, other elements not disclosed in the drawing may be understood by referring to other exemplary embodiments.

Figure 13B:
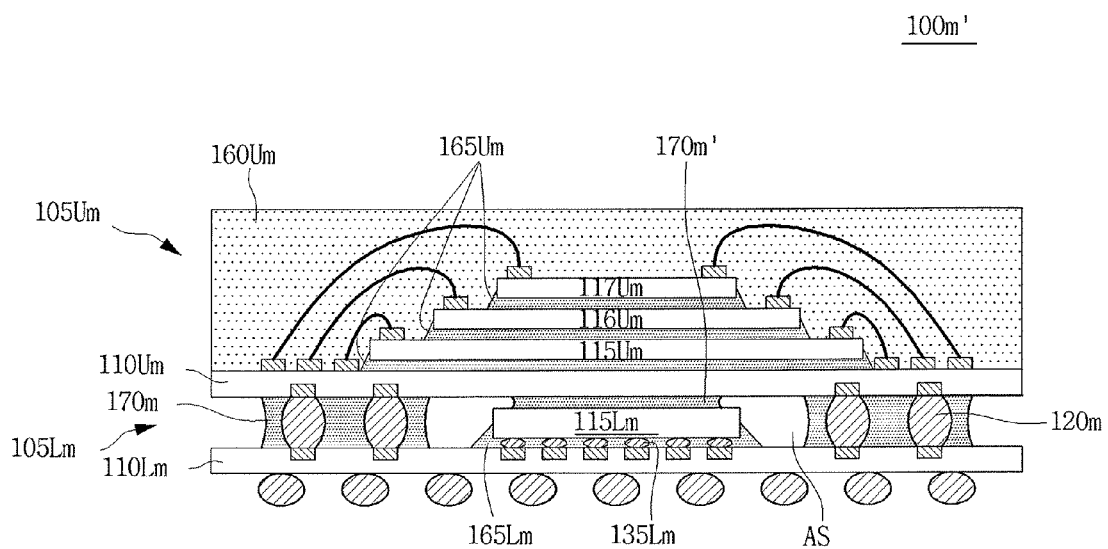

Referring to FIG. 13B, a package stack structure 100m' according to an exemplary embodiment of the inventive concept may be similar to the package stack structure 100m of FIG. 13A, but further include a central fastening element 170m' between the lower semiconductor chip 115Lm and the upper package substrate 110Um. The central fastening 170m' may partially or completely cover a top surface of the lower semiconductor chip 115Lm. Detailed descriptions of the central fastening element 170m' will be described later.

Figure 14A:
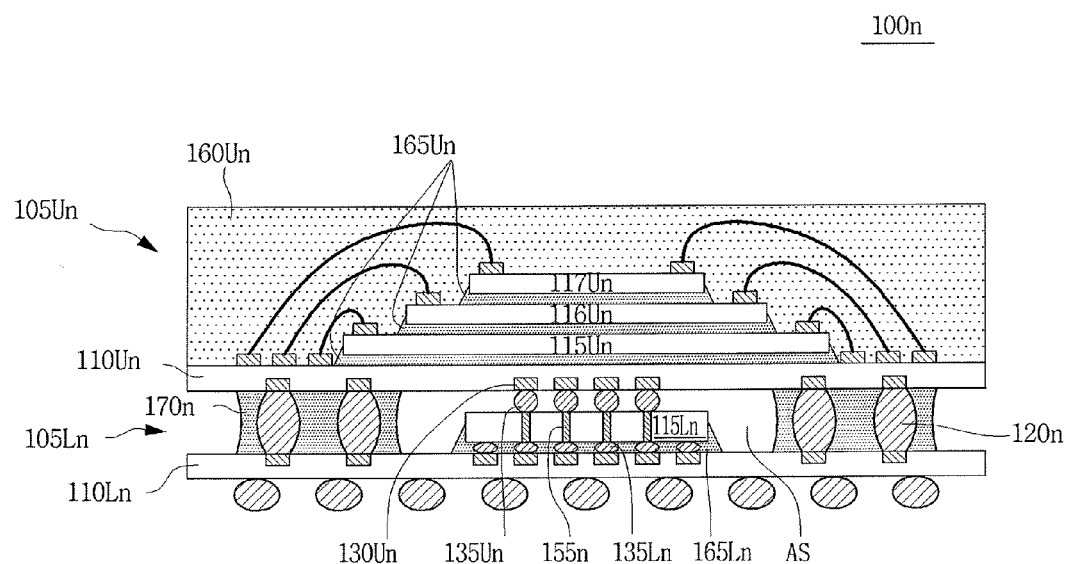

Referring to FIG. 14A, a package stack structure 100n according to an exemplary embodiment of the inventive concept may be similar to the package stack structures in other exemplary embodiments, but include a lower package 105Ln and an upper package 105Un, via plugs 120n, a fastening element 170n, lower bonders 135Ln, and chip-package interconnectors 135Un.

The lower package 105Ln may include a lower package substrate 110Ln, a lower semiconductor chip 115Ln on the lower package substrate 110Ln, and the lower bonders 135Ln.

An air space AS may exist around the lower semiconductor chip 115Ln.

The lower semiconductor package 105Ln may include a lower under-fill material 165Ln interposed between the lower package substrate 110Ln and the lower semiconductor chip 115Ln, and covering or surrounding side surfaces of the lower bonders 135Ln.

The lower semiconductor chip 115Ln may include chip via plugs 155n. The chip via plugs 155n may electrically connect the lower bonders 135Ln to the chip-package interconnectors 135Un. The upper package substrate 110Un may include chip-package interconnector lands 130Un. The chip-package interconnectors 135Un may electrically connect the chip via plugs 155n to the chip-package interconnector lands 130Un.

The upper package 105Un may include an upper package substrate 110Un and a plurality of upper semiconductor chips 115Un, 116Un, and 117Un on the upper package substrate 110Un. The upper package 105Un may include an upper under-fill material 165Un between the upper package substrate 110Un and the upper semiconductor chip 115Un disposed at the bottom most portion, and between the adjacent upper semiconductor chips 115Un, 116Un, and 117Un. The plurality of upper semiconductor chips 115Un, 116Un, and 117Un may be covered or surrounded by an upper molding compound 160Un.

Electrical connections between the lower package substrate 110Ln and the lower semiconductor chip 115Ln, and between the upper package substrate 110Un and the plurality of upper semiconductor chips 115Un to 117Un may be understood by referring to other exemplary embodiments.

The via plugs 120n and the fastening element 170n may be variously formed by referring to other example embodiments. Further, other elements not disclosed in the drawing may be understood by referring to other example embodiments.

Figure 14B:
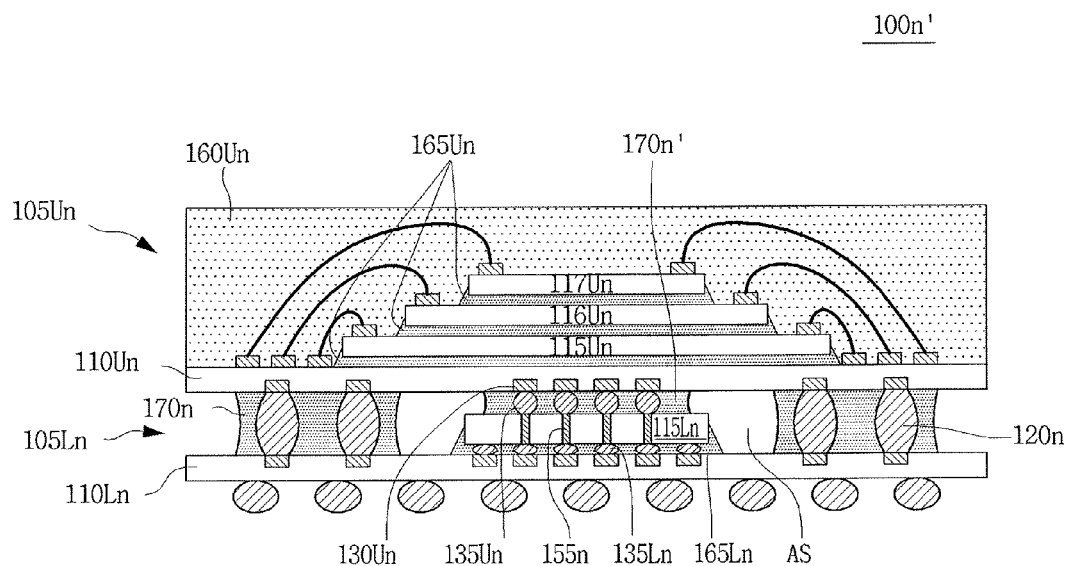

Referring to FIG. 14B, a package stack structure 100n' according to an exemplary embodiment of the inventive concept may be similar to the package stack structure 100n of FIG. 14A, but further include a central fastening element 170n' between the lower semiconductor chip 115Ln and the upper package substrate 110 Un. The central fastening element 170n' may partially or completely cover a top surface of the lower semiconductor chip 115Ln. The central fastening element 170n' may surround side surfaces of the chip-package interconnectors 135Un. Detailed descriptions of the central fastening element 170n' will be described later.

Figure 15A:
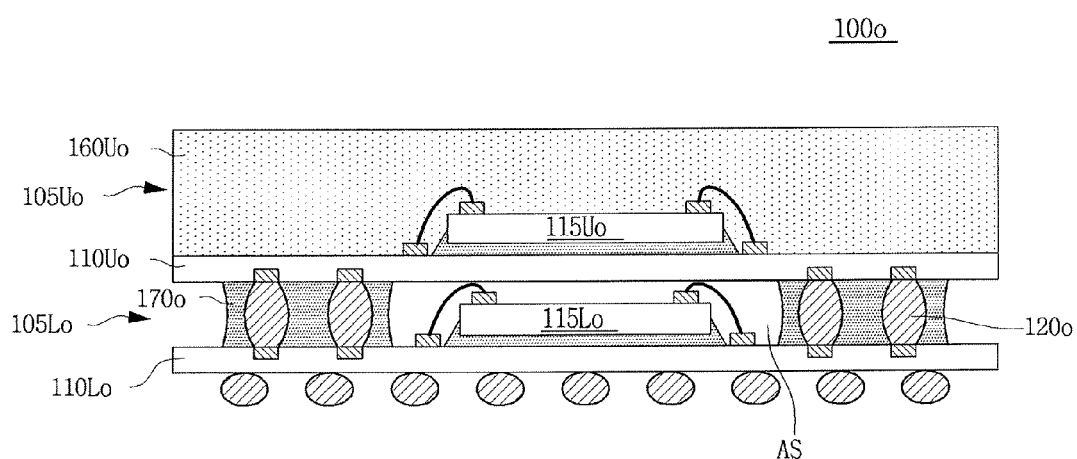

Referring to FIG. 15A, ca package stack structure 100o according to an exemplary embodiment of the inventive concept may be similar to the package stack structures in other exemplary embodiments, but include a lower package 105Lo and an upper package 105Uo, via plugs 120o, and a fastening element 170o.

The lower package 105Lo may include a lower package substrate 110Lo and a lower semiconductor chip 115Lo on the lower package substrate 110Lo. An air space AS may exist around the lower semiconductor chip 115Lo. The lower semiconductor chip 115Lo may be electrically connected to the lower package substrate 110Lo through wire bonding structures. This embodiment may be sufficiently understood by referring to other embodiments. Accordingly, detailed descriptions of the exemplary embodiment may be omitted.

The upper package 105Uo may include an upper package substrate 110Uo and an upper semiconductor chip 115Uo on the upper package substrate 110Uo. The upper semiconductor chip 115Uo may be covered or surrounded by an upper molding compound 160Uo.

Electrical connections between the lower package substrate 110Lo and the lower semiconductor chip 115Lo, and between the upper package substrate 110Uo and the upper semiconductor chip 115Uo may be understood by referring to other exemplary embodiments.

The via plugs 120o and the fastening element 170o may be formed by using ways (methods or processes) similar to other exemplary embodiments. Further, other elements not disclosed in the drawing may be understood by referring to other exemplary embodiments.

Figure 15B:
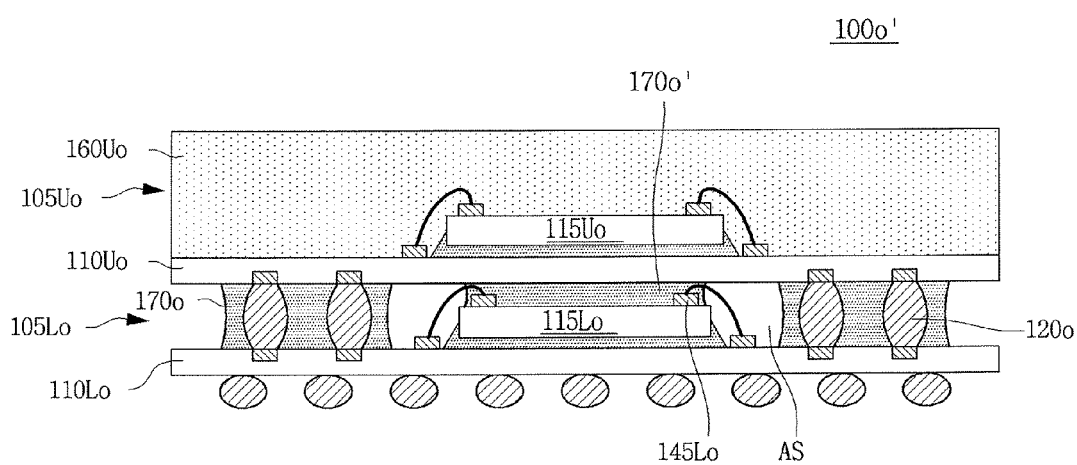

Referring to FIG. 15B, a package stack structure 100o' according to an exemplary embodiment of the inventive concept may be similar to the package stack structure 100o of FIG. 15A, but further include a central fastening element 170o' between the lower semiconductor chip 115Lo and the upper package substrate 110Uo. The central fastening element 170o' may partially or completely cover a top surface of the lower semiconductor chip 115Lo. The central fastening element 170o' may partially or completely cover lower chip pads 145Lo. In the example embodiment, it is illustrated that the central fastening element 170o' covers the lower chip pad 145o. Detailed descriptions of the central fastening element 170o' will be described later.

Figure 16A:
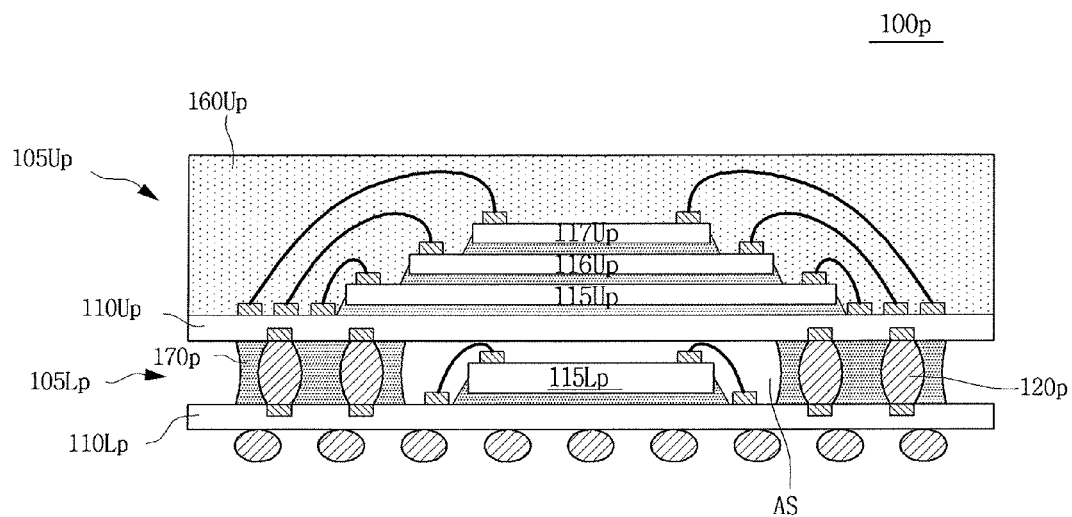

Referring to FIG. 16A, a package stack structure 100p according to an exemplary embodiment of the inventive concept may be similar to the package stack structures in other exemplary embodiments, but include a lower package 105Lp and an upper package 105Up, via plugs 120p, and a fastening element 170p.

The lower package 105Lp may include a lower package substrate 110Lp and a lower semiconductor chip 115Lp on the lower package substrate 110Lp. An air space AS may exist around the lower semiconductor chip 115Lp.

The upper package 105Up may include an upper package substrate 110Up and a plurality of upper semiconductor chips 115Up, 116Up, and 117Up on the upper package substrate 110Up. The plurality of semiconductor chips 115Up, 116Up, and 117Up may be covered or surrounded by an upper molding compound 160Up.

Electrical connections between the upper package substrate 110Lp and the lower semiconductor chip 115Lp and between the upper package substrate 110Up and the plurality of semiconductor chips 115Up, 116Up, and 117Up may be understood by referring to other exemplary embodiments.

The via plugs 120p and the fastening element 170p may be formed by using ways (methods or processes) similar to other example embodiments. Further, other elements not disclosed in the drawing may be understood by referring to other exemplary embodiments.

Figure 16B:
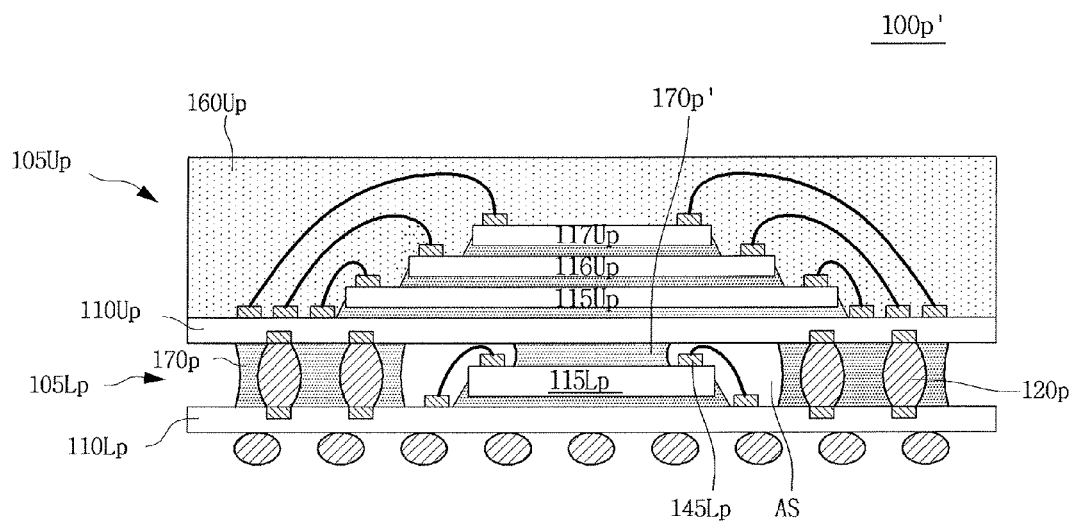

Referring to FIG. 16B, a package stack structure 100p' according to an exemplary embodiment of the inventive concept may be similar to the package stack structure 100p of FIG. 16A, but further include a central fastening element 170p' between the lower semiconductor chip 115Lp and the upper package substrate 110Up. The central fastening element 170p' may partially or completely cover a top surface of the lower semiconductor chip 115Lp. The central fastening element 170p' may partially or completely cover lower chip pads 145Lp. In the example embodiment, it is illustrated that the central fastening element 170p' partially covers the upper lower chip pads 145p. Detailed descriptions of the central fastening element 170p' will be described later.

The package stack structures according to exemplary embodiments of the inventive concept may include various unit semiconductor packages, for example, chip scale packages (CSPs) including a ball grid array (BGA), a shrink dual inline package (SDIP), a dual inline package (DIP), a zig-zag inline package (ZIP), a single inline package (SIP), a plastic leaded chip carrier (PLCC), a quad flat package (QFP), a small outline package (SOP), a shrink small outline package (SSOP), or a thin small outline package (TSOP).

Accordingly, although specific structures of any semiconductor packages may not be illustrated, if there are not any vital structural defects, it is understood that the specific structures of any semiconductor package may be included in the inventive concept.

FIGS. 17A to 17I are longitudinal cross-sectional views or side views schematically illustrating package stack structures according to exemplary embodiments of the inventive concept. It can be understood that the exemplary embodiments may correspond to exemplary embodiments capable of being applied to package stack structures according to other exemplary embodiments.

Referring to FIGS. 17A to 17I, each of package stack structures 200a to 200i according to exemplary embodiments of the inventive concept may include each of fastening elements 270a to 270i formed between a package substrate 210 and a molding compound 260. The package substrate 210 may include via plug lands 225. Via plugs 220 may vertically penetrate the molding compound 260 and be electrically and/or physically connected to the via plug lands 225.

The fastening elements 270a to 270i may correspond to the fastening elements 170a to 170p and/or central fastening elements 170a' to 170p' illustrated in FIGS. 1A to 16B, respectively.

Figure 17A:
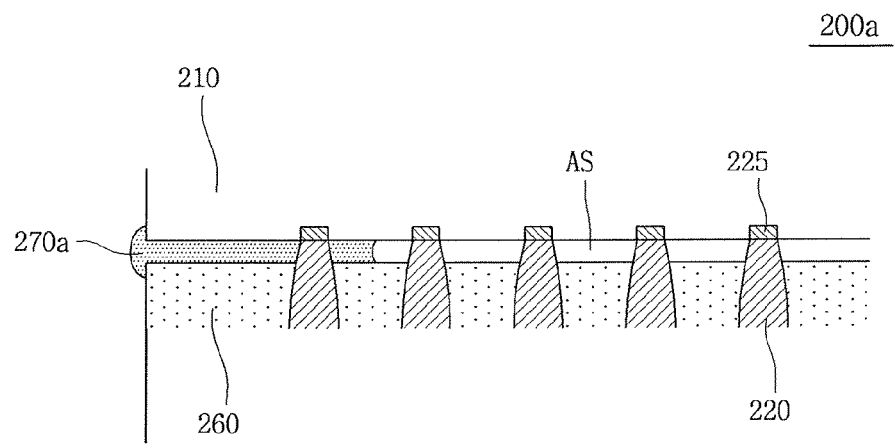
FIGS. 17A to 18I are longitudinal or horizontal cross-sectional views schematically illustrating package stack structures according to exemplary embodiments of the inventive concept.

Referring to FIG. 17A, the package stack structure 200a according to an exemplary embodiment of the inventive concept may include a fastening element 270a. The fastening element 270a may be disposed between the package substrate 210 and the molding compound 260 and may include a first end portion extending to and protruding from side surfaces of the package substrate 210 and/or the molding compound 260. The fastening element 270a may include a second end portion located between the via plugs 220. The fastening element 270a may directly cover or surround a side surface and/or a top surface of the at least one via plug 220.

Figure 17B:
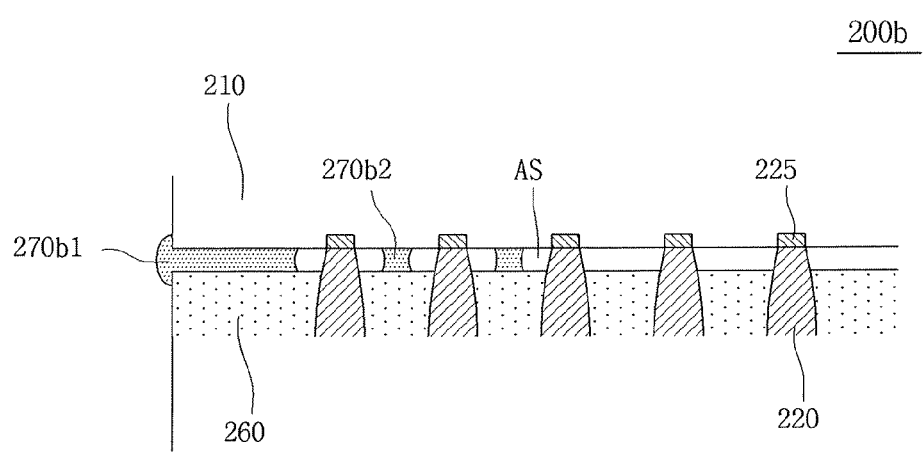

Referring to FIG. 17B, the package stack structure 200b according to an exemplary embodiment of the inventive concept may include fastening elements 270b1 and 270b2. The fastening elements 270b1 and 270b2 may include an outer fastening element 270b1 and an inner fastening element 270b2, respectively. The outer fastening element 270b1 may include a first end portion extending to and protruding from side surfaces of the package substrate 210 and/or the molding compound 260. The inner fastening element 270b2 may be formed in plural numbers between the via plugs 220. The outer and inner fastening elements 270b1 and 270b2 may not be in contact with side surfaces of the via plugs 220. The outer and inner fastening elements 270b1 and 270b2 may be spaced apart from each other and may form a space in which a portion of the via plug 220 is disposed.

Figure 17C:
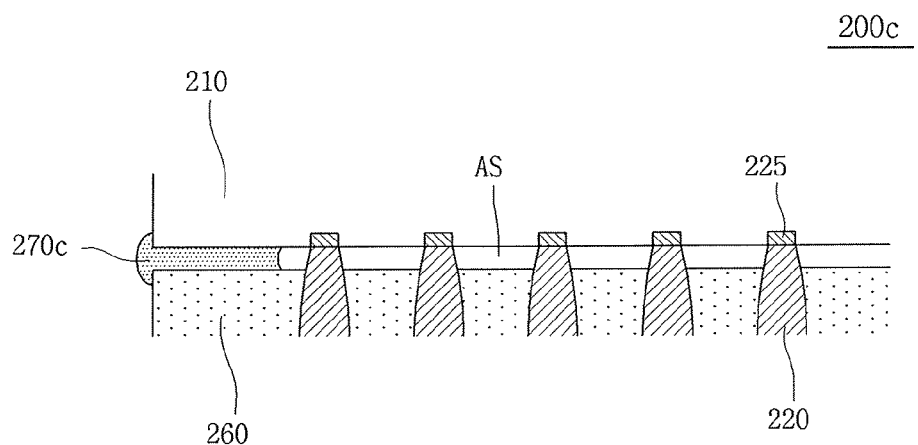

Referring to FIG. 17C, the package stack structure 200c according to an exemplary embodiment of the inventive concept may include a fastening element 270c. The fastening element 270c may include a first end portion extending to and protruding from side surfaces of the package substrate 210 and/or the molding compound 260. The fastening element 270c may include a second end portion not in contact with side surfaces of the via plugs 220.

Figure 17D:
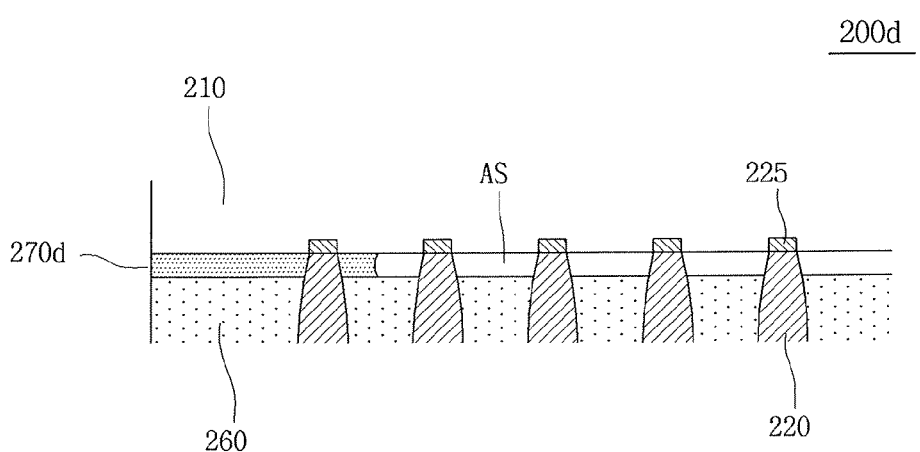

Referring to FIG. 17D, the package stack structure 200d according to an exemplary embodiment of the inventive concept may include a fastening element 270d. The fastening element 270d have a first end portion aligned with side surfaces of the package substrate 210 and the molding compound 260. That is, the fastening element 270d may include a side surface aligned with the side surfaces of the package substrate 210 and/or the molding compound 260.

Figure 17E:
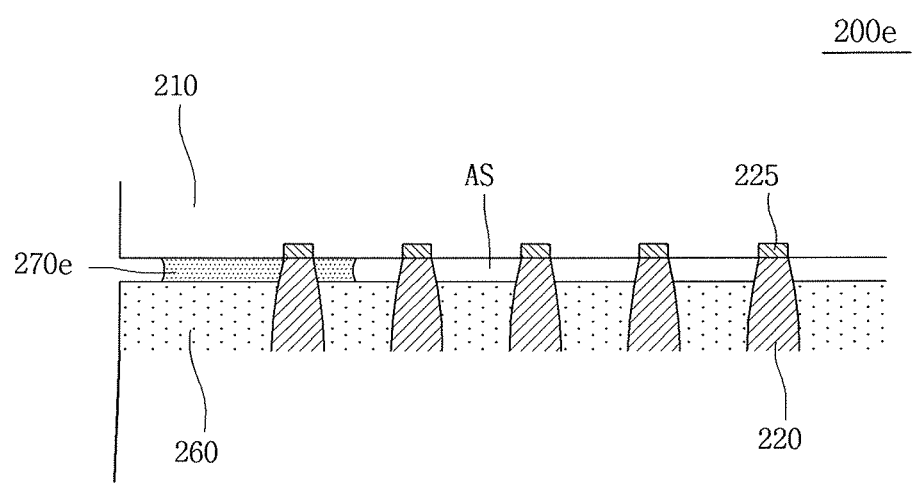

Referring to FIG. 17E, the package stack structure 200e according to an exemplary embodiment of the inventive concept may include a fastening element 270e. The fastening element 270e may include a first end portion not extending to side surfaces of the package substrate 210 and the molding compound 260. The first end portion of the fastening element 270e may not protrude from the side surfaces of the package substrate 210 and the molding compound 260. That is, the first end portion of the fastening element 270e may be located at inner areas of the side surfaces of the package substrate 210 and/or the molding compound 260. In other words, the first end portion of the fastening element 170e is a recess formed from a surface aligned with the side surfaces of the package substrate 210 and/or the molding compound 260 such that end portions of the package substrate 210 and/or the molding compound 260 are not formed with the fastening element 270e.

Figure 17F:
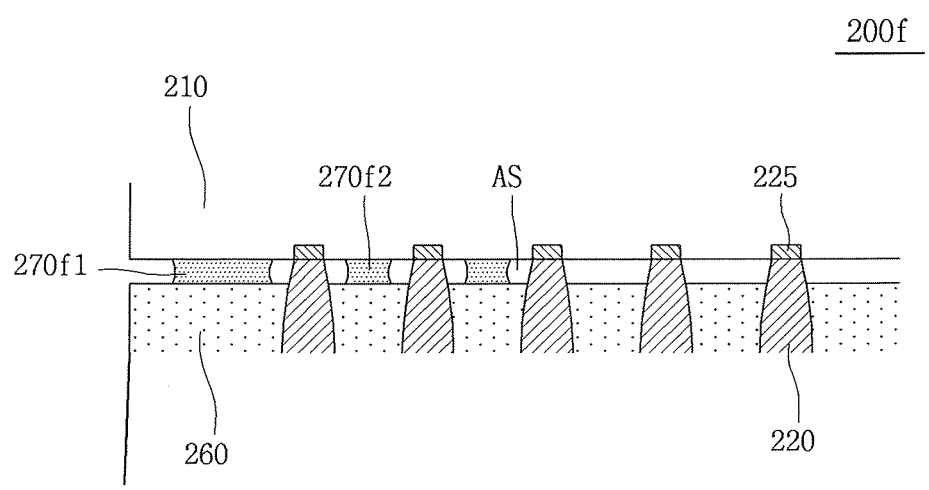

Referring to FIG. 17F, the package stack structure 200f according to an exemplary embodiment of the inventive concept may include fastening elements 270f1 and 270f2. The fastening elements 270f1 and 270f2 may include an outer fastening element 270f1 and an inner fastening element 270f2. Each of the outer and inner fastening elements 270f1 and 270f2 may cover or surround side surfaces of at least one via plug 220. The outer and inner fastening elements 270f1 and 270f2 may not contact the via plug 220. Further, left and right ends of each of the outer and inner fastening elements 270f1 and 270f2 may be variously combined with any of the fastening elements according to other exemplary embodiments.

Referring to FIGS. 17A to 17F, air spaces AS may exist between the package substrate 210 and the molding compound 260, between the via plugs 220, between the fastening elements 270a to 270f2 and the via plugs 220, and/or on a side surface of the fastening elements 270a to 270f2.

Figure 17G:
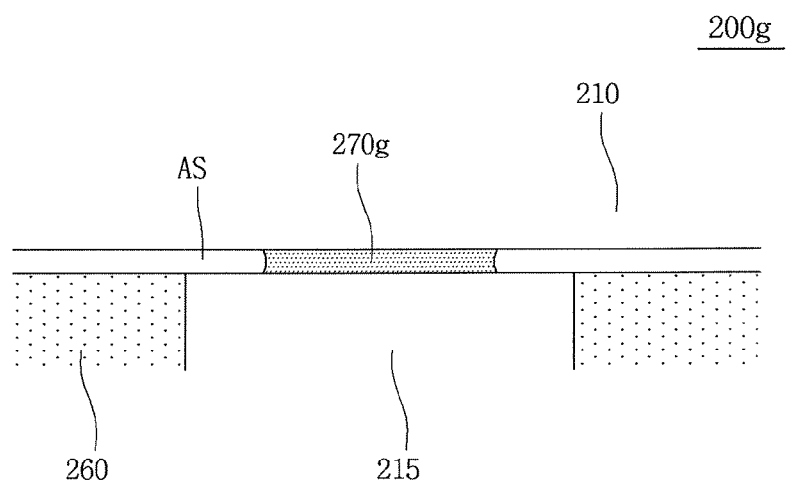
Figure 17H:
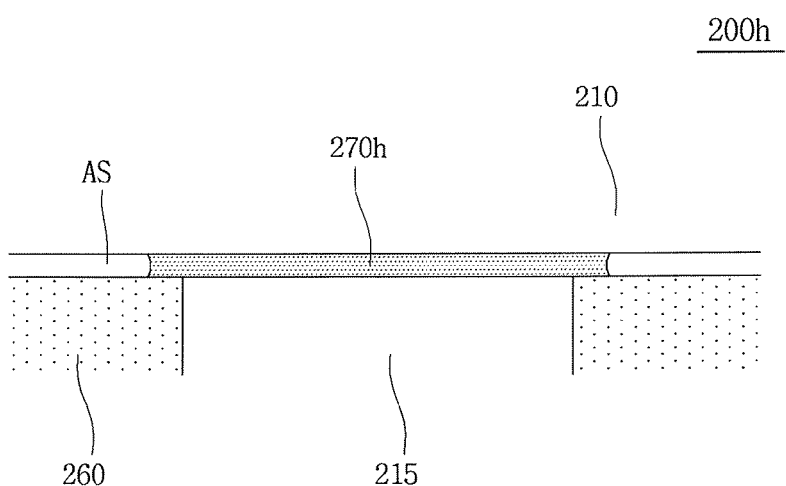
Figure 17I:
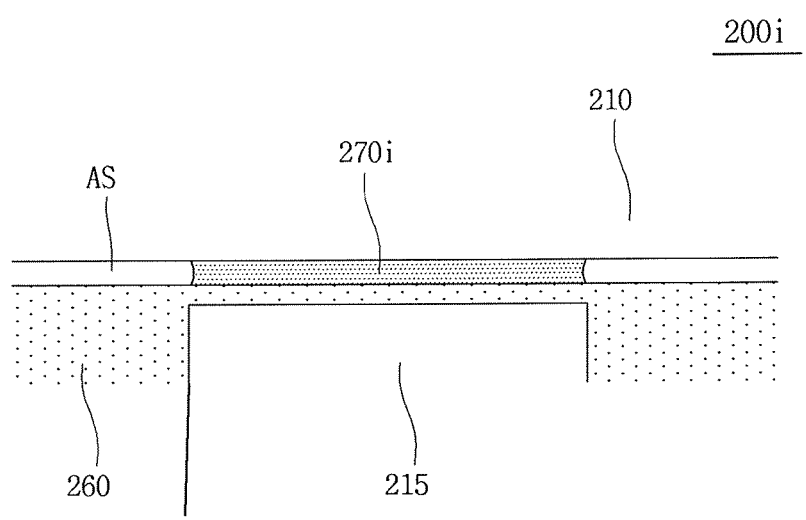

FIGS. 17G to 17I illustrate the central fastening elements 270g to 270i in detail.

Referring to FIG. 17G, the package stack structure 200g according to an exemplary embodiment of the inventive concept may include a lower semiconductor chip 215 surrounded by the lower molding compound 260, the upper package substrate 210, and the central fastening element 270g formed between the lower semiconductor chip 215 and the upper package substrate 210. The central fastening element 270g may be partially formed on a top surface of the lower semiconductor chip 215. An air space AS may be formed between the lower semiconductor chip 215 and the upper package substrate 210, and between the lower molding compound 260 and the upper package substrate 210.

Referring to FIG. 17H, the package stack structure 200h according to an exemplary embodiment of the inventive concept may include a lower semiconductor chip 215 surrounded by a lower molding compound 260h, an upper package substrate 210, and a central fastening element 270h formed between the lower semiconductor chip 215 and the upper package substrate 210. The central fastening element 270h may completely cover a top surface of the lower semiconductor 215. The central fastening element 270h may have a portion disposed between the lower molding compound 260h and the upper package substrate 210. An air space AS may be formed only between the lower molding compound 260 and the upper package substrate 210.

Referring to FIG. 17I, the package stack structure 200i according to an exemplary embodiment of the inventive concept may include the lower semiconductor chip 215 surrounded by the lower molding compound 260, the upper package substrate 210, and the central fastening element 270 formed in a portion between the lower semiconductor chip 215 and the upper package substrate 210. The central fastening element 270i may not be aligned with the top surface of the lower semiconductor chip 215. The central fastening element 170i may be disposed between the lower molding compound 260 and the upper package substrate 210. An air space AS may be formed only between the lower molding compound 260 and the upper package substrate 210.

FIGS. 18A to 18I are longitudinal cross-sectional views or side views schematically illustrating package stack structures according exemplary embodiments of the inventive concept. It can be understood that these embodiments may correspond to exemplary embodiments capable of being applied to package stack structures according to other exemplary embodiments.

Referring to FIGS. 18A to 18I, each of package stack structures 300a to 300i according to exemplary embodiments of the inventive concept may include a lower package substrate 310L and an upper package substrate 310U, and each of fastening elements 370a to 370i formed between the lower and upper package substrates 310L and 310U. The lower package substrate 310L may include lower via plug lands 325L, and the upper package substrate 310U may include upper via plug lands 325U. Via plugs 320 may be formed between the lower and upper package substrates 310L and 310U. The via plugs 320 may electrically and/or physically connect the lower and upper via plug lands 325L and 325U.

The fastening elements 370a to 270i may correspond to the fastening elements 170a to 170p and/or central fastening elements 170a' to 170p' illustrated in FIGS. 1A to 16B, respectively.

Figure 18A:
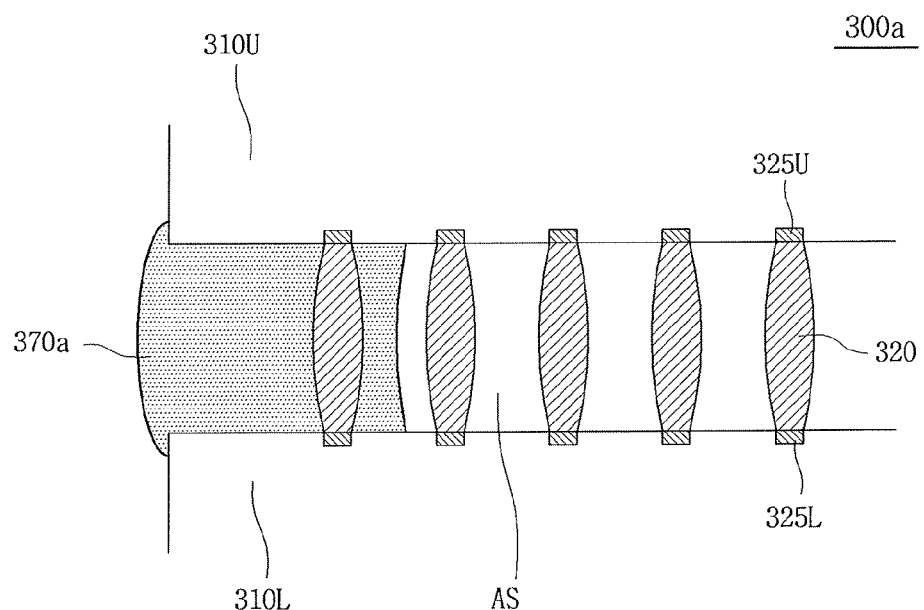

Referring to FIG. 18A, the fastening element 370a of the package stack structure 300a according to an exemplary embodiment of the inventive concept may include a first end portion disposed between the lower and upper package substrates 310L and 310U and extending to and protruding from side surfaces of the lower and upper package substrates 310L and 310U, and a second end portion located between the via plugs 320. The fastening element 270a may cover or surround side surfaces of the at least one via plug 320.

Figure 18B:
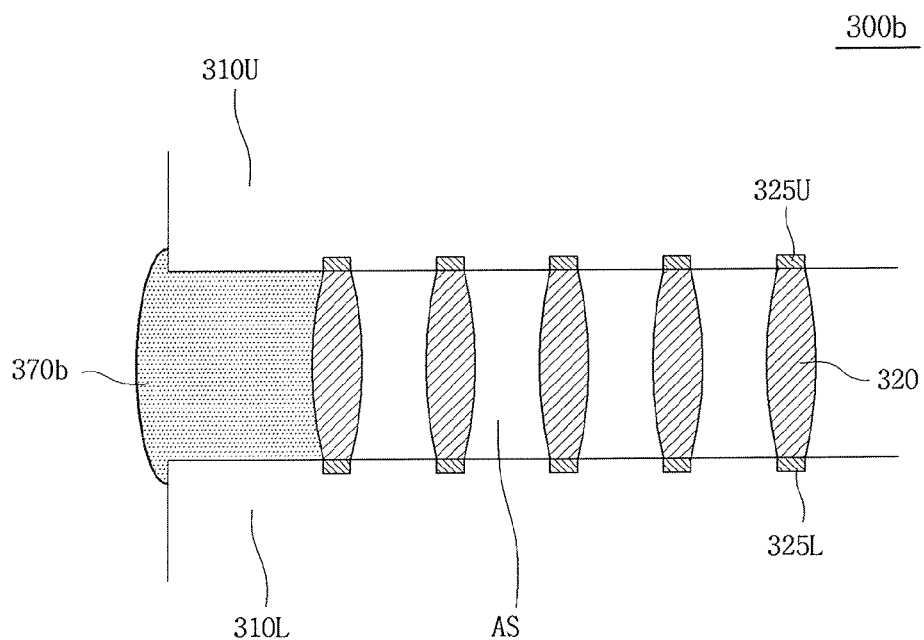
Figure 18C:
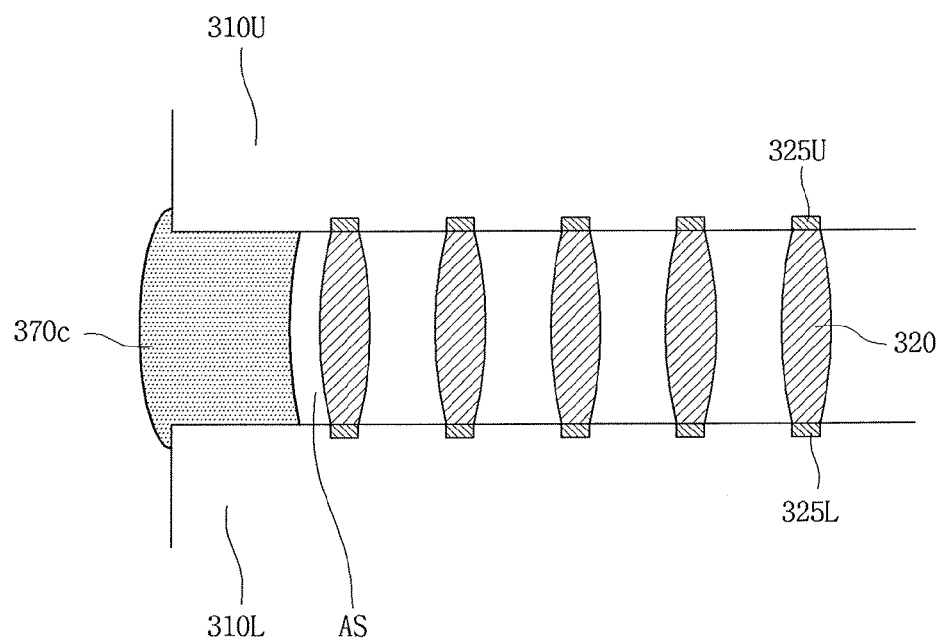

Referring to FIG. 18B, the fastening element 370b of the package stack structure 300b according to an exemplary embodiment of the inventive concept may include a first end portion extending to and protruding from side surfaces of the lower and upper package substrates 310L and 310U, and a second end portion in complete contact with side surfaces of the at least one via plug 320. The at least one via plug 320 may be the via plug disposed closer to the side surfaces of the lower and upper package substrates 310L and 310U.

Referring to 18C, the fastening element 370c of the package stack structure 300c according to an exemplary embodiment of the inventive concept may include a first end portion extending to and protruding from side surfaces of the lower and upper package substrates 310L and 310U, and not in contact with side surfaces of the via plugs 320.

Figure 18D:
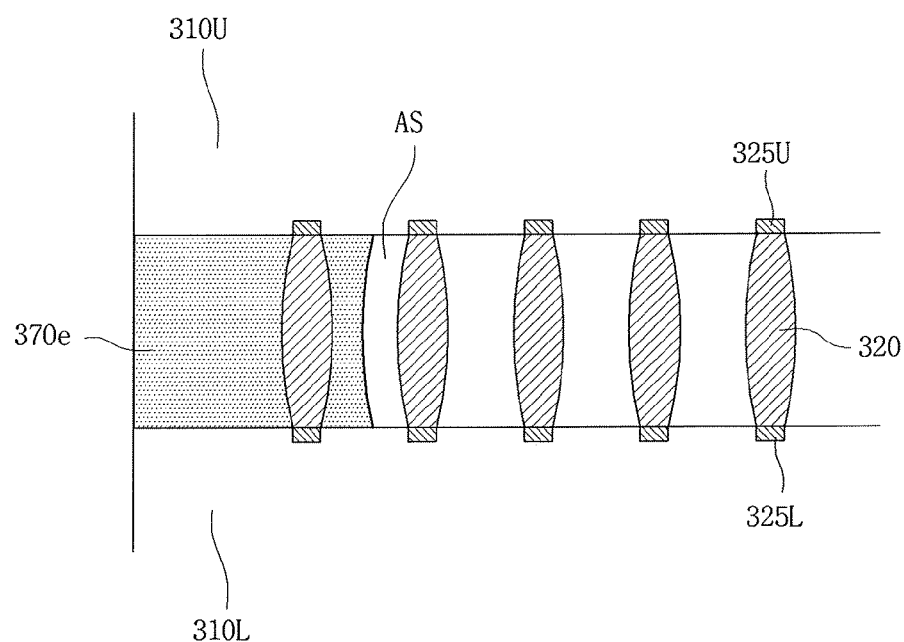

Referring to FIG. 18D, the fastening element 370d of the package stack structure 300d according to exemplary embodiment of the inventive concept may include a first end portion aligned with side surfaces of the lower and upper package substrates 310L and 3100. That is, the first end portion of the upper fastening element 370d may include a side surface aligned with the side surfaces of the lower package substrate 310L and/or the upper package substrate 310U.

Figure 18E:
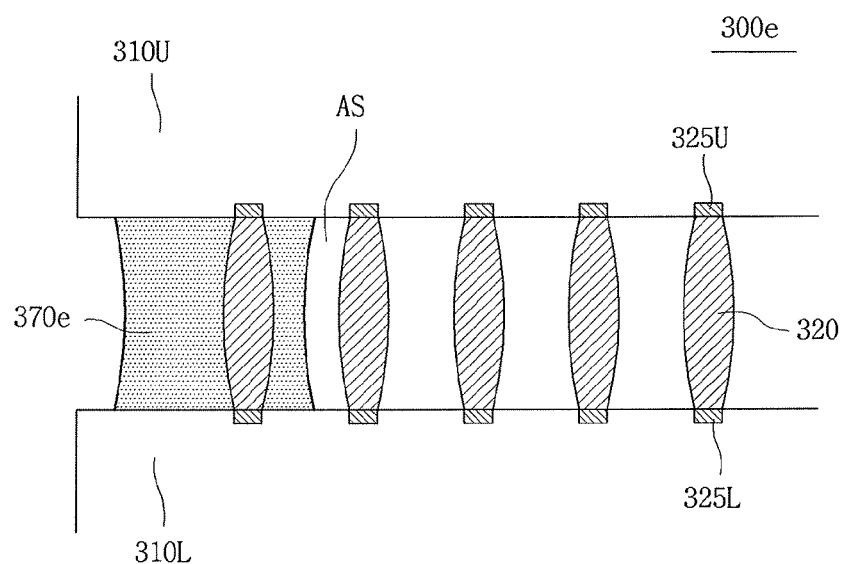

Referring to FIG. 18E, the fastening element 370e of the package stack structure 300e according to an exemplary embodiment of the inventive concept may include a first end portion not extending to outer areas of the side surfaces of the lower and upper package substrates 310L and 310U. That is, the first end portion of the fastening element 370e may be located in inner areas of the side surfaces of the lower package substrate 310L and/or the upper package substrate 310U.

Figure 18F:
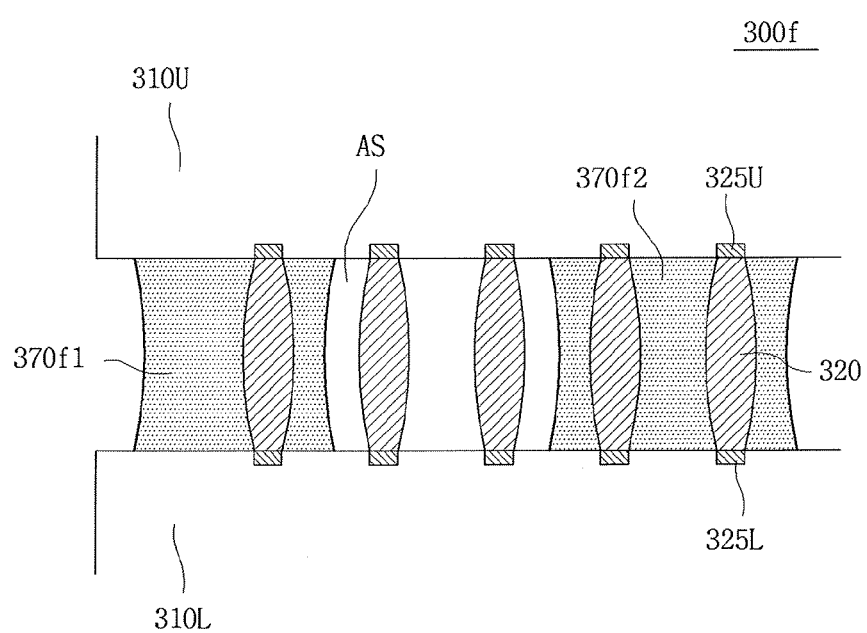

Referring to FIG. 18F, the fastening elements 370f1 and 370f2 of the package stack structure 300f according to an exemplary embodiment of the inventive concept may include an outer fastening element 370f1 and an inner fastening element 370f2. The outer and inner elements 370f1 and 370f2 may cover or surround side surfaces of at least one via plug 320, respectively. Further, left and right ends of each of the outer and inner fastening elements 370f1 and 370f2 may be variously combined with any of the fastening elements according to other exemplary embodiments.

Referring to FIGS. 18A to 18F, air spaces AS may exist between the lower and upper package substrates 310L and 310U, between the via plugs 320, between the fastening elements 370a to 370f2 and the via plugs 320, and/or on side surfaces of the fastening elements 370a to 370f2.

Figure 18G:
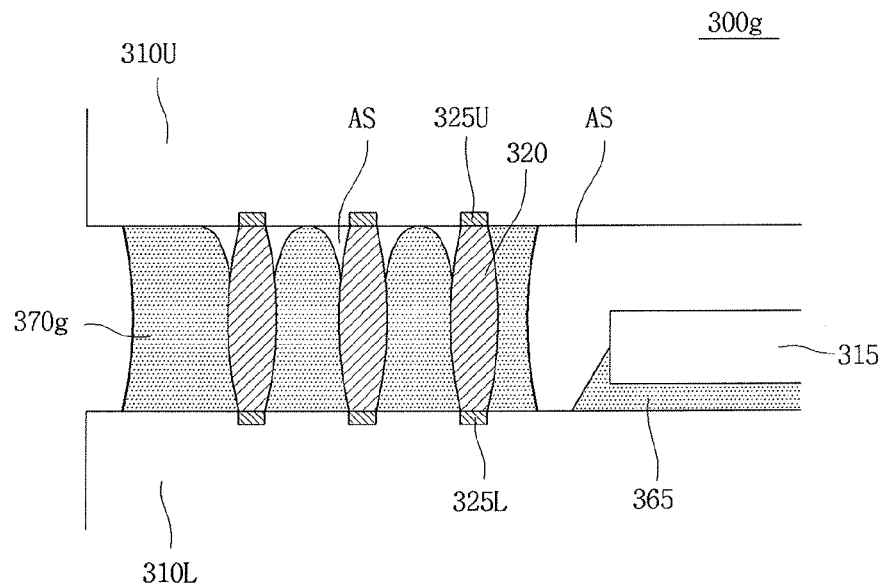

Referring to FIG. 18G, the fastening element 370g of the package stack structure 300g according to an exemplary embodiment of the inventive concept may partially or completely cover side surfaces of the via plugs 320. A semiconductor chip 315 may be disposed between the lower and upper package substrates 310L and 310U. A top surface and side surfaces of the semiconductor chip 315 may be partially or completely exposed. An under-fill material 365 may be formed between the lower package substrate 310L and the semiconductor chip 315. Shapes of left and right ends of the fastening element 370g may be similar to shapes of the fastening elements of other exemplary embodiments. Air spaces AS may exist between the lower and upper package substrates 310L and 310U, and on a top surface or around side surfaces of the semiconductor chip 315, a portion between the fastening element 370g and the via plugs 320, and/or side surfaces of the fastening elements 370a-370f2.

The under-fill material 365 may not contact the fastening element 370g. The fastening element 370g may have a portion not contact the via plugs 320 to form a space between the portion and a surface of the via plugs 320. The surface of the via plugs 320 may be a surface close to the upper package substrate 310L.

Figure 18H:
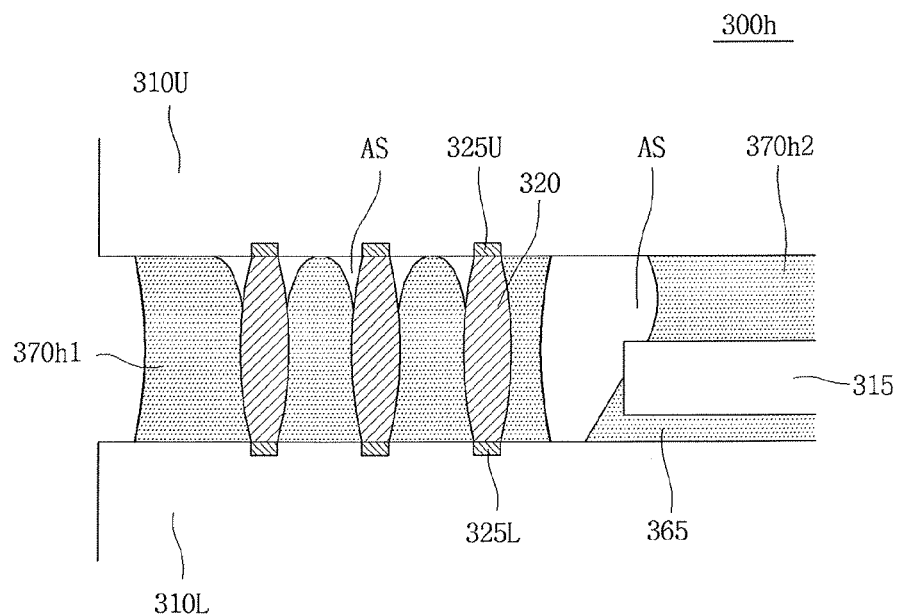

Referring to FIG. 18H, a package stack structure 300h having a fastening element 370h1 according to an exemplary embodiment of the inventive concept may be similar to the package stack structure 300g of FIG. 18G, but further include a central fastening element 370h2. The central fastening element 370h2 may be formed between a lower semiconductor chip 315 and the upper package substrate 310U. The central fastening element 370h2 may be partially formed on a top surface of the semiconductor chip 315. An air space AS may exist between the semiconductor chip 315 and the upper package substrate 310U.

Figure 18I:
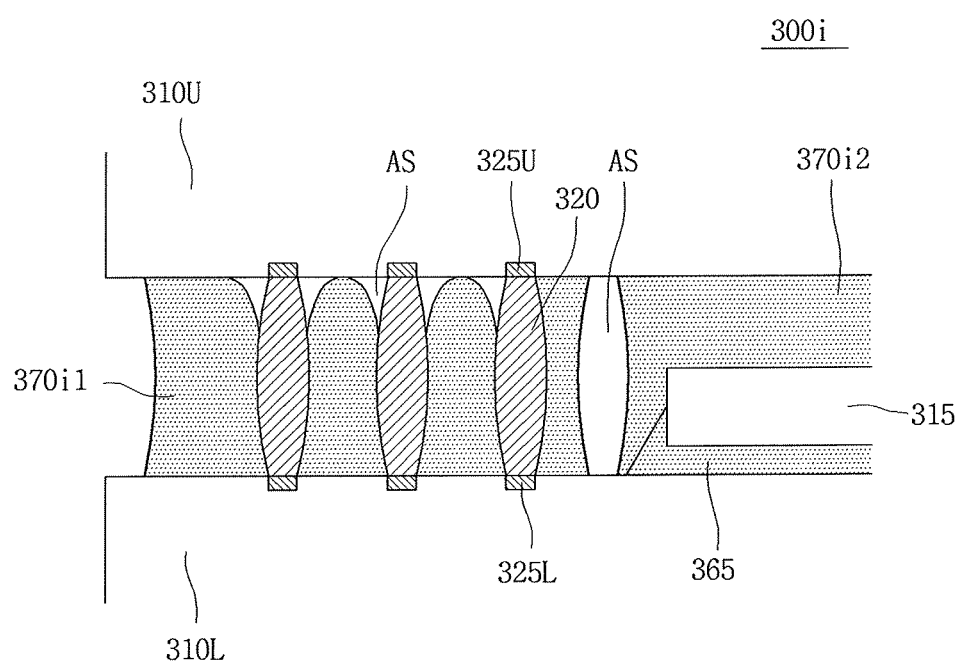

Referring to FIG. 18i, a package stack structure 300i having a fastening element 370i1 according to an exemplary embodiment of the inventive concept may be similar to the package stack structure 300h of FIG. 18H, but include a central fastening element 370i2 covering or surrounding the semiconductor chip 315.

It is readily apparent to those of ordinary skill in the art that shapes of the fastening elements according to exemplary embodiments of the inventive concept illustrated in FIGS. 17A to 18I may be variously combined and applied with each other based on the foregoing drawings and detailed descriptions.

FIGS. 19A to 19K are longitudinal cross-sectional views or plan views schematically illustrating package stack structures according to exemplary embodiments of the inventive concept. The package stack structures according to these embodiments of the inventive concept can be applied to the package stack structures according to other exemplary embodiments.

Referring to FIGS. 19A to 19K, package stack structures 400a to 400k according to an exemplary embodiments of the inventive concept may include a semiconductor chip 415 on a lower structure 410, via plugs 420, and fastening elements 470a to 470k having various shapes. The lower structure 410 may be the lower package substrates or the lower molding compounds illustrated in other exemplary embodiments. The fastening elements 470a to 470k may correspond to the fastening elements 170a to 170p and/or central fastening elements 170a' to 170p' illustrated in FIGS. 1A to 16B, respectively.

Figure 19A:
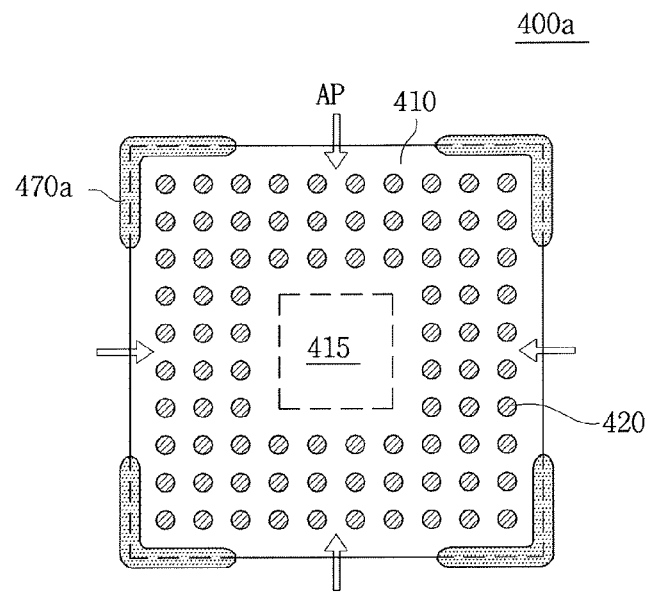
FIGS. 19A to 19K are longitudinal cross-sectional views or plan views schematically illustrating package stack structures according to exemplary embodiments of the inventive concept.

Referring to FIG. 19A, the package stack structure 400a according to an exemplary embodiment of the inventive concept may include a fastening element 470a formed on at least one corner portion of the lower structure 410. The corner portions may include corners and/or corner edges. The fastening element 470a may be formed on four corner portions as illustrated in FIG. 19A. The fastening element 470a may be formed along an edge portion of the lower structure 410, and the edge portion is disposed to surround an area in which the via plugs 420 are disposed. The fastening element 470a may extend and/or protrude to outsides of the lower structure 410. The fastening element 470a may not be in contact with the via plugs 420. An air path AP may be formed between the fastening elements 470a. The air path AP may correspond to the air space AS communicating with outer areas of the package stack structure 400a. As described above, heat radiation performance of the package stack structure 400a may be improved by air passing through the air path AP.

Figure 19B:
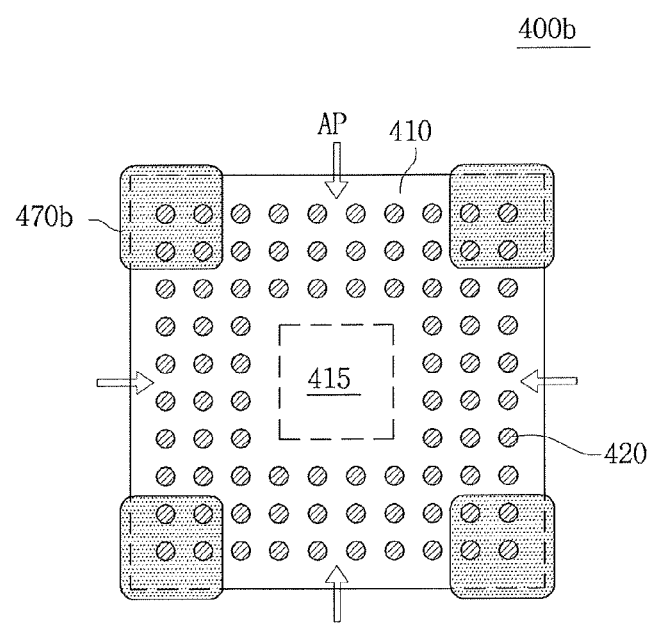

Referring to FIG. 19B, the package stack structure 400b according to an exemplary embodiment of the inventive concept may include a fastening element 470b formed on at least one corner portion of the lower structure 410 and in contact with the via plugs 420. The fastening element 470b may surround side surfaces of at least one via plug 420. Air paths AP may be formed between the fastening elements 470b.

Figure 19C:
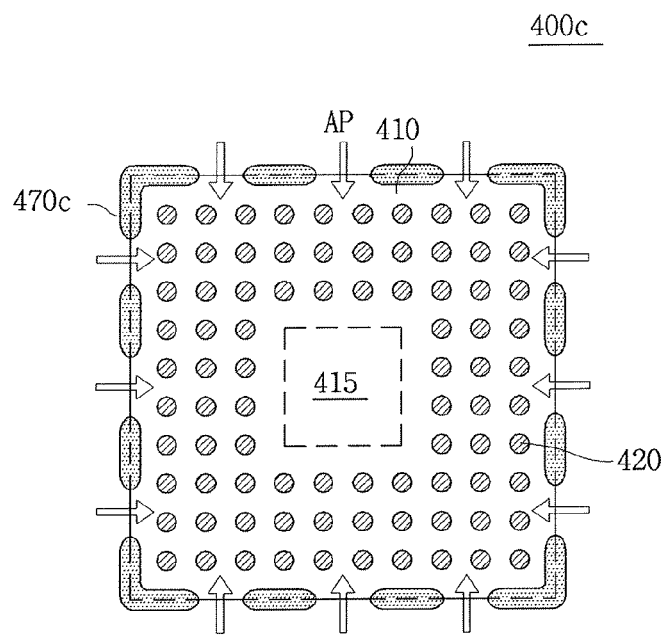

Referring to FIG. 19C, the package stack structure 400c according to an exemplary embodiment of the inventive concept may include a fastening element 470c formed around at least one corner portion of the lower structure 410 and at least one edge portion. The fastening element 470c may include a plurality of sub-fastening elements to be formed along an edge portion of the lower structure 410 and to be spaced apart from one another. The edge portion of the lower structure 410 may be disposed to surround an area in which the via plugs 420 are disposed. Air paths AP may be formed between the fastening elements 470c.

Figure 19D:
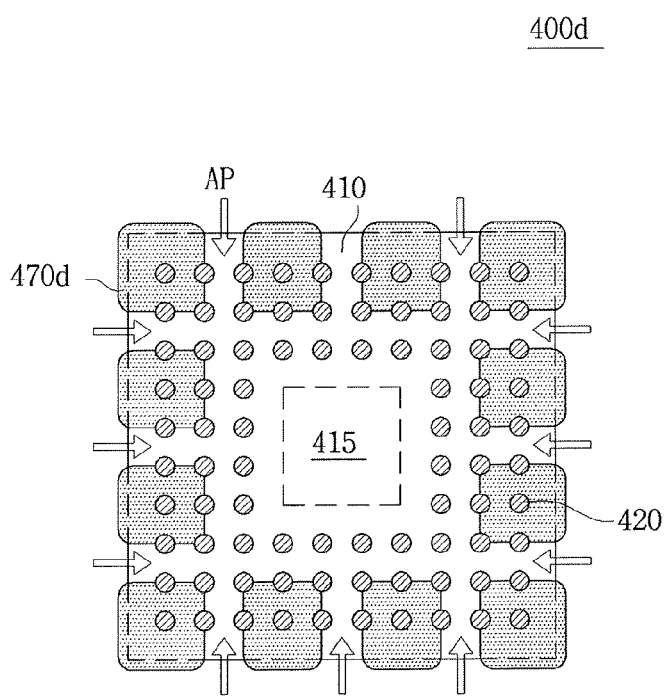

Referring to FIG. 19D, the package stack structure 400d according to an exemplary embodiment of the inventive concept may include a fastening element 470d surrounding and/or in contact with side surfaces of at least one via plug 420. Air paths AP may be formed between the fastening elements 470d.

Figure 19E:
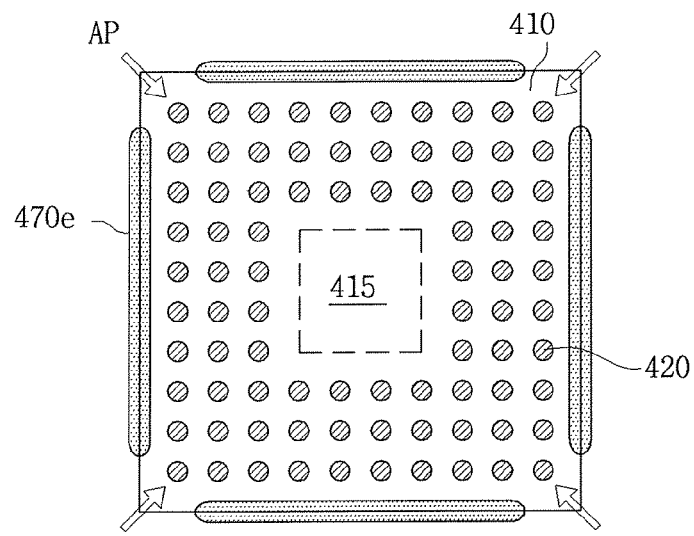

Referring to FIG. 19E, the package stack structure 400e according to an exemplary embodiment of the inventive concept may include a fastening element 470e formed around at least one edge portion of the lower structure 410. In this case, the fastening element 470e may not be formed around at least one corner portion of the lower structure 410. The fastening element 470e may have sub-fastening elements disposed along or around at least one edge portion of the lower structure 410. In other exemplary embodiments, only one fastening element 470e may be formed around one side edge portion. Air paths AP may be formed between the fastening elements 470e.

Figure 19F:
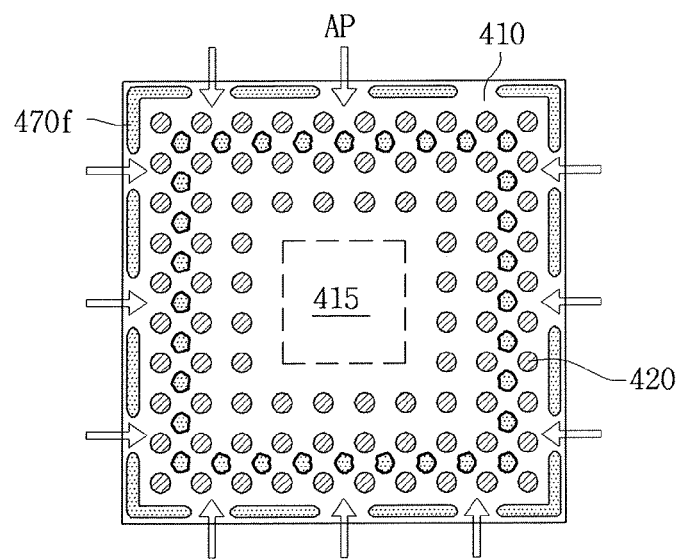

Referring to FIG. 19F, the package stack structure 400f according to an exemplary embodiment of the inventive concept may include a fastening element 470f formed in a bar shape and/or an island shape in inner areas of the lower structure 410. The fastening element 470f may not protrude from an edge portion of the lower structure 410. The fastening element 470f may not be in contact with side surfaces of the via plugs 420. Air paths AP may be formed between the fastening elements 470f.

Figure 19G:
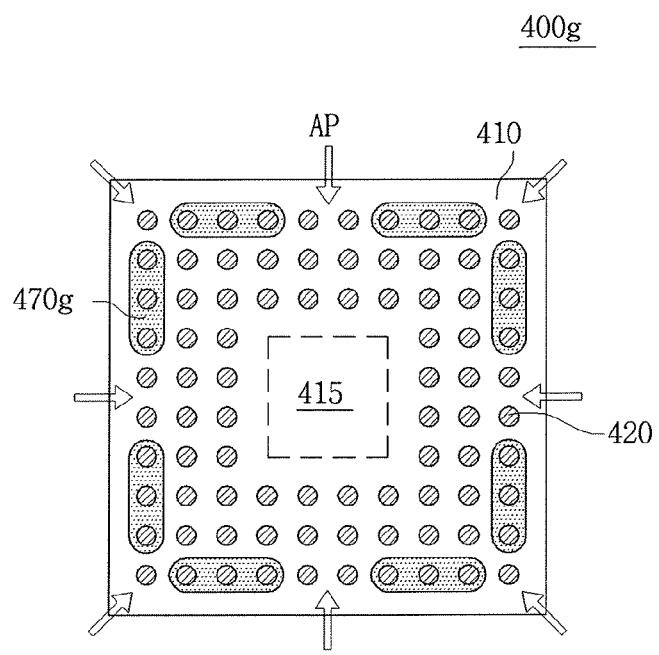

Referring to FIG. 19G, the package stack structure 400g according to an exemplary embodiment of the inventive concept may include a fastening element 470g formed in a bar shape and/or an island shape surrounding side surfaces of at least one via plug 420 in inner areas of the lower structure 410. Air paths AP may be formed between the fastening elements 470g.

Figure 19H:
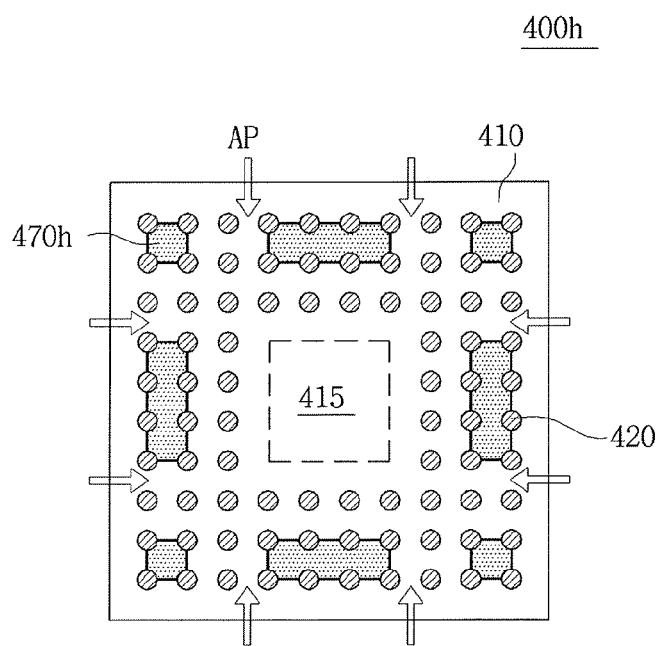

Referring to FIG. 19H, the package stack structure 400h according to an exemplary embodiment of the inventive concept may include a fastening element 470h formed in a bridge type in inner areas of the lower structure 410. The fastening element 470h may be disposed between adjacent via plugs 420 as illustrated in FIG. 19H. Air paths AP may be formed between the fastening elements 470h.

The fastening elements 470a to 470h of FIGS. 19A to 19H according to exemplary embodiments of the inventive concept may have end portions extending to outer areas, aligned with edges, or formed in inner areas of the lower structure 410. Although the embodiments of FIGS. 19A to 19H may be different from other exemplary embodiments of FIGS. 19I to 19K, it is understood that these embodiments of FIGS. 19I to 19K can be modified or applied to other exemplary embodiments.

Figure 19I:
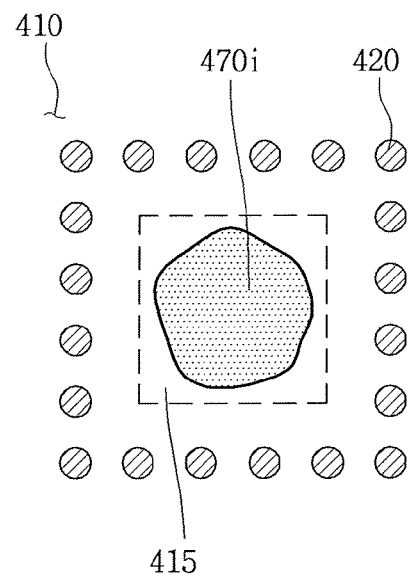
Figure 19J:
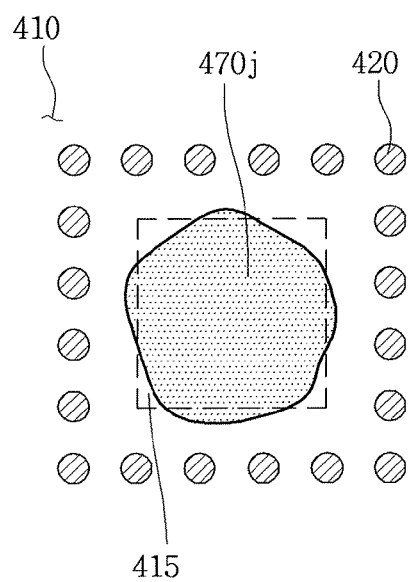
Figure 19K:
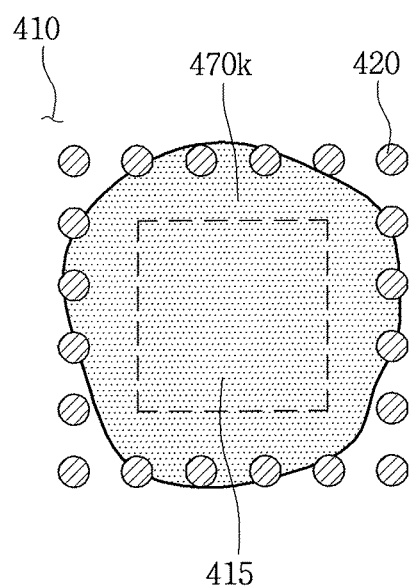

FIGS. 19I to 19K are longitudinal cross-sectional views or plan views schematically illustrating package stack structures according to exemplary embodiments of the inventive concept.

Referring to FIG. 19I, the package stack structure 400i according to an exemplary embodiment of the inventive concept may include a central fastening element 470i formed on a top surface of the lower semiconductor chip 415. The central fastening element 470i may have an occupying area smaller than the top surface area of the lower semiconductor chip 415. The central fastening element 470i may be in direct contact with or spaced apart from the lower semiconductor chip 415. That is, the central fastening element 470i may partially cover the top surface of the lower semiconductor chip 415 or be aligned with a side surface of the lower semiconductor chip 415. The central fastening element 470I may not have the same shape as the lower semiconductor chip 415 as illustrated in FIG. 19I.

Referring to FIG. 19J, the package stack structure 400j according to an exemplary embodiment of the inventive concept may include a central fastening element 470j formed to partially overlap portions of a top surface of the lower semiconductor chip 415 on the top surface of the lower semiconductor chip 415. The central fastening element 470j may be in direct contact with or spaced apart from the lower semiconductor chip 415. That is, the central fastening element 470j may cover a portion of the top surface and the outer surface of the lower semiconductor chip 415 as illustrated in FIG. 19J.

Referring to FIG. 19K, the package stack structure 400k according to an exemplary embodiment of the inventive concept may include a central fastening element 470k completely covering a top surface of the semiconductor chip 415.

The central fastening elements 470a to 470k according to exemplary embodiments of the inventive concept may be referable and compatible to one another. Although specific features in shapes of the central fastening elements 470a to 470k may not be specifically described, it is understood that descriptions of any one of the example embodiments will be can be understood such that a single embodiment can be used in the package stack structure or a combination of the embodiments can be modified or combined to be installed in the package stack structure.

Hereinafter, methods of fabricating various semiconductor stack structures will be described.

FIGS. 20A to 23D are schematic views illustrating methods of fabricating package structures, package stack structures and a method of mounting the package stack structures on a system board according to exemplary embodiments of the inventive concept. The package structure may be a package structure illustrated in FIGS. 1A to 3B, for example.

Figure 20A:
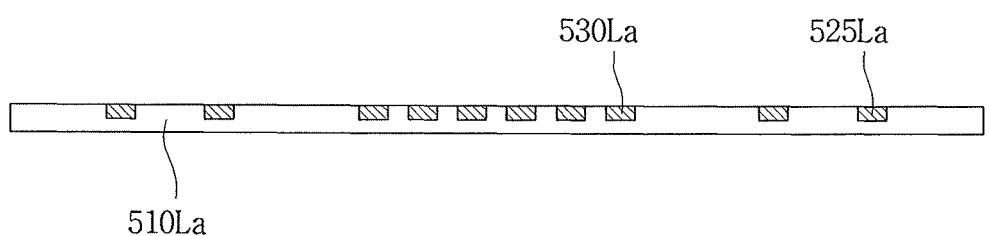
FIGS. 20A to 23D are schematic views illustrating methods of fabricating package stack structures and a method of mounting the package stack structures on a system board according to exemplary embodiments of the inventive concept.

Referring to FIG. 20A, a lower package substrate 510La may be prepared. The lower package substrate 510La may include lower via plug lands 525La and lower bonder lands 530La on a first surface. The lower package substrate 510La may be a PCB and/or include an insulating material such as ceramic, glass, and/or plastic. The insulation material may not cover exposed portions of the lower via plug lands 525La and lower bonder lands 530La for electrical connection with other elements thereof. The lower package substrate 510La may include a conductive material such as a metal interconnection and/or a metal pillar. The lower package substrate 510La may be formed in a multilayer structure.

The lower via plug lands 525La and the lower bonder lands 530La may be formed in a box or mesa shape by a plating method, a stencil method, and/or a screen printing method. The lower via plug lands 525La and the lower bonder lands 530La may include copper, nickel, gold, silver, indium, aluminum, tin, solder material and/or the other metallic materials.

Figure 20B:
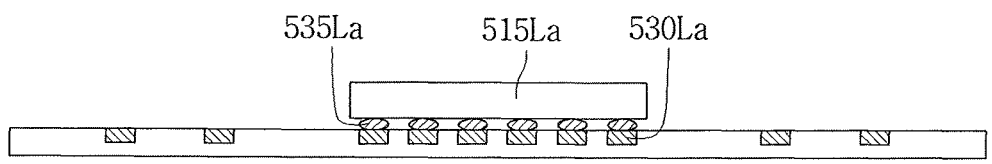

Referring to FIG. 20B, a lower semiconductor chip 515La may be mounted on the first surface of the lower package substrate 510La. The lower semiconductor chip 515La may be electrically and/or physically connected to the lower bonder lands 530La or the lower package substrate 510La through lower bonders 535La. The lower bonders 535La may include a solder material. The lower semiconductor chip 515La may be a logic chip and have a flip chip bonding structure.

Figure 20C:
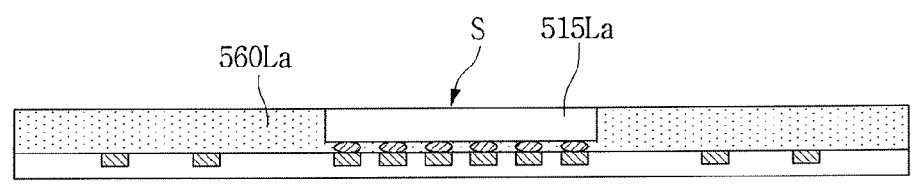

Referring to FIG. 20C, a lower molding compound 560La may be formed. The lower molding compound 560La may be formed by a dispensing method or an injecting method. The lower molding compound 560La may cover a portion of the first surface and surround side surfaces of the lower package substrate 510L. The lower molding compound 560La may surround side surfaces of the lower bonders 535La. The lower molding compound 560La may partially or completely expose a top surface S of the lower semiconductor chip 515La. In other embodiments, the lower molding compound 560La may completely cover the top surface S of the lower semiconductor chip 515La.

An under-fill material may be formed between the lower package substrate 510La and the lower semiconductor chip 515La. In the exemplary embodiment, a process of forming an under-fill material may be performed prior to forming the lower molding compound 560La.

Figure 20D:
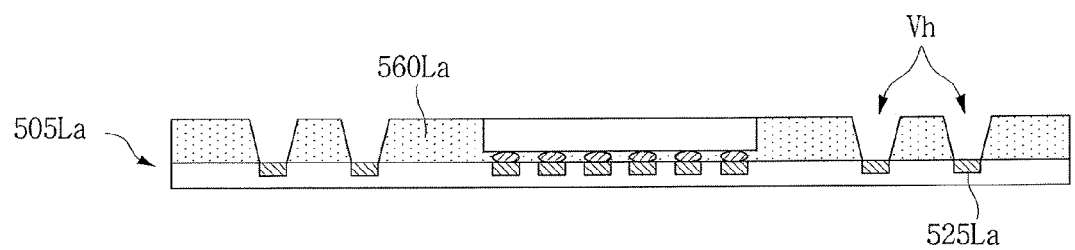

Referring to FIG. 20D, via holes Vh may be formed to expose the lower via plug lands 525La. The via holes may be formed by vertically penetrating the lower molding compound 560La. The via holes Vh may be formed by a laser drilling method. Thus, by the forgoing processes, a lower package 505La may be completed.

Figure 20E:
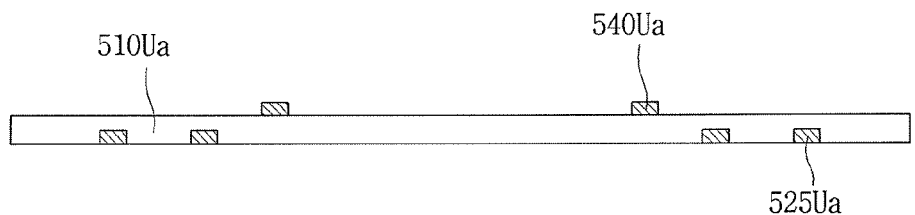

Referring to FIG. 20E, an upper package substrate 510Ua may be prepared. The upper package substrate 510Ua may include upper via plug lands 525Ua on a lower surface thereof and upper bond fingers 540Ua on an upper surface thereof. The upper package substrate 510Ua may be a PCB and/or include an insulating material such as ceramic, glass, and/or plastic. The upper package substrate 510Ua may include a conductive material such as a metal interconnection and/or a metal pillar. The upper package substrate 510Ua may be formed in plural numbers.

The upper via plug lands 525Ua may be similar to the lower via plug lands 525La of other exemplary embodiments. The upper via plug lands 525Ua and/or the upper bond fingers 540Ua may include copper, nickel, gold, silver, indium, aluminum, tin, solder material and/or the other metallic materials.

Figure 20F:
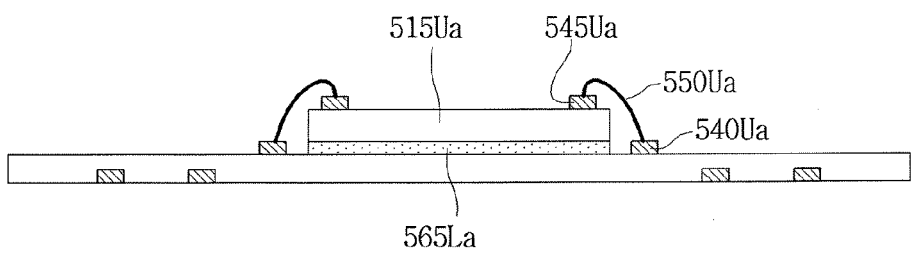

Referring to FIG. 20F, an upper under-fill material, such as a die attach film (DAF), may be formed on the upper package substrate 510Ua. And then, an upper semiconductor chip 515Ua may be mounted on the DAF. The upper semiconductor chip 515Ua may include upper chip pads 545Ua on a surface thereof. Then, upper bonding wires 550Ua electrically connecting the upper chip pads 545Ua to the upper bond fingers 540Ua may be formed by a wire bonding process.

Figure 20G:
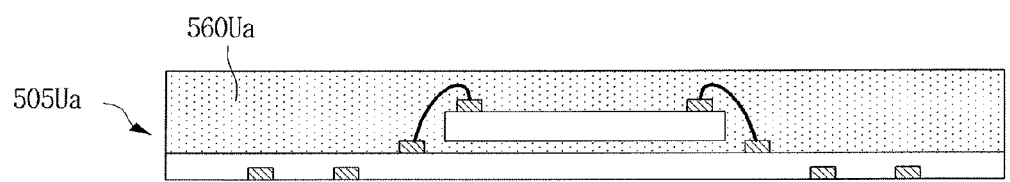

Referring to FIG. 20G, an upper molding compound 560Ua may be formed. The upper molding compound 560Ua may be formed by a dispensing method or an injecting method. Then, an upper package 505Ua may be completed.

Figure 20H:
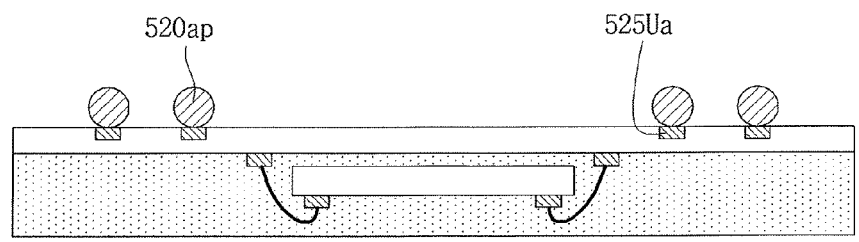
Figure 20I:
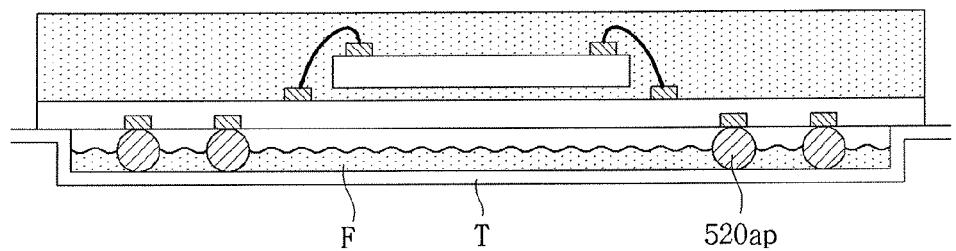

Referring to FIG. 20H, preliminary via plugs 520$ap$ may be formed. The preliminary via plugs 520$ap$ may be electrically and/or physically connected to the upper via plug lands 525Ua. The preliminary via plugs 520$ap$ may include a solder material. For example, the preliminary via plugs 520$ap$ may be formed by a soldering process.

Referring to FIG. 20$i$, a dipping process for smearing flux on the preliminary via plugs 520$ap$ by dipping the preliminary via plugs 520$ap$ into the flux in a tank T may be performed.

Figure 20J:
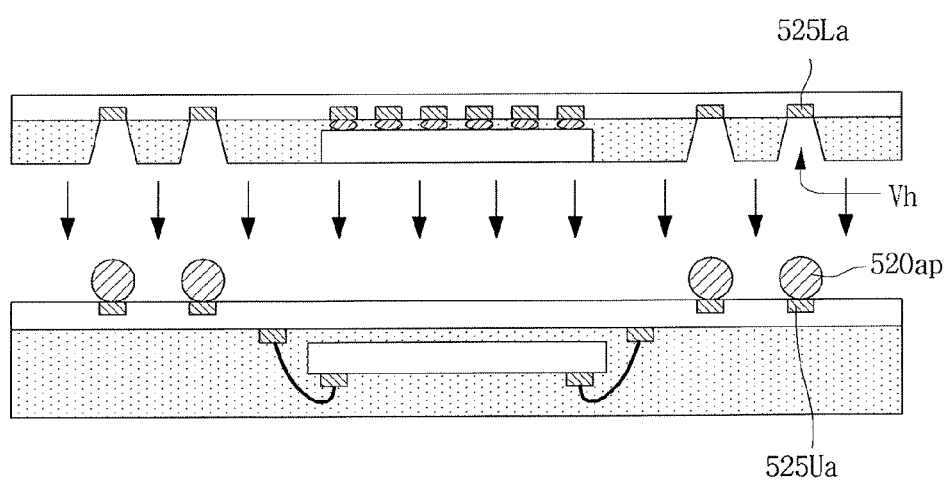

Referring to FIG. 20J, the lower and upper packages 505La and 505Ua may be combined. The preliminary plugs 520$ap$ may be aligned within the via holes Vh. Then, the lower and upper via plug lands 525La and 525Ua may be electrically connected to each other by a solder reflow process. That is, the via plugs 520$a$ illustrated in FIG. 20K may be formed. The solder reflow process may include heating the preliminary via plugs 520$ap$ at a temperature between 200° C. and 250° C. for about 5 to 10 minutes.

Figure 20K:
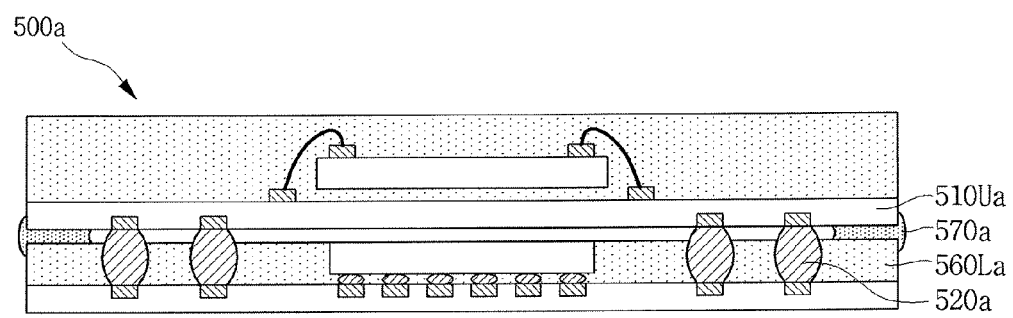

Referring FIG. 20K, a fastening element 570$a$ may be formed between the lower molding compound 560La and the upper package substrate 510Ua. Forming the fastening element 570$a$ may include injecting a fastening material between the lower molding compound 560La and the upper package substrate 510Ua, and heating the fastening material at a temperature between 100° C. and 150° C. for several minutes to several hours. That is, comparing to the solder reflow process for forming the via plugs 520$a$, the process for forming the fastening element 570$a$ may include heating the fastening material at a lower temperature and for a longer period of time than those of the solder reflow process.

The fastening element 570$a$ may include a thermosetting material such as an epoxy resin, amino resin, phenol resin and/or polyester resin. Further, the fastening element 570$a$ may include particles for improving thermal conductivity. For example, the particles may include an inorganic material such as silica or ceramic, an organic material, and/or metallic materials. Furthermore, the particles may include insulating particles being plated with metallic materials, or metallic materials being coated by insulating materials. In other exemplary embodiments, the fastening element 570$a$ may include various fillers for allowing viscosity or flowability and/or various additives for improving adhesiveness or solidity.

Although FIG. 20K illustrates the fastening element 570$a$ not in contact with the via plugs 520$a$, it is possible that the fastening element 570$a$ can be formed to be in contact with the via plugs 520$a$ or formed in various shapes according to other exemplary embodiments. For example, the fastening element 570$a$ may surround side surfaces of at least one via plug 520$a$. Then, the package stack structure 500$a$ according to exemplary embodiment of the inventive concept may be completed.

Figure 20L:
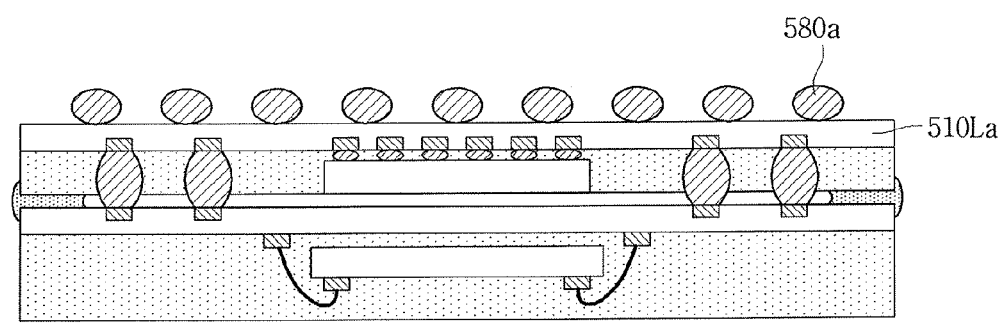

Referring to FIG. 20L, board solder balls 580$a$ may be formed on the lower package substrate 510La. In the drawing, lands for the board solder balls 580$a$ may be formed on the lower package substrate 510La. Although FIG. 20L dose not illustrate lands on which the board solder balls 580$a$ are formed and to which conductive material (line) of the lower package substrate 510La are connected, the lands are omitted for simplicity of the drawing in order to easily understand the inventive concept.

Figure 20M:
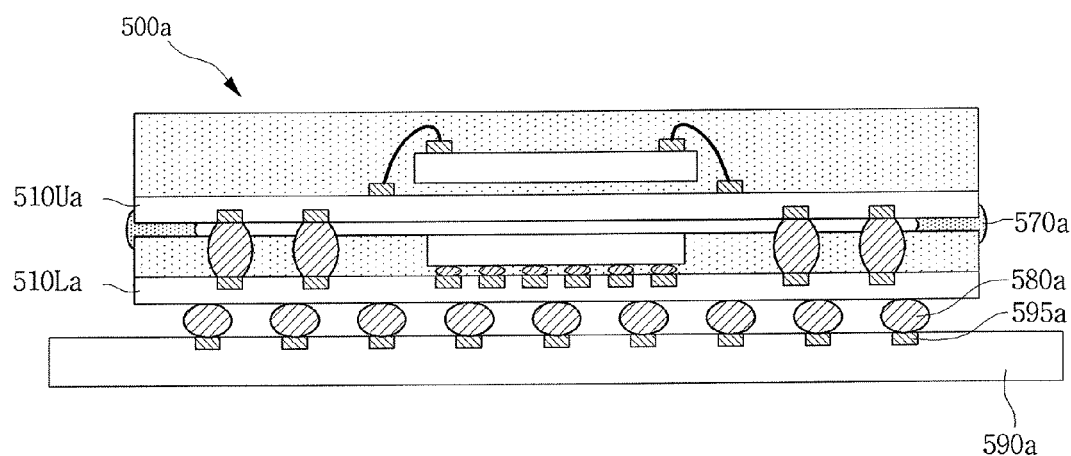

Referring to FIG. 20M, the package stack structure 500$a$ may be mounted on a system board 590. The system board 590$a$ may include board lands 595$a$. The package stack structure 500$a$ may be electrically and/or physically connected to the system board 590$a$ through board solder balls 580$a$ and the board lands 595$a$. During this process, a solder reflow process may be performed. For example, heating the solder balls 580$a$ at a temperature between 200° C. and 250° C. for several minutes may be performed. Compared to the process for forming the fastening element 570$a$, this process includes heating the solder balls 580$a$ at a higher temperature and for a shorter period of time than those of the process for forming the fastening element 570$a$.

In the process, the package stack structure 500$a$ having the fastening element 570$a$ may be protected from thermal transfer generated by the solder reflow process. For example, warpages and/or physical stresses of the lower package substrate 510La and/or the upper package substrate 510Ua caused by thermal transfer can be prevented. Then, an electronic system including the system board 595$a$ having the package stack structure 500$a$ mounted thereon may be fabricated.

Figure 21A:
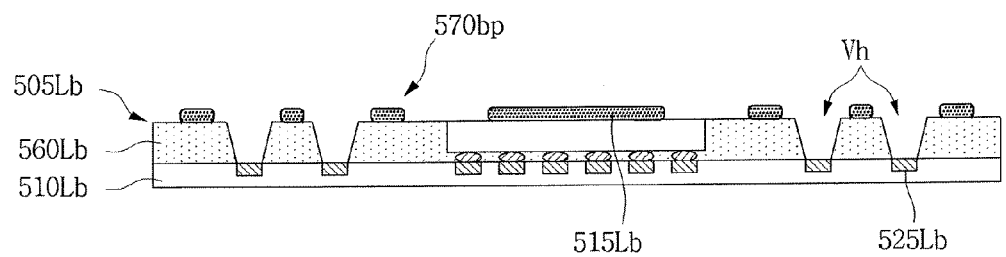
Figure 21B:
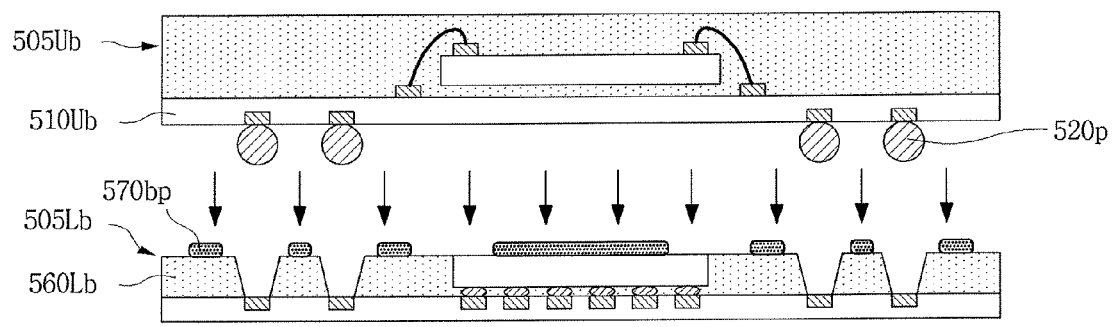
Figure 21C:
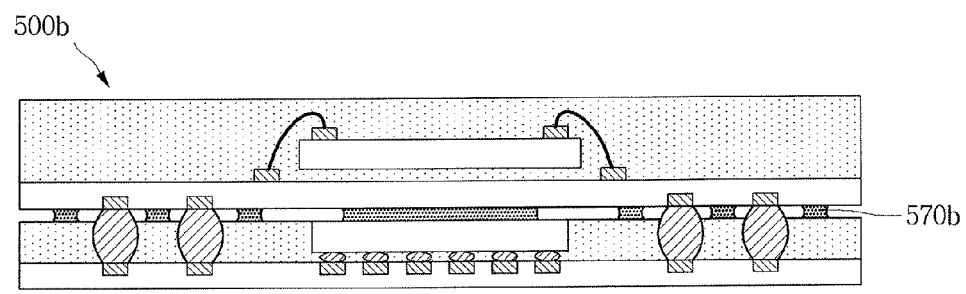

FIGS. 21A to 21C are schematic views illustrating methods of fabricating package structures and package stack structures according to an exemplary embodiment of the inventive concept. Firstly, referring to FIGS. 20A to 20D, a lower package 505Lb may be formed to include lower via plug lands 525Lb formed on a package substrate 510Lb and a lower molding compound 560Lb formed on the package substrate 510Lb.

Referring to FIG. 21A, via holes Vh may be formed by, for example, vertically penetrating the lower molding compound 560Lb, to expose a surface of the lower via plug lands 525Lb. Then, a preliminary fastening element 570$bp$ may be formed on the lower molding compound 560Lb. The preliminary fastening element 570$bp$ may be formed on outer areas and/or between the via holes Vh in a relatively small amount. The preliminary fastening element 570$bp$ may be formed in a bar shape and/or an island shape. The preliminary fastening element 570$bp$ may be provided on the lower semiconductor chip 515Lb. Although the central fastening elements can be formed as illustrated in FIG. 21A, the central fastening elements can be formed according to other exemplary embodiments of the inventive concept. Thus, the preliminary fastening element 570$bp$ may not be provided on the lower semiconductor chip 515Lb.

When flowability of the preliminary fastening element 570$bp$ is relatively high, a first preliminary hardening process to reduce flowability may be performed. The first preliminary hardening process may include removing a solvent from the preliminary fastening element 570$bp$. When flowability of the preliminary fastening element 570$bp$ is relatively low, the first preliminary hardening process may be omitted.

Referring to FIG. 21B, the upper and lower packages 505Ub and 505Lb formed by referring to FIGS. 20E to 20H may be combined. In the process, a solder reflow process described by referring to FIG. 20*j* may be performed. Further, a second preliminary hardening process to preliminarily harden the preliminary fastening element 570*bp* may be performed prior to the solder reflow process. Compared to the solder reflow process, the second preliminary hardening process may be performed at a relatively lower temperature and for a relatively longer period of time. The second preliminary hardening process may include pressing the upper package 505Ub. For example, when the preliminary via plugs 520*bp* include solder materials, the second preliminary hardening process may include pressing the upper package 505Lb by applying pressure capable of weakly changing shapes of the preliminary via plugs 520*bp*. In the drawing, locations of the upper and lower packages 505Ub and 505Lb may be interchangeable. Specifically, the upper package 505Ub may be located at a relatively lower position, and the lower package 505Ib may be located at a relatively higher position. In this case, the upper preliminary fastening element 570*bp* may be provided on the lower molding compound 560Lb or the upper package substrate 510Ub.

Referring to FIG. 21C, by forming a fastening element 570, a package stack structure 500*b* according to this exemplary embodiment of the inventive concept may be completed. Referring to FIGS. 17A to 17G, it is understood that the fastening element 570*b* may be variously formed. Then, referring to FIGS. 20L and 20M, board solder balls may be formed on the package stack structure 500*b*, and the package stack structure 500*b* may be mounted on a system board.

Figure 22A:
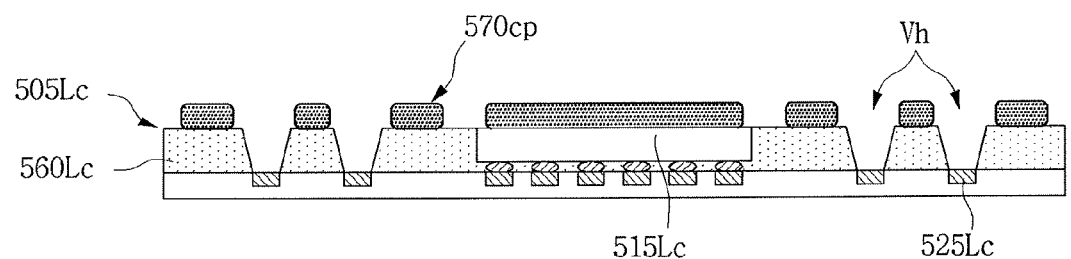
Figure 22B:
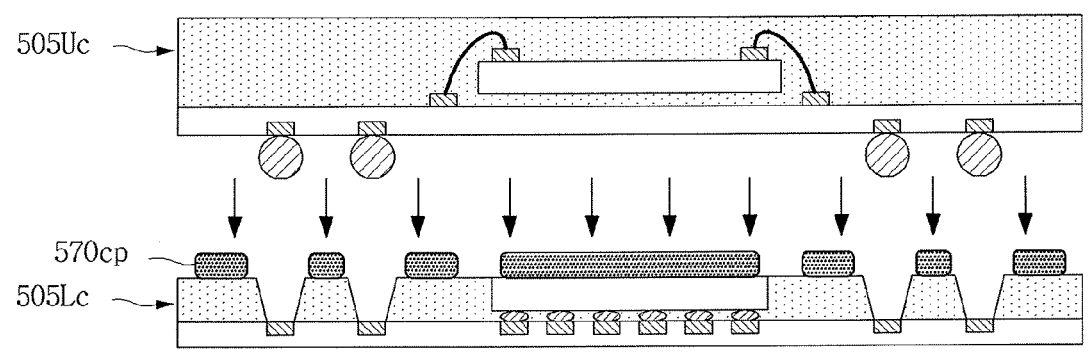
Figure 22C:
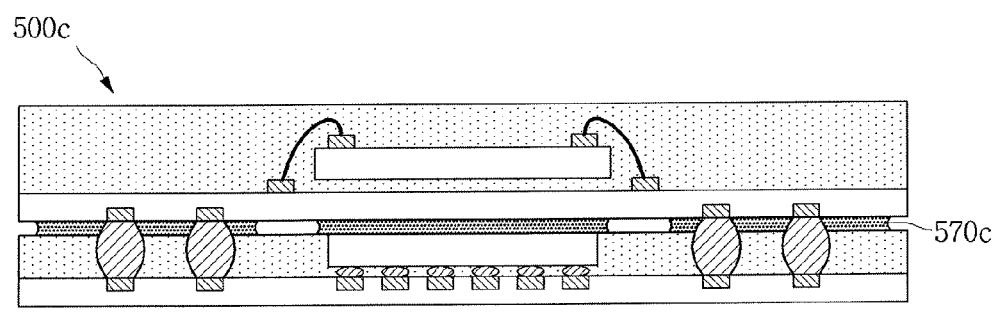

FIGS. 22A to 22C are schematic views illustrating methods of fabricating package stack structures according to exemplary embodiment of the inventive concept. First, referring to FIGS. 20A to 20D, a lower package 505Lc may be formed.

Referring to FIG. 22A, a preliminary fastening element 570*cp* may be formed on a lower molding compound 560Lc which is formed on a package substrate 560Lc formed with via plug lands 525Lc. The preliminary fastening element 570*cp* may be formed in a relatively greater amount around outer areas and/or between via holes Vh through which the via plug lands 525Lc are eposed. The preliminary fastening element 570*cp* may also be formed in a bar shape and/or an island shape. The preliminary fastening element 570*cp* may be formed on a lower semiconductor chip 515Lc. Further, a first preliminary hardening process described by referring to FIG. 21A may be performed.

Referring to FIG. 22B, upper and lower packages 505Uc and 505Lc described by referring to FIGS. 20E to 20H may be combined. During the process, a solder reflow process described by referring to FIG. 20J may be performed. Further, a second preliminary hardening process described by referring to FIG. 21B may be performed. In the example embodiment, locations of the upper and lower packages 404Uc and 505Lc may be interchangeable. It is easily understood by referring to FIG. 22B and its descriptions.

Referring FIG. 22C, by forming a fastening element 570*c*, a package stack structure 500*c* may be completed. It is understood that the fastening element 570*c* may be variously formed. Then, referring to FIGS. 20L and 20M, board solder balls may be formed on the package stack structure 500*c*, and the package stack structure 500*c* may be mounted on a system board.

Figure 23A:
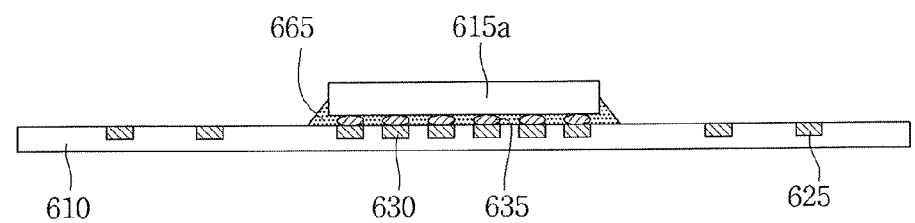

FIGS. 23A to 23D are schematic views illustrating methods of fabricating package stack structures according to exemplary embodiment of the inventive concept. Referring to FIG. 23A, further referring to FIGS. 20A and 20F, mounting a semiconductor chip 615*a* on a package substrate 610 may be included, and an under-fill material 665 may be formed therebetween. The package substrate 610 may include bonder lands 630 and via plug lands 625, and the semiconductor chip 615 may be electrically connected to the bonder lands 630 through bonders 635. The bonders 635 may be surrounded by the under-fill material 665.

Figure 23B:
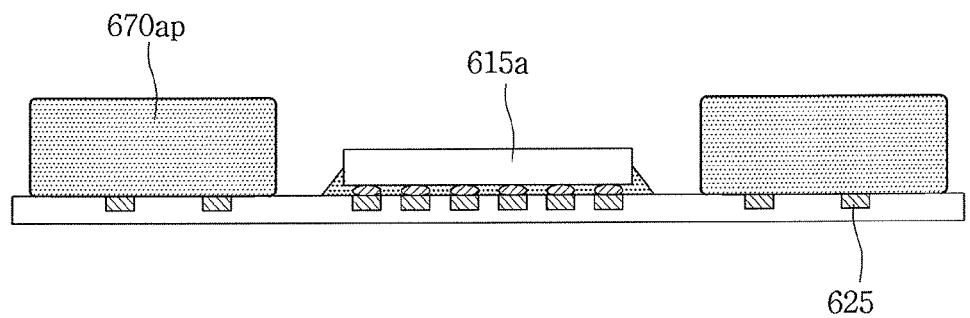

Referring to FIG. 23B, a preliminary fastening element 670*ap* may be formed on the package substrate 610. The preliminary fastening element 670*ap* may be formed not to cover a top surface and/or side surfaces of the semiconductor chip 615*a*. The preliminary fastening element 670*ap* may cover the via plug lands 625.

Figure 23C:
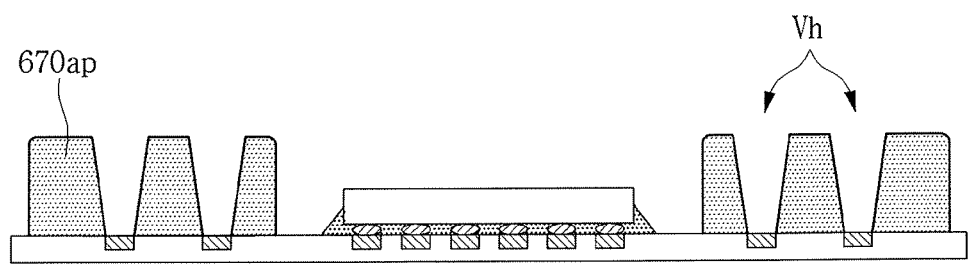

Referring to FIG. 23C, via holes Vh may be formed by, for example, vertically penetrating the preliminary fastening element 670*ap*, to expose a surface of the via plug lands 625 may be formed using a laser drilling process. Then, referring to FIG. 21J, package stack structures and/or fastening elements according to exemplary embodiments of the inventive concept may be completed. By the exemplary embodiment, package stack structures and/or fastening elements described by referring to FIGS. 11A to 16B and 18A to 18G may be completed.

Figure 23D:
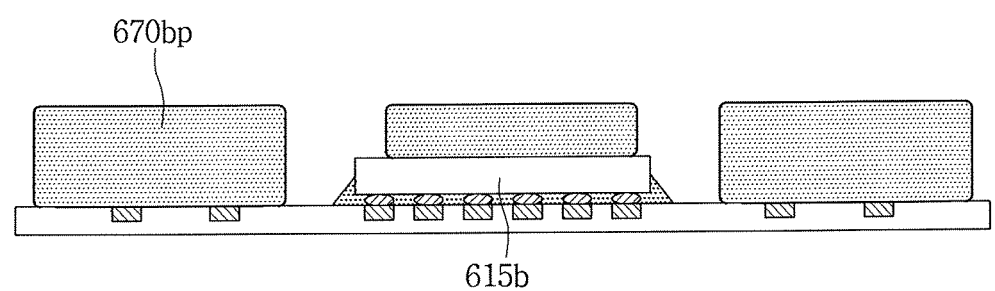

As shown in FIG. 23D, preliminary fastening elements 670*bp* may also be formed on a lower semiconductor chip 615*b*. According to the exemplary embodiment, the package stack structures 300*h* or 300*i* and/or the fastening elements 370*h*1, 370*h*2, 370*i*1, and 370*i*2 described by referring to FIG. 18H or 18I may be completed.

Figure 24A:
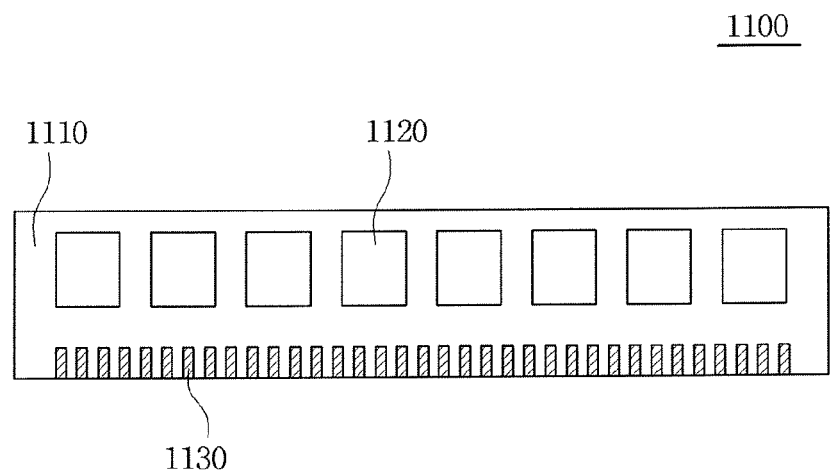
FIGS. 24A to 24C are block diagrams schematically illustrating a semiconductor module, an electronic circuit board, and an electronic system according to exemplary embodiments of the inventive concept.

FIG. 24A is a schematic view of a semiconductor module 1100 including a package stack structure according to an exemplary embodiment. Referring to FIG. 24A, the semiconductor module 1100, in which at least one of the package stack structures is mounted according to an exemplary embodiment, includes a module board 1110, a plurality of semiconductor devices or package stack structures 1120 disposed on the module board 1110, and module contact terminals 1130 formed in parallel on one edge of the module board 1110 and electrically connected to the semiconductor devices or package stack structures 1120. The module board 1110 may be a printed circuit board (PCB). Both surfaces of the module board 1110 may be used. That is, the semiconductor devices or package stack structures 1120 may be disposed on front and back surfaces of the module board 1110. Although FIG. 24A illustrates eight semiconductor devices or package structures 1120 disposed on the front surface of the module board 1110, this is for illustrative purposes only. In addition, a controller or a chip set may be further provided in the semiconductor module 1100 to control semiconductor devices or the package stack structures 1120. Therefore, the number of semiconductor devices or package structures 1120 illustrated in FIG. 24A is not necessarily provided to configure a single semiconductor module 1100. At least one of the package stack structures 1120 may include one of the package stack structures 100*a* to 100*p'*, 200*a* to 200*i*, 300*a* to 300*i*, 400*a* to 400*k*, and 500*a* to 500*c* according to exemplary embodiments of the inventive concept. The module contact terminals 1130 may be formed of a metal and have oxidation resistance. The module contact terminals 1130 may be variously set according to standards of the semiconductor module 1100. For this reason, the number of the module contact terminals 1130 may vary.

Figure 24B:
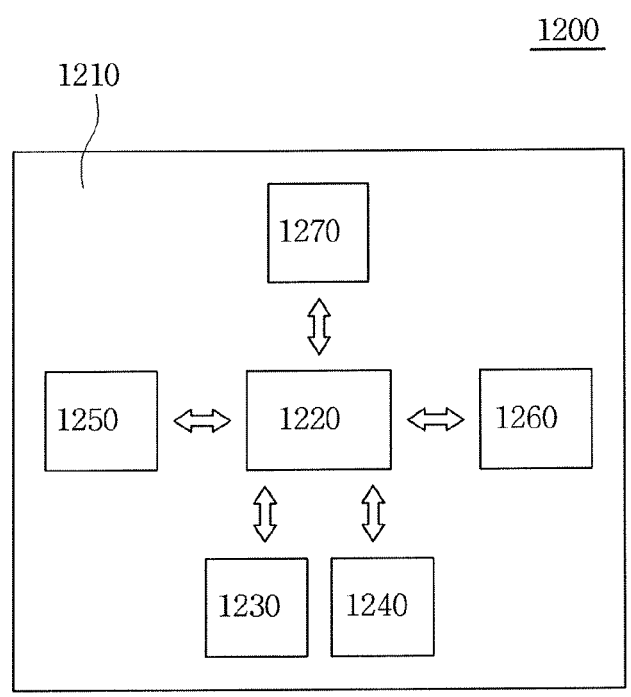

FIG. 24B is a block diagram of an electronic circuit board 1200 including a package stack structure according to an exemplary embodiment. Referring to FIG. 24B, the electronic circuit board 1200 according to an exemplary embodiment includes a microprocessor 1220, a main storage circuit 1230 and a supplementary storage circuit 1240 in communication with the microprocessor 1220, an input signal processing circuit 1250 to generate an input signal or a command to the microprocessor 1220, an output signal processing circuit 1260 to receive a signal or a command from the microprocessor 1220, and a communicating signal processing circuit 1270 to generate or receive an electric signal to/from another circuit board, which are disposed on a circuit board substrate 1210. Arrows can be understood as transmission paths of electric signals. The microprocessor 1220 may receive and process various electric signals, output the processed results, and control other components of the electronic circuit board 1200. The microprocessor 1220 may be, for example, a central processing unit (CPU) and/or a main control unit (MCU). The main storage circuit 1230 may temporarily store data that is frequently required by the microprocessor 1220 or data generated before and after processing. Since the main storage circuit 1230 needs a rapid response speed, the main storage circuit 1230 may be constituted by a semiconductor memory.

The main storage circuit 1230 may be a semiconductor memory, such as a cache memory, or may be constituted by a static random access memory (SRAM), a dynamic random access memory (DRAM), a resistive random access memory (RRAM), and their applied semiconductor memories, for example, a utilized RAM, a ferro-electric RAM, a fast cycle RAM, a phase changeable RAM, and other semiconductor memories. The semiconductor memory devices may include package stack structures in accordance with example embodiments of the inventive concept. In addition, the main storage circuit 1230 may include a volatility or non-volatility RAM. In the embodiment, the main storage circuit 1230 may include at least one of the package stack structures 100a to 100p', 200a to 200i, 300a to 300i, 400a to 400k, and 500a to 500c in accordance with an example embodiment, or at least one semiconductor module including one or more of the package stack structures 100a to 100p', 200a to 200i, 300a to 300i, 400a to 400k, and 500a to 500c. The supplementary storage circuit 1240 may be a large capacity storage device, which may be a non-volatile semiconductor memory such as a flash memory, a hard disc drive using a magnetic field, or a compact disc drive using light. The supplementary storage circuit 1240 may be used when a large amount of data is to be stored, not requiring a rapid response speed as compared with the main storage circuit. The supplementary storage circuit 1240 may include a non-volatile storage device. The supplementary storage circuit 1240 may include at least one of the package stack structures 100a to 100p', 200a to 200i, 300a to 300i, 400a to 400k, and 500a to 500c according to an exemplary embodiment, or a semiconductor module 1100 including one or more of the package stack structures 100a to 100p', 200a to 200i, 300a to 300i, 400a to 400k, and 500a to 500c.

The input signal processing circuit 1250 may convert an external command into an electric signal, or transmit the electric signal transmitted from the exterior to the microprocessor 1220. The command or the electric signal transmitted from the exterior may be an operation command, an electric signal to be processed, or data to be stored. The input signal processing circuit 1250 may be an image signal processing circuit for processing an image signal input from a scanner or a camera, or various sensors or input signal interfaces. The input signal processing circuit 1250 may include at least one semiconductor device in accordance with an example embodiment, or at least one semiconductor module 1100 including the semiconductor device.

The output signal processing circuit 1260 may be a component for transmitting an electric signal processed through the microprocessor 1220 to the exterior. For example, the output signal processing circuit 1260 may be a graphic card, an image processor, an optical converter, a beam panel card, interface circuits having various functions, or the like. The output signal processing circuit 1260 may include at least one of the package stack structures 100a to 100p', 200a to 200i, 300a to 300i, 400a to 400k, and 500a to 500c according to an exemplary embodiment, or at least one semiconductor module 1100 including one or more of the package stack structures 100a to 100p', 200a to 200i, 300a to 300i, 400a to 400k, and 500a to 500c.

The communication circuit 1270 is a component for directly sending/receiving an electric signal to/from another electronic system or another circuit board, not through the input signal processing circuit 1250 or the output signal processing circuit 1260. For example, the communication circuit 1270 may be a modem, a LAN card, or various interface circuits of a personal computer system. The communication circuit 1270 may include at least one of the package stack structures 100a to 100p', 200a to 200i, 300a to 300i, 400a to 400k, and 500a to 500c in accordance with an example embodiment, or at least one semiconductor module 1100 including one or more of the package stack structures 100a to 100p', 200a to 200i, 300a to 300i, 400a to 400k, and 500a to 500c.

Figure 24C:
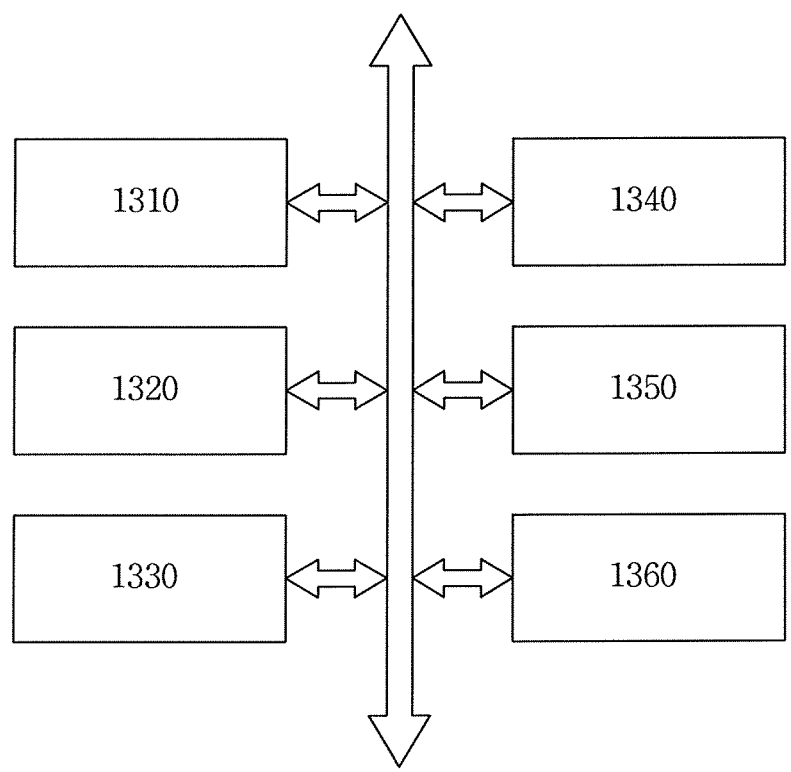

FIG. 24C is a block diagram of an electronic system 1300 including a package stack structure or a semiconductor module including at least one package stack structure in accordance with an example embodiment. Referring to FIG. 24C, the electronic system 1300 according to an exemplary embodiment includes a control unit 1310, an input unit 1320, an output unit 1330, and a storage unit 1340, and may further include a communication unit 1350 and an operation unit 1360. The control unit 1310 can generally control the electronic system 1300 and the respective units. The control unit 1310 may be a central processing unit or a central control unit, and may include the electronic circuit board 1200 in accordance with an example embodiment. In addition, the control unit 1310 may include at least one of the package stack structures 100a to 100p', 200a to 200i, 300a to 300i, 400a to 400k, and 500a to 500c, or at least one semiconductor module 1100 including one or more of the package stack structures 100a to 100p', 200a to 200i, 300a to 300i, 400a to 400k, and 500a to 500c in accordance with the inventive concept.

The input unit 1320 can send an electric command signal to the control unit 1310. The input unit 1320 may be a keyboard, a key pad, a mouse, a touch pad, an image recognition device such as a scanner, or various input sensors. The input unit 1320 may include at least one of the package stack structures 100a to 100p', 200a to 200i, 300a to 300i, 400a to 400k, and 500a to 500c, or at least one semiconductor module 1100 including one or more of the package stack structures 100a to 100p', 200a to 200i, 300a to 300i, 400a to 400k, and 500a to 500c in accordance with the inventive concept. The output unit 1330 may receive an electric command signal from the control unit 1310 and output the results processed by the electronic system 840. The output unit 1330 may be a monitor, a printer, a beam projector, or various mechanical devices. The output unit 1330 may include at least one of the package stack structures 100a to 100p', 200a to 200i, 300a to 300i, 400a to 400k, and 500a to 500c, or at least one semiconductor module 1100 including one or more of the package stack structures 100a to 100p', 200a to 200i, 300a to 300i, 400a to 400k, and 500a to 500c in accordance with the inventive concept.

The storage unit 1340 may be a component for temporarily or permanently storing an electric signal to be processed or already processed by the controller 1310. The storage unit 1340 may be physically or electrically connected or coupled with the control unit 1310. The storage unit 1340 may be a semiconductor memory, a magnetic storage device such as a hard disc, an optical storage device such as a compact disc, or other servers having data storage functions. In addition, the storage unit 844 may include at least one of the package stack structures 100a to 100p', 200a to 200i, 300a to 300i, 400a to 400k, and 500a to 500c, or at least one semiconductor module 810 including one or more of the package stack structures 100a to 100p', 200a to 200i, 300a to 300i, 400a to 400k, and 500a to 500c according to the inventive concept. The communication unit 1350 may receive an electric command signal from the control unit 1310 and send/receive an electric signal to/from another electronic system. The communication unit 1350 may be a wired sending/receiving device such as a modem or a LAN card, a wireless sending/receiving device such as a WIBRO interface, an infrared port, etc. In addition, the communication unit 1350 may include at least one of the package stack structures 100a to 100p', 200a to 200i, 300a to 300i, 400a to 400k, and 500a to 500c, or at least one semiconductor module 1100 including one or more of the package stack structures 100a to 100p', 200a to 200i, 300a to 300i, 400a to 400k, and 500a to 500c according to the inventive concept. The operation unit 1360 may be physically or mechanically operated according to a command of the control unit 1310. For example, the operation unit 1360 may be a mechanically operated component such as a plotter, an indicator, an up/down operator, etc. The electronic system 1300 in accordance with an example embodiment may be a computer, a network server, a network printer or scanner, a wired controller, a mobile communication terminal, an exchanger, or other electronic system operated by programs The package stack structures 100a to 100p', 200a to 200i, 300a to 300i, 400a to 400k, and 500a to 500c according to exemplary embodiments of the inventive concept can have resistance against thermal and physical attacks. Accordingly, productivity, yield and performance can be improved. Methods of forming the package stack structures 100a to 100p', 200a to 200i, 300a to 300i, 400a to 400k, and 500a to 500c according to exemplary embodiments of the inventive concept can provide different methods of fabricating the package stack structures 100a to 100p', 200a to 200i, 300a to 300i, 400a to 400k, and 500a to 500c compared with conventional methods. Whole performance and reliability of the semiconductor module 1100, the electronic circuit board 1200, and the electronic system 1300 according to exemplary embodiments of the inventive concept can be improved by including at least one of the package stack structures 100a to 100p', 200a to 200i, 300a to 300i, 400a to 400k, and 500a to 500c.

The electronic system 1300 as an electronic apparatus may include a semiconductor module 1100 formed with a module band, a package stack structure formed in the module band, and module terminals formed on the module band to be electrically connected to the package stack structure. The semiconductor module is installed in the electronic apparatus, and the module terminals of the semiconductor module are connected to a processor which may be referred as the microprocessor 1220 or control unit 1320. The semiconductor module may be formed as a single monolithic body, and the single monolithic body of the semiconductor module may be detached from or attached to the processor through the module terminals and corresponding terminals of the processor. The terminals of the processor may be a terminal connecter formed in a body or housing of the electronic circuit board 1200 or the electronic system 1300. Accordingly, the semiconductor module 1100 formed as a detachably attached module can be detachably attached to the body or housing of the electronic circuit board 1200 or the electronic system 1300 to be electrically connected to corresponding units thereof such that data of the semiconductor chip of the semiconductor module 1100 can be processed or data received from an external device of the electronic circuit board 1200 or the electronic system 1300 can be stored in the semiconductor chip of the semiconductor module 1100.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A package stack structure, comprising:
a lower semiconductor chip on a lower package substrate having a plurality of lower via plug lands;
a lower package having a lower molding compound surrounding a portion of a top surface of the lower package substrate and side surfaces of the lower semiconductor chip;
an upper semiconductor chip on an upper package substrate having a plurality of upper via plug lands, wherein the plurality of lower via plug lands and the plurality of upper via plug lands are vertically aligned with each other, respectively;
an upper package having an upper molding compound covering the upper semiconductor chip;
via plugs vertically penetrating the lower molding compound, the via plugs to each contact and connect the lower and upper via plug lands, respectively; and
a fastening element to contact and connect a top surface of the lower molding compound and a bottom surface of the upper package substrate such that an air space exists between a top surface of the lower molding compound and a bottom surface of the upper package substrate.

2. The package stack structure of claim 1, wherein the fastening element is in contact with side surfaces of the via plugs.

3. The package stack structure of claim 1, wherein the fastening element covers edges of the upper package substrate.

4. The package stack structure of claim 1, wherein the fastening element is formed at corners of the package stack structure.

5. The package stack structure of claim 1, wherein the fastening element is formed around edges of the package stack structure.

6. The package stack structure of claim 1, wherein the air space is formed on a top surface of the lower semiconductor chip.

7. The package stack structure of claim 1, wherein the fastening element is provided above a portion of a top surface of the lower semiconductor chip.

8. The package stack structure of claim 1, further comprising a lower bonder between the lower semiconductor chip and the lower package substrate, wherein the lower bonder is electrically connecting the lower semiconductor chip to the lower package substrate.

9. The package stack structure of claim 1, wherein side surfaces of the lower package and the upper package are vertically aligned.

10. The package stack structure of claim 1, wherein top surface of the lower semiconductor chip is exposed.

11. The package stack structure of claim 1, wherein the fastening element is disposed both a first portion between the lower semiconductor chip and the upper package substrate and a second portion between the lower molding compound and the upper package substrate.

12. The package stack structure of claim 4, wherein an end portion of the fastening element is extended onto a side surface of the upper package substrate.

13. A package stack structure, comprising:
a lower semiconductor chip on a lower package substrate having a plurality lower via plug lands;
a lower package having an under-fill material between a portion of a surface of the lower package substrate and a bottom surface of the lower semiconductor chip;
an upper semiconductor chip on an upper package substrate having a plurality of upper via plug lands;
an upper package having an upper molding compound covering the upper semiconductor chip, wherein the plurality of lower via plug lands and the plurality of upper via plug lands are vertically aligned with each other, respectively;
via plugs each in contact with and electrically connected with both of the lower and upper via plug lands, respectively; and
a fastening element to contact and connect a top surface of the lower molding compound and a bottom surface of the upper package substrate such that an air space exists between a top surface of the lower molding compound and a bottom surface of the upper package substrate.

14. The package stack structure of claim 13, further comprising a lower bonder between the lower semiconductor chip and the lower package substrate, wherein the lower bonder is surrounded by the under-fill material.

15. A package stack structure, comprising:
a lower package having a lower package substrate having a plurality lower via plug lands therebeneath, a lower semiconductor chip disposed on the lower package substrate and electrically connected to the lower package substrate, and a lower molding compound to surround the lower package substrate and at least a portion of the lower semiconductor chip;
an upper package having an upper package substrate having a plurality of upper via plug lands thereon, an upper semiconductor chip disposed on the upper package substrate and electrically connected to the lower package substrate, and an upper molding compound to surround the upper package substrate and at least a portion of the upper semiconductor chip, the upper package being disposed over the lower package and spaced apart from the lower package by a distance;
one or more conductive materials disposed in a first portion between the lower package and the upper package, wherein each conductive material is in contact with and electrically connected with both of the lower and upper via plug lands, respectively;
a fastening element disposed in a second portion between the lower package and the upper package and formed with a material different from the conductive materials to contact and fasten the lower package to the upper package; and
an air space disposed in a third portion between the lower package and the upper package and formed as an air path.

16. The package stack structure of claim 15, wherein the lower package comprises an under-fill material between a portion of a surface of the lower package substrate and a bottom surface of the lower semiconductor chip.

17. The package stack structure of claim 15, wherein the fastening element comprises a plurality of sub-fastening elements spaced-apart from each other and disposed along an edge portion of the lower package and the upper package.

18. The package stack structure of claim 15, wherein the fastening element comprises a central fastening element disposed in a fourth portion between the lower package and the upper package, and the central fastening element is formed with a material different from the conductive materials to fasten the lower package and the upper package.

19. The package stack structure of claim 15, wherein:
the lower package comprises one or more via-plugs passing through the lower semiconductor chip to be electrically connected to the lower package substrate; and
the one or more conductive materials comprises second conductive material disposed in the third portion between lower package and the upper package to electrically connect the via-plugs of the lower package and the upper package substrate of the upper package.

20. The package stack structure of claim 15, wherein the upper semiconductor chip comprises a plurality of sub-upper semiconductor chips disposed in the upper molding compound and electrically connected to the upper package substrate.

* * * * *